United States Patent
Yamazaki et al.

(10) Patent No.: US 11,682,667 B2
(45) Date of Patent: Jun. 20, 2023

(54) MEMORY CELL INCLUDING CELL TRANSISTOR INCLUDING CONTROL GATE AND CHARGE ACCUMULATION LAYER

(71) Applicant: Semiconductor Energy Laboratory Co., Ltd., Atsugi (JP)

(72) Inventors: Shunpei Yamazaki, Setagaya (JP); Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 46 days.

(21) Appl. No.: 16/623,657

(22) PCT Filed: Jun. 21, 2018

(86) PCT No.: PCT/IB2018/054566
§ 371 (c)(1),
(2) Date: Dec. 17, 2019

(87) PCT Pub. No.: WO2019/003060
PCT Pub. Date: Jan. 3, 2019

(65) Prior Publication Data
US 2020/0203339 A1    Jun. 25, 2020

(30) Foreign Application Priority Data

Jun. 27, 2017   (JP) .............................. JP2017-125011

(51) Int. Cl.
*H01L 21/768*   (2006.01)
*H01L 23/522*   (2006.01)
(Continued)

(52) U.S. Cl.
CPC ...... *H01L 27/088* (2013.01); *H01L 21/76846* (2013.01); *H01L 27/11556* (2013.01); *H01L 27/11582* (2013.01)

(58) Field of Classification Search
CPC ......... H01L 21/11556; H01L 29/40114; H01L 21/02381; H01L 21/32133; H01L 29/2003;
(Continued)

(56) References Cited

U.S. PATENT DOCUMENTS 3,772,576 A * 11/1973 Nienhuis ................. H01L 21/00
                                                       257/652
5,528,032 A    6/1996 Uchiyama
(Continued)

FOREIGN PATENT DOCUMENTS

CN    102468282 A    5/2012
CN    102693919 A    9/2012
(Continued)

OTHER PUBLICATIONS

Seiichi Aritome et al., A novel three-dimensional dual control gate with surrounding floating-gate (DC-SF) NAND flash cell; Solid-State Electronics, Aug. 2012; (Year: 2012).*
(Continued)

*Primary Examiner* — Marcos D. Pizarro
*Assistant Examiner* — Tenley H Schofield
(74) *Attorney, Agent, or Firm* — Robinson Intellectual Property Law Office; Eric J. Robinson

(57) ABSTRACT

A semiconductor device with large memory capacity is provided.
A semiconductor device includes first to fourth insulators, a first conductor, a second conductor, and a first semiconductor, and the first semiconductor includes a first surface and a second surface. A first side surface of the first conductor is included on the first surface of the first semiconductor, and a first side surface of the first insulator is included on a second side surface of the first conductor. The second insulator is included in a region including a second side
(Continued)

surface and a top surface of the first insulator, a top surface of the first conductor, and the second surface of the first semiconductor. The third insulator is included on a formation surface of the second insulator, and the fourth insulator is included on a formation surface of the third insulator. The second conductor is included in a region overlapping the second surface of the first semiconductor in a region where the fourth insulator is formed. The third insulator has a function of accumulating charge. A tunnel current is induced between the second surface of the first semiconductor and the third insulator with the second insulator therebetween by supply of a potential to the second conductor.

9 Claims, 68 Drawing Sheets

(51) Int. Cl.
  *H01L 27/088* (2006.01)
  *H10B 41/27* (2023.01)
  *H10B 43/27* (2023.01)
  *H01L 27/11556* (2017.01)
  *H01L 27/11582* (2017.01)

(58) Field of Classification Search
  CPC ........... H01L 21/31111; H01L 29/7883; H01L 29/205; H01L 29/42324; H01L 29/1037; H01L 21/02458; H01L 29/36; H01L 21/0254; H01L 27/11524; H01L 29/0847; H01L 27/088; H01L 21/76846; H01L 27/11556; H01L 27/11582
  See application file for complete search history.

(56) References Cited

U.S. PATENT DOCUMENTS

| | | | |
|---|---|---|---|
| 6,727,544 B2 | 4/2004 | Endoh et al. | |
| 7,821,002 B2 | 10/2010 | Yamazaki et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,283,228 B2 | 10/2012 | Alsmeier | |
| 8,330,208 B2 | 12/2012 | Alsmeier et al. | |
| 8,349,681 B2 | 1/2013 | Alsmeier et al. | |
| 8,372,720 B2 | 2/2013 | Fukuzumi et al. | |
| 8,409,977 B2 | 4/2013 | Shim et al. | |
| 8,450,791 B2 | 5/2013 | Alsmeier | |
| 8,461,000 B2 | 6/2013 | Alsmeier et al. | |
| 8,461,641 B2 | 6/2013 | Alsmeier et al. | |
| 8,564,050 B2 | 10/2013 | Park et al. | |
| 8,580,639 B2 | 11/2013 | Alsmeier et al. | |
| 8,658,499 B2 | 2/2014 | Makala et al. | |
| 8,729,624 B2 | 5/2014 | Fukuzumi et al. | |
| 8,765,543 B2 | 7/2014 | Alsmeier et al. | |
| 8,829,591 B2 | 9/2014 | Alsmeier | |
| 8,860,108 B2 | 10/2014 | Yamazaki et al. | |
| 8,872,254 B2 | 10/2014 | Lee et al. | |
| 8,928,061 B2 | 1/2015 | Chien et al. | |
| 8,946,810 B2 | 2/2015 | Alsmeier | |
| 8,980,733 B2 | 3/2015 | Yamazaki et al. | |
| 9,035,374 B2 | 5/2015 | Fukuzumi et al. | |
| 9,117,923 B2 | 8/2015 | Shim et al. | |
| 9,129,861 B2 | 9/2015 | Seol et al. | |
| 9,159,739 B2 | 10/2015 | Makala et al. | |
| 9,165,940 B2 | 10/2015 | Chien et al. | |
| 9,230,976 B2 | 1/2016 | Alsmeier | |
| 9,257,572 B2 | 2/2016 | Seol et al. | |
| 9,269,721 B2 | 2/2016 | Seol et al. | |
| 9,287,167 B2 | 3/2016 | Seol et al. | |
| 9,355,913 B2 | 5/2016 | Park et al. | |
| 9,356,042 B2 | 5/2016 | Fukuzumi et al. | |
| 9,356,044 B2 | 5/2016 | Seol et al. | |
| 9,406,694 B1 | 8/2016 | Ikeno et al. | |
| 9,466,613 B2 | 10/2016 | Seol et al. | |
| 9,478,560 B2 | 10/2016 | Seol et al. | |
| 9,502,431 B2 | 11/2016 | Sakuma et al. | |
| 9,634,097 B2 | 4/2017 | Rabkin et al. | |
| 10,242,992 B2 | 3/2019 | Sakamoto et al. | |
| 10,693,013 B2 | 6/2020 | Toriumi et al. | |
| 10,763,272 B2 | 9/2020 | Sakamoto et al. | |
| 11,217,703 B2 | 1/2022 | Toriumi et al. | |
| 11,374,015 B2 | 6/2022 | Sakamoto et al. | |
| 2009/0146206 A1 | 6/2009 | Fukuzumi et al. | |
| 2010/0213537 A1 | 8/2010 | Fukuzumi et al. | |
| 2011/0065270 A1 | 3/2011 | Shim et al. | |
| 2011/0101332 A1 | 5/2011 | Yamazaki et al. | |
| 2011/0101334 A1 | 5/2011 | Yamazaki et al. | |
| 2011/0101351 A1 | 5/2011 | Yamazaki | |
| 2011/0147823 A1 | 6/2011 | Kuk et al. | |
| 2011/0233648 A1 | 9/2011 | Seol et al. | |
| 2012/0001243 A1 | 1/2012 | Kato | |
| 2012/0001249 A1 | 1/2012 | Alsmeier et al. | |
| 2012/0098048 A1 | 4/2012 | Choe et al. | |
| 2012/0119287 A1 | 5/2012 | Park et al. | |
| 2012/0213009 A1* | 8/2012 | Aritome | H01L 27/11556 365/185.29 |
| 2012/0319114 A1 | 12/2012 | Yamazaki et al. | |
| 2013/0134495 A1* | 5/2013 | Cao | H01L 29/42328 438/257 |
| 2013/0221356 A1 | 8/2013 | Yamazaki et al. | |
| 2013/0292671 A1 | 11/2013 | Yamazaki et al. | |
| 2013/0334593 A1 | 12/2013 | Seol et al. | |
| 2014/0038400 A1 | 2/2014 | Rark et al. | |
| 2014/0097484 A1* | 4/2014 | Seol | H01L 27/1157 257/324 |
| 2014/0187029 A1 | 7/2014 | Seol et al. | |
| 2014/0225181 A1 | 8/2014 | Makala et al. | |
| 2015/0054058 A1 | 2/2015 | Seol et al. | |
| 2015/0171184 A1 | 6/2015 | Nakajima | |
| 2015/0179662 A1 | 6/2015 | Makala et al. | |
| 2015/0200199 A1 | 7/2015 | Sakamoto et al. | |
| 2015/0255485 A1 | 9/2015 | Kameoka et al. | |
| 2015/0311301 A1 | 10/2015 | Seol et al. | |
| 2015/0325586 A1 | 11/2015 | Seol et al. | |
| 2015/0380422 A1 | 12/2015 | Sharangpani | |
| 2016/0071879 A1 | 3/2016 | Seol et al. | |
| 2016/0104720 A1 | 4/2016 | Alsmeier | |
| 2016/0104721 A1 | 4/2016 | Seol et al. | |
| 2016/0247818 A1* | 8/2016 | Seol | H01L 29/66825 |
| 2016/0247927 A1 | 8/2016 | Nomura et al. | |
| 2016/0307908 A1* | 10/2016 | Sharangpani | H01L 27/1157 |
| 2016/0351572 A1* | 12/2016 | Atsumi | G11C 11/4096 |
| 2016/0351576 A1 | 12/2016 | Yamazaki et al. | |
| 2017/0040416 A1 | 2/2017 | Ota et al. | |
| 2018/0033799 A1 | 2/2018 | Kanamori et al. | |
| 2018/0040623 A1* | 2/2018 | Kanakamedala | H01L 27/11548 |
| 2018/0374529 A1 | 12/2018 | Kimura et al. | |
| 2019/0006386 A1 | 1/2019 | Yamazaki et al. | |
| 2021/0242220 A1 | 8/2021 | Yamazaki et al. | |
| 2022/0037532 A1 | 2/2022 | Toriumi et al. | |
| 2022/0285380 A1 | 9/2022 | Sakamoto et al. | |

FOREIGN PATENT DOCUMENTS

| | | |
|---|---|---|
| CN | 103715176 A | 4/2014 |
| CN | 104779253 A | 7/2015 |
| DE | 102011086171 | 5/2012 |
| EP | 1850374 A | 10/2007 |
| EP | 2259294 A | 12/2010 |
| JP | 2007-317874 A | 12/2007 |
| JP | 2011-090758 A | 5/2011 |
| JP | 2012-109571 A | 6/2012 |
| JP | 2014-078714 A | 5/2014 |
| JP | 2015-170644 A | 9/2015 |
| JP | 2016-063027 A | 4/2016 |
| JP | 2016-225434 A | 12/2016 |
| JP | 2016-225614 A | 12/2016 |

(56) References Cited

FOREIGN PATENT DOCUMENTS

| KR | 2012-0053329 A | 5/2012 |
|---|---|---|
| WO | WO-2015/105049 | 7/2015 |
| WO | WO-2016/166628 | 10/2016 |

OTHER PUBLICATIONS

LJ Chen, "Metal Silicides: An Integral Part of Microelectronics", JOM 57:9, pp. 24-31,2004; available at https://www.tms.org/pubs/journals/jom/0509/chen-0509.html; discusses the low resistivity of metal silicides. (Year: 2004).*
International Search Report (Application No. PCT/IB2018/054566) dated Oct. 2, 2018.
Written Opinion (Application No. PCT/IB2018/054566) dated Oct. 2, 2018.
Chinese Office Action (Application No. 201880042866.5) dated Jan. 19, 2023.

* cited by examiner

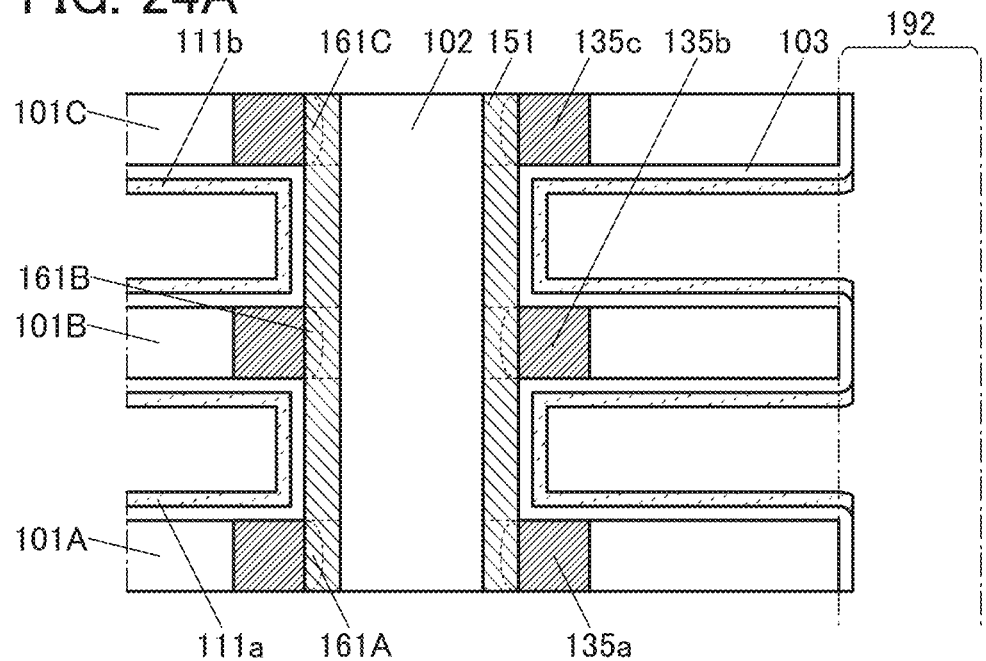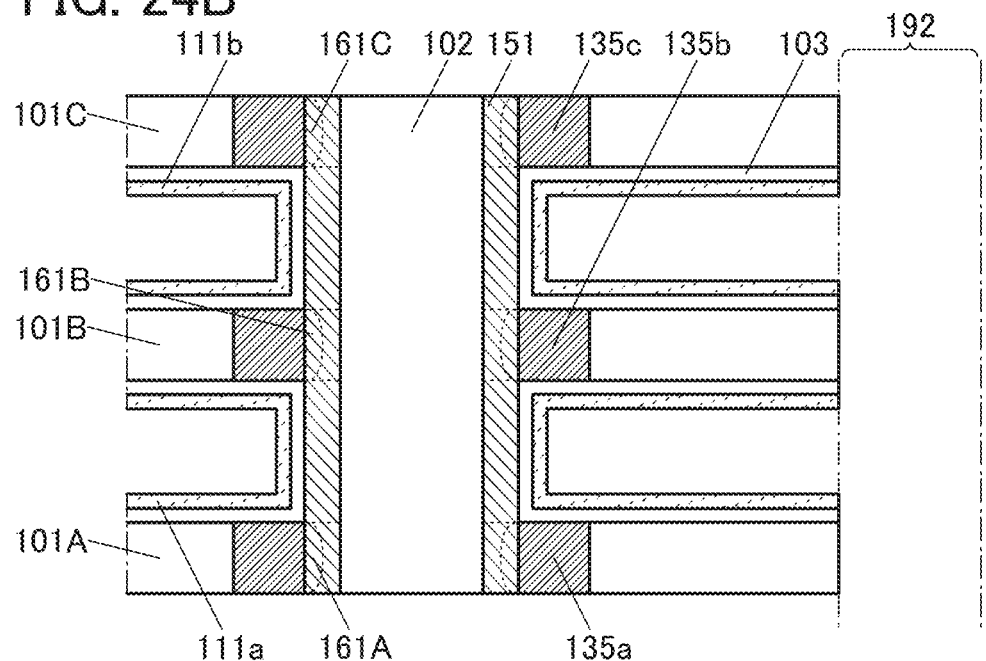

MEMORY CELL INCLUDING CELL TRANSISTOR INCLUDING CONTROL GATE AND CHARGE ACCUMULATION LAYER

TECHNICAL FIELD

One embodiment of the present invention relates to a semiconductor device, a semiconductor wafer, a memory device, and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification can include a semiconductor device, a display device, a liquid crystal display device, a light-emitting device, a power storage device, an imaging device, a memory device, a processor, an electronic device, a method for driving them, a method for manufacturing them, a method for testing them, and a system including at least one of them.

BACKGROUND ART

In recent years, electronic components such as central processing units (CPUs), graphics processing units (GPUs), memory devices, and sensors have been used in various electronic devices such as personal computers, smartphones, and digital cameras; the electronic components have been improved in various aspects such as miniaturization and low power consumption.

Memory devices with large memory capacity are especially required because the amount of data handled in the aforementioned electronic devices and the like has increased. As an example of a means for increasing memory capacity, Patent Document 1 discloses a three-dimensional NAND memory element using a metal oxide for a channel formation region.

REFERENCE

Patent Document

[Patent Document 1] U.S. Pat. No. 9,634,097

SUMMARY OF THE INVENTION

Problems to be Solved by the Invention

A semiconductor layer of a transistor included in a memory element or the like is divided into a channel formation region and a low-resistance region. In particular, in the case where a metal oxide is used for a semiconductor layer of a three-dimensional NAND memory element, how to form a low-resistance region of the metal oxide is important. In a metal oxide used for a semiconductor layer of a transistor, a low-carrier-density (in some cases, also referred to as intrinsic, substantially intrinsic, or the like in this specification and the like) region functions as a channel formation region, and a high-carrier-density region functions as a low-resistance region. Accordingly, forming a channel formation region and a low-resistance region separately is a challenge in fabricating a three-dimensional NAND memory element using a metal oxide for a semiconductor layer.

An object of one embodiment of the present invention is to provide a novel semiconductor device. Alternatively, an object of one embodiment of the present invention is to provide a memory device including a novel semiconductor device. Alternatively, an object of one embodiment of the present invention is to provide an electronic device using a memory device including a novel semiconductor device. Alternatively, an object of one embodiment of the present invention is to provide a memory device with large data capacity. Alternatively, an object of one embodiment of the present invention is to provide a highly reliable memory device.

Note that the objects of one embodiment of the present invention are not limited to the objects listed above. The objects listed above do not preclude the existence of other objects. The other objects are objects that are not described in this section and will be described below. The objects that are not described in this section will be derived from the description of the specification, the drawings, and the like and can be extracted from the description by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)
One embodiment of the present invention is a semiconductor device characterized by including first to fourth insulators, a first conductor, a second conductor, and a first semiconductor. The first semiconductor includes a first surface and a second surface. A first side surface and a second side surface of the first insulator are positioned in a region overlapping the first surface of the first semiconductor with the first conductor therebetween. A first side surface of the first conductor is positioned on the first surface of the first semiconductor. The first side surface of the first insulator is positioned on a second side surface of the first conductor. The second insulator is positioned in a region including the second side surface of the first insulator, a top surface of the first insulator, a top surface of the first conductor, and the second surface of the first semiconductor. The third insulator is positioned in a region overlapping the second surface of the first semiconductor in a region where the second insulator is formed. The fourth insulator is positioned on a formation surface of the third insulator and in a region overlapping the first surface of the first semiconductor with the second insulator therebetween. The second conductor is positioned in a region overlapping the second surface of the first semiconductor in a region where the fourth insulator is formed. The third insulator has a function of accumulating charge. A tunnel current is induced between the second surface of the first semiconductor and the third insulator with the second insulator therebetween by supply of a potential to the second conductor.

(2)
Alternatively, one embodiment of the present invention is a semiconductor device characterized by including first to fourth insulators, a first conductor, a second conductor, a first semiconductor, and a second semiconductor. The first semiconductor includes a first surface and a second surface. A first side surface and a second side surface of the first insulator are positioned in a region overlapping the first surface of the first semiconductor with the first conductor therebetween. A first side surface of the first conductor is positioned on the first surface of the first semiconductor. The first side surface of the first insulator is positioned on a second side surface of the first conductor. The second insulator is positioned in a region including the second side surface of the first insulator, a top surface of the first insulator, a top surface of the first conductor, and the second surface of the first semiconductor. The third insulator is positioned in a region overlapping the second surface of the first semiconductor in a region where the second insulator is formed. The fourth insulator is positioned on a formation surface of the third insulator and in a region overlapping the first surface of the first semiconductor with the second insulator therebetween. The second semiconductor is positioned in a region overlapping the second surface of the first semiconductor with the fourth insulator therebetween. The second conductor is positioned on a formation surface of the second semiconductor and in a region overlapping the second surface of the first semiconductor in a region where the fourth insulator is formed. The third insulator has a function of accumulating charge. A tunnel current is induced between the second surface of the first semiconductor and the third insulator with the second insulator therebetween by supply of a potential to the second conductor.

(3)

Alternatively, one embodiment of the present invention is the semiconductor device with the structure of the above (1) or (2), characterized in that the third insulator is positioned also in a region overlapping the first surface of the first semiconductor in the region where the second insulator is formed and in a region overlapping between the second insulator and the fourth insulator.

(4)

Alternatively, one embodiment of the present invention is a semiconductor device including a first insulator, a second insulator, a fourth insulator, first to third conductors, and a first semiconductor. The first semiconductor includes a first surface and a second surface. A first side surface and a second side surface of the first insulator are positioned in a region overlapping the first surface of the first semiconductor with the first conductor therebetween. A first side surface of the first conductor is positioned on the first surface of the first semiconductor. The first side surface of the first insulator is positioned on a second side surface of the first conductor. The second insulator is positioned in a region including the second side surface of the first insulator, a top surface of the first insulator, a top surface of the first conductor, and the second surface of the first semiconductor. The third conductor is positioned in a region overlapping the second surface of the first semiconductor with the second insulator therebetween. The fourth insulator is positioned on a formation surface of the third conductor, in a region overlapping the second surface of the first semiconductor with the third conductor therebetween in a region where the second insulator is formed, and in a region overlapping the first surface of the first semiconductor with the second insulator therebetween in the region where the second insulator is formed. The second conductor is positioned in a region overlapping the second surface of the first semiconductor in a region where the fourth insulator is formed. The third conductor has a function of accumulating charge. A tunnel current is induced between the second surface of the first semiconductor and the third conductor with the second insulator therebetween by supply of a potential to the second conductor.

(5)

Alternatively, one embodiment of the present invention is the semiconductor device with any one of the structures of the above (1) to (4), characterized in that a film thickness of the first semiconductor at the second surface of the first semiconductor is smaller than a film thickness of the first semiconductor at the first surface of the first semiconductor.

(6)

Alternatively, one embodiment of the present invention is the semiconductor device with any one of the structures of the above (1) to (5), characterized by including a fifth insulator and a fourth conductor. The fifth insulator is positioned on a surface opposite to the first surface and the second surface of the first semiconductor, and the fourth conductor is positioned in a region overlapping the first surface and the second surface of the first semiconductor with the fifth insulator therebetween.

(7)

Alternatively, one embodiment of the present invention is the semiconductor device with any one of the structures of the above (1) to (6), characterized in that the first semiconductor includes a metal oxide and that the second surface of the first semiconductor and the vicinity of the second surface have a higher concentration of oxygen than the first surface of the first semiconductor and the vicinity of the first surface.

(8)

Alternatively, one embodiment of the present invention is the semiconductor device with the structure of the above (7), characterized in that the first surface of the first semiconductor and the vicinity of the first surface each include a compound constituted of an element contained in the first conductor and an element contained in the first semiconductor.

(9)

Alternatively, one embodiment of the present invention is the semiconductor device with any one of the structures of the above (1) to (6), characterized in that the semiconductor contains silicon and that, in the first surface of the first semiconductor and the vicinity of the first surface, a low-resistance region is formed of an element contained in the first conductor and an element contained in the first semiconductor.

(10)

Alternatively, one embodiment of the present invention is the semiconductor device with any one of the structures of the above (1) to (9), characterized in that a sixth insulator is used instead of the first conductor and that the sixth insulator contains silicon nitride.

(11)

Alternatively, one embodiment of the present invention is a semiconductor wafer including a plurality of the semiconductor devices according to any one of the above (1) to (10) and a region for dicing.

(12)

Alternatively, one embodiment of the present invention is a memory device including the semiconductor device according to any one of the above (1) to (10) and a peripheral circuit.

(13)

Alternatively, one embodiment of the present invention is an electronic device including the memory device according to the above (12) and a housing.

Effect of the Invention

One embodiment of the present invention can provide a novel semiconductor device. Alternatively, one embodiment of the present invention can provide a memory device including a novel semiconductor device. Alternatively, one embodiment of the present invention can provide an electronic device using a memory device including a novel semiconductor device. Alternatively, one embodiment of the present invention can provide a memory device with large data capacity. Alternatively, one embodiment of the present invention can provide a highly reliable memory device.

Note that the effects of one embodiment of the present invention are not limited to the effects listed above. The effects listed above do not preclude the existence of other effects. The other effects are effects that are not described in this section and will be described below. The effects that are not described in this section will be derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 24 Cross-sectional views for illustrating a manufacturing example of a semiconductor device.

MODE FOR CARRYING OUT THE INVENTION

In this specification and the like, a metal oxide means an oxide of metal in a broad expression. Metal oxides are classified into an oxide insulator, an oxide conductor (including a transparent oxide conductor), an oxide semiconductor (or simply referred to as an OS), and the like. For example, in the case where a metal oxide is used in an active layer of a transistor, the metal oxide is referred to as an oxide semiconductor in some cases. That is, in the case where a metal oxide can form a channel formation region of a transistor that has at least one of an amplifying function, a rectifying function, and a switching function, the metal oxide can be referred to as a metal oxide semiconductor or shortly as an OS. An OS FET can be referred to as a transistor including a metal oxide or an oxide semiconductor.

In this specification and the like, a transistor containing silicon in its channel formation region is in some cases referred to as a Si transistor.

Furthermore, in this specification and the like, a metal oxide containing nitrogen is in some cases also collectively referred to as a metal oxide. A metal oxide containing nitrogen may alternatively be referred to as a metal oxynitride.

Embodiment 1

In this embodiment, a circuit configuration, an operating method, and a manufacturing method of a semiconductor device according to one embodiment of the disclosed invention will be described. Note that in the following description, for example, "[x,y]" refers to an element in the x-th row and in the y-th column, and "[z]" refers to an element in the z-th row or in the z-th column. Such notations are omitted when there is no particular need to specify a column and a row.

<Circuit Configuration Example>

Figure 1A:
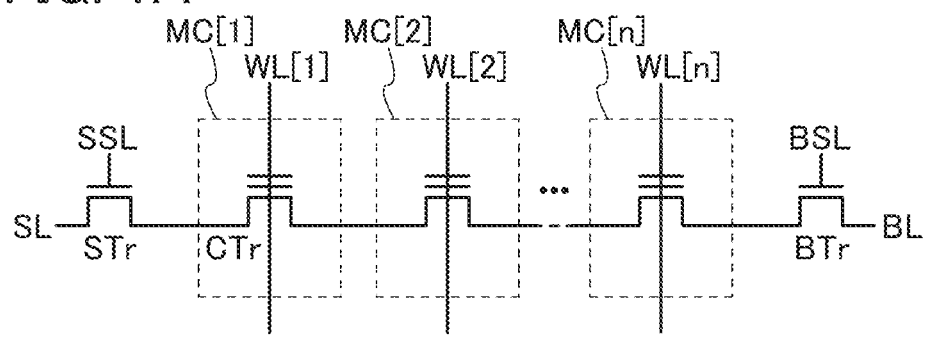
FIG. 1 Circuit diagrams each illustrating a configuration example of a semiconductor device.

First, a circuit configuration of a NAND memory element that is an example of the semiconductor device will be described with reference to FIG. 1(A). FIG. 1(A) is a circuit diagram of a one-page NAND memory element. The one-page NAND memory element includes memory cells including a memory cell MC[1] to a memory cell MC[n], a wiring WL[1] to a wiring WL[n] for controlling them, a wiring BL, a wiring SL, a transistor STr and a transistor BTr for selecting the page, a wiring SSL for controlling the transistor STr, and a wiring BSL for controlling the transistor BTr. Note that, in some cases, the wiring WL functions as a wiring for supplying a potential to a control gate (simply referred to as a gate in this specification and the like, in some cases) of a cell transistor in the memory cell MC which will be described below, and the wiring SL and the wiring BL each function as a wiring for supplying a potential to a first terminal and/or a second terminal of the cell transistor in the memory cell MC which will be described below.

Each of the memory cells MC includes a cell transistor CTr. In general, a cell transistor is a transistor that operates with normally-on characteristics and includes a control gate and a charge accumulation layer. The charge accumulation layer is provided in a region overlapping a channel formation region with a tunnel insulating film therebetween, and the control gate is provided in a region overlapping the charge accumulation layer with a blocking film therebetween. In the cell transistor, a tunnel current occurs when a write potential is applied to the control gate and a predetermined potential is supplied to a first terminal or a second terminal of the cell transistor; hence, electrons are injected from the channel formation region into the charge accumulation layer of the cell transistor. Thus, the threshold voltage of a cell transistor in which electrons are injected into its charge accumulation layer is increased. Note that a floating gate may be used instead of the charge accumulation layer. The NAND memory element is a semiconductor device utilizing this principle, and its detailed operating principle will be described later.

The first terminal of the cell transistor CTr is electrically connected to a second terminal of a cell transistor CTr in an adjacent memory cell MC in series, in a circuit configuration. That is, in the circuit configuration illustrated in FIG. 1(A), n cell transistors CTr are electrically connected in series. In addition, a second terminal of the cell transistor CTr in the memory cell MC[1] is electrically connected to a first terminal of the transistor STr, and a first terminal of the cell transistor CTr in the memory cell MC[n] is electrically connected to a first terminal of the transistor BTr. The control gates of the cell transistors CTr in the memory cell MC[1] to the memory cell MC[n] are electrically connected to the respective wirings WL[1] to WL[n]. A second terminal of the transistor STr is electrically connected to the wiring SL, and a gate of the transistor STr is electrically connected to the wiring SSL. A second terminal of the transistor BTr is electrically connected to the wiring BL, and a gate of the transistor BTr is electrically connected to the wiring BSL.

A channel formation region of the cell transistor CTr preferably contains any one or more materials selected from, for example, silicon, germanium, gallium arsenide, silicon carbide (SiC), and a metal oxide that will be described in Embodiment 3. Particularly in the case where the channel formation region contains a metal oxide of any one or more selected from indium, an element M (e.g., aluminum, gallium, yttrium, or tin can be given as the element M), and zinc, the metal oxide sometimes functions as a wide gap semiconductor; thus, a cell transistor containing the metal oxide in its channel formation region has ultralow off-state current characteristics. That is, the leakage current of the cell transistor CTr in an off state can be reduced, so that power consumption of the semiconductor device can be reduced in some cases. Moreover, channel formation regions of the transistor STr and the transistor BTr can contain the above metal oxide.

Furthermore, the channel formation region(s) of the transistor STr and/or the transistor BTr can have a composition different from that of the channel formation region of the cell transistor CTr. For example, it is possible to use a material containing the aforementioned metal oxide for the channel formation region of the cell transistor CTr and use a material containing silicon for the channel formation region(s) of the transistor STr and/or the transistor BTr.

Figure 1B:
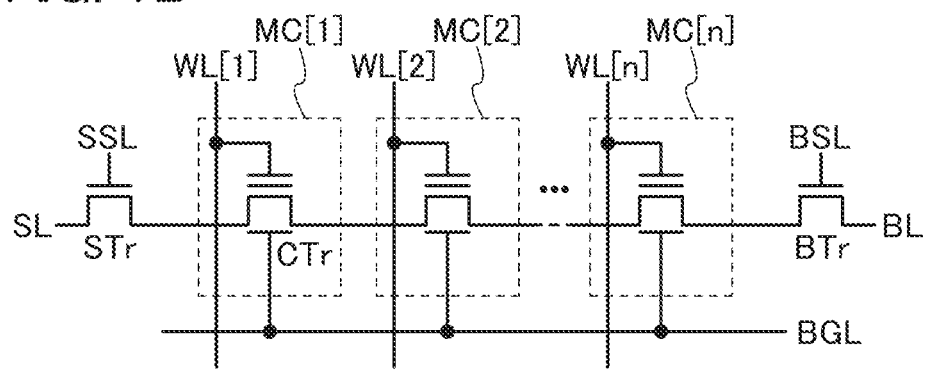

Note that one embodiment of the present invention is not limited to the semiconductor device illustrated in FIG. 1(A). One embodiment of the present invention can have a circuit configuration which is changed as appropriate from that of the semiconductor device illustrated in FIG. 1(A) depending on the case, according to circumstances, or as needed. For example, one embodiment of the present invention may be a semiconductor device in which the cell transistor CTr is provided with a back gate as illustrated in FIG. 1(B). Note that the semiconductor device illustrated in FIG. 1(B) has a configuration in which the cell transistors CTr included in the memory cell MC[1] to the memory cell MC[n] are provided with back gates, to each of which a wiring BGL is electrically connected, in addition to the configuration of the semiconductor device illustrated in FIG. 1(A). Instead of the configuration in which the wiring BGL is electrically connected to each of the back gates of the cell transistors CTr included in the memory cell MC[1] to the memory cell MC[n], the semiconductor device illustrated in FIG. 1(B) may have a configuration in which electrical connection is made on the back gates independently to supply different potentials to the back gates. Note that an operation example of the semiconductor device illustrated in FIG. 1(B) will be described later.

In the case where the memory capacity of the semiconductor device illustrated in FIG. 1(A) or 1(B) is desired to be further increased, the semiconductor devices illustrated in FIG. 1(A) or 1(B) are arranged in a matrix. For example, the circuit configuration in the case where the semiconductor devices illustrated in FIG. 1(A) are arranged in a matrix will be a configuration illustrated in FIG. 2. Note that in this specification and the like, a NAND memory element with multiple pages as illustrated in FIG. 2 is referred to as a one-block NAND memory element.

Figure 2:
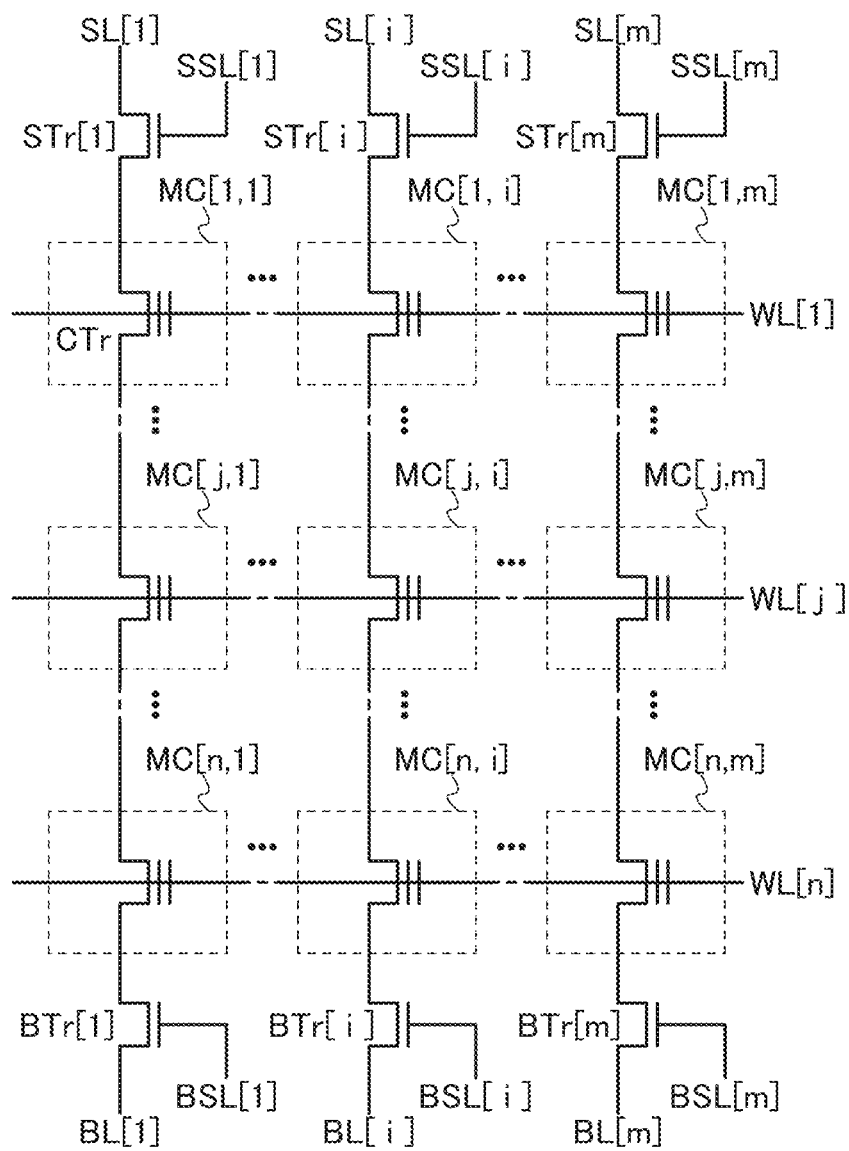
FIG. 2 A circuit diagram illustrating a configuration example of a semiconductor device.

In the semiconductor device illustrated in FIG. 2, the semiconductor devices illustrated in FIG. 1(A) are arranged in m columns (m is an integer greater than or equal to 1), and the wiring WL is electrically connected to and shared with memory cells MC in the same row. That is, the semiconductor device illustrated in FIG. 2 is a semiconductor device having a matrix of n rows and m columns and includes a memory cell MC[1,1] to a memory cell MC[n,m]. Accordingly, in the semiconductor device illustrated in FIG. 2, electrical connection is made through the wiring WL[1] to the wiring WL[n], a wiring BL[1] to a wiring BL[m], a wiring BSL[1] to a wiring BSL[m], a wiring SL[1] to a wiring SL[m], and a wiring SSL[1] to a wiring SSL[m]. Specifically, a control gate of a cell transistor CTr in the memory cell MC[1,i] (j is an integer greater than or equal to 1 and less than or equal to n, and i is an integer greater than or equal to 1 and less than or equal to m) is electrically connected to the wiring WL[j]. The wiring SL[i] is electrically connected to a second terminal of a transistor STr[i], and the wiring BL[i] is electrically connected to the second terminal of the transistor BTr.

FIG. 2 only illustrates the memory cell MC[1,1], the memory cell MC[1,i], the memory cell MC[1,m], the memory cell MC[j,1], the memory cell MC[0], the memory cell MC[j,m], the memory cell MC[n,1], the memory cell MC[n,i], the memory cell MC[n,m], the wiring WL[1], the wiring WL[j], the wiring WL[n], the wiring BL[1], the wiring BL[i], the wiring BL[m], the wiring BSL[1], a wiring BSL[j], a wiring BSL[n], the wiring SL[1], the wiring SL[i], the wiring SL[m], the wiring SSL[1], the wiring SSL[i], the wiring SSL[m], the cell transistors CTr, the transistor BTr[1], the transistor BTr[i], the transistor BTr[m], the transistor STr[1], the transistor STr[i], and the transistor STr[m] and omits the other wirings, elements, symbols, and reference numerals.

Figure 3:
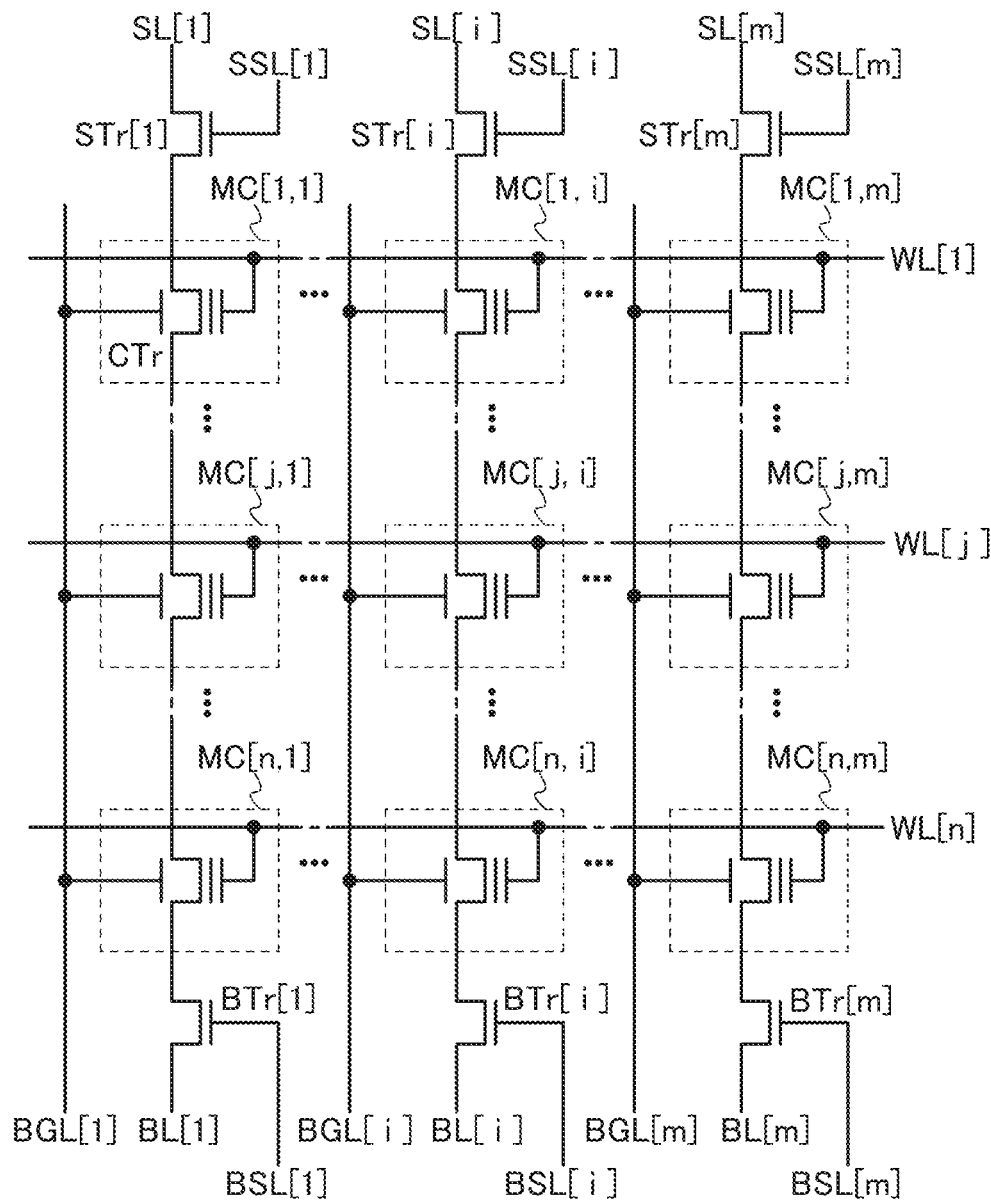
FIG. 3 A circuit diagram illustrating a configuration example of a semiconductor device.

In FIG. 3, the semiconductor devices illustrated in FIG. 1(B) are arranged in m columns (m is an integer greater than or equal to 1). Note that in the semiconductor device illustrated in FIG. 3, all the transistors included in the memory cells MC each have a back gate; hence, the semiconductor device illustrated in FIG. 3 includes a wiring BGL[1] to a wiring BGL[m] electrically connected to the corresponding back gates. Note that the description of the semiconductor device illustrated in FIG. 2 is referred to for the semiconductor device illustrated in FIG. 3.

Although the semiconductor devices illustrated in FIG. 2 and FIG. 3 have configurations in which the semiconductor devices illustrated in FIGS. 1(A) and 1(B), respectively, are arranged in a matrix, one embodiment of the present invention is not limited thereto. Depending on the case, according to circumstances, or as needed, the circuit configurations can be changed. For example, FIG. 2 and FIG. 3 illustrate the wiring BSL[1] to the wiring BSL[m] as the wirings for controlling the respective transistors BTr[1] to BTr[m]; alternatively, one wiring may be electrically connected to each of the gates of the transistor BTr[1] to the transistor BTr[m]. Similarly, as the wiring for controlling the transistor STr[1] to the transistor STr[m], one wiring instead of the wiring SSL[1] to the wiring SSL[m] may be electrically connected to each of the gates of the transistor STr[1] to the transistor STr[m].

<Operation Method Example>

Next, an example of a method for operating the semiconductor device illustrated in FIG. 1(A) or FIG. 1(B) will be described with reference to FIGS. 4(A) and 4(B) and FIGS. 5(A) and 5(B). Note that the semiconductor device of one embodiment of the present invention can handle not only binary data but also multilevel data or analog data in some cases. Therefore, in description of this operation method, data handled for writing and reading out is not limited to binary data.

In addition, a low-level potential and a high-level potential used in the following description do not represent any particular potentials, and specific potentials may be different between wirings. For example, a low-level potential and a high-level potential applied to the wiring BSL may be different from a low-level potential and a high-level potential applied to the wiring BL.

A potential $V_{PGM}$ enables electron injection into a charge accumulation layer of the cell transistor CTr when being applied to the control gate of the cell transistor CTr, and a potential $V_{PS}$ enables the cell transistor CTr to be brought into an on state when being applied to the control gate of the cell transistor CTr.

In this operation method example, a potential in a range where the cell transistor CTr operates normally has previously been applied to the wiring BGL illustrated in FIG. 1(B), unless otherwise specified. Accordingly, the operations of the semiconductor devices illustrated in FIGS. 1(A) and 1(B) can be considered the same.

<<Write Operation>>

Figure 4A:
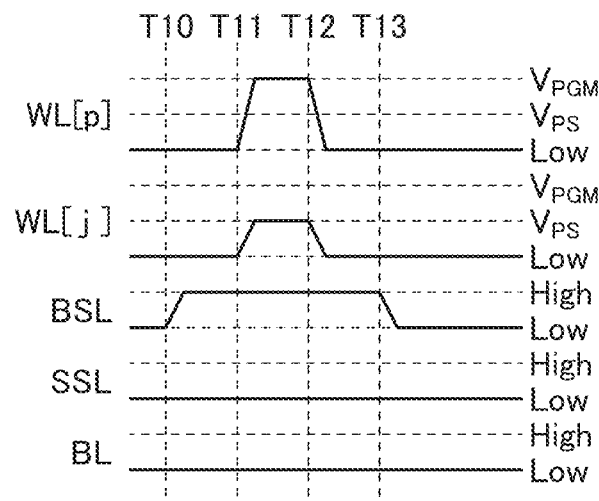
FIG. 4 Timing charts each showing an operation example of a semiconductor device.

FIG. 4(A) is a timing chart showing an operation example for writing data into the semiconductor device. The timing chart in FIG. 4(A) shows changes in potential levels of the wiring WL[p] (p is an integer greater than or equal to 1 and less than or equal to n), the wiring WL[j] (here, j is an integer greater than or equal to 1 and less than or equal to n, except p), the wiring BSL, the wiring SSL, and the wiring BL. Note that the timing chart in FIG. 4(A) shows an operation example for writing data into the memory cell MC[p].

Before time T10, a low-level potential is supplied to the wiring BL.

Between time T10 and time T13, a low-level potential is constantly supplied to the wiring SSL. Thus, the low-level potential is applied to the gate of the transistor STr, so that the transistor STr is brought into an off state.

Between time T10 and time T11, a high-level potential is supplied to the wiring BSL. Thus, a high-level potential is applied to the gate of the transistor BTr, so that the transistor BTr is brought into an on state. When the transistor BTr is brought into an on state, the low-level potential supplied from the wiring BL is applied to the first terminal of the cell transistor CTr in the memory cell MC[n].

Between time T11 and time T12, the potential $V_{PS}$ is supplied to the wiring WL[j]. Hence, the potential $V_{PS}$ is applied to a control gate of a cell transistor CTr included in the memory cell MC[j]. At this time, the cell transistor CTr included in the memory cell MC[n] is brought into an on state because the low-level potential supplied from the wiring BL is applied to the first terminal of the cell transistor CTr in the memory cell MC[n]. Consequently, the low-level potential supplied from the wiring BL is applied to a first terminal of a cell transistor CTr in the memory cell MC[n−1]. In other words, the cell transistor CTr included in the memory cell MC[j] is brought into an on state in sequence.

Moreover, between time T11 and time T12, the potential $V_{PGM}$ is supplied to the wiring WL[p]. Hence, the potential $V_{PGM}$ is applied to a control gate of a cell transistor CTr included in the memory cell MC[p]. Since the low-level potential supplied from the wiring BL is applied to a first terminal of the cell transistor CTr included in the memory cell MC[p] because of the aforementioned operation, electrons are injected into a charge accumulation layer from a channel formation region of the cell transistor CTr included in the memory cell MC[p]. Thus, data is written into the memory cell MC[p]. Note that the threshold voltage of the cell transistor CTr is increased by electron injection into the charge accumulation layer from the channel formation region of the cell transistor CTr included in the memory cell MC[p].

The low-level potential supplied from the wiring BL is applied also to the first terminal of the transistor STr by time T12. Between time T12 and time T13, a low-level potential is applied to the wiring WL[j] and the wiring WL[p].

After time T13, a low-level potential is supplied to the wiring BSL. Thus, the low-level potential is applied to the gate of the transistor BTr, so that the transistor BTr is brought into an off state. Alternatively, although not shown in the timing chart in FIG. 4(A), the transistor BTr can be brought into an off state at that time by setting the potential of the wiring BL to a high-level potential and not supplying a low-level potential to the wiring BSL.

Through the above operation, data can be written into the semiconductor device illustrated in FIG. 1(A) or 1(B).

<<Read-Out Operation>>

Figure 4B:
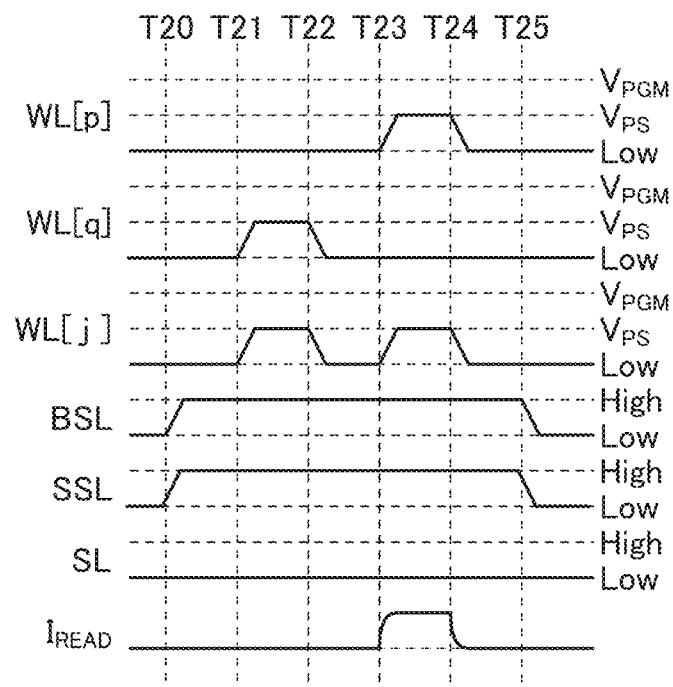

FIG. 4(B) is a timing chart showing an operation example for reading out data from the semiconductor device. The timing chart in FIG. 4(A) shows changes in potential levels of the wiring WL[p], the wiring WL[q] (q is an integer greater than or equal to 1 and less than or equal to n, except p), the wiring WL[j] (here, j is an integer greater than or equal to 1 and less than or equal to n, except p and q), the wiring BSL, the wiring SSL, and the wiring SL, and also shows a change in the amount of $I_{READ}$ as a current flowing between the wiring SL and the wiring BL. Note that the timing chart in FIG. 4(B) shows an operation example for reading out data from the memory cell MC[p] and the memory cell MC[q]. Electrons have been injected into the charge accumulation layer of the cell transistor CTr in the memory cell MC[p] but not into a charge accumulation layer of a cell transistor CTr in the memory cell MC[q].

Before time T20, a low-level potential is supplied to the wiring SL.

Between time T20 and time T21, a high-level potential is supplied to the wiring BSL and the wiring SSL. Thus, the high-level potential is applied to the gates of the transistor BTr and the transistor STr, so that the transistor BTr and the transistor STr are brought into an on state. When the transistor STr is brought into an on state, the low-level potential supplied from the wiring SL is applied to the second terminal of the cell transistor CTr in the memory cell MC[1].

Between time T21 and time T22, the potential $V_{PS}$ is supplied to the wiring WL[q] and the wiring WL[j]. Hence, the potential $V_{PS}$ is applied to control gates of the cell transistors CTr included in the memory cell MC[q] and the memory cell MC[j]. At this time, in the case where the low-level potential supplied from the wiring SL is applied to second terminal(s) of the cell transistor(s) CTr in the memory cell MC[q] and/or the memory cell MC[j], the cell transistor(s) CTr is/are brought into an on state.

Meanwhile, between time T21 and time T22, a low-level potential is supplied to the wiring WL[p]. Hence, the low-level potential is applied to the control gate of the cell transistor CTr included in the memory cell MC[p]. In addition, the threshold voltage of the cell transistor CTr in the memory cell MC[p] is increased because of electrons injected into the charge accumulation layer of the cell transistor CTr in the memory cell MC[p]. For these reasons, the cell transistor CTr in the memory cell MC[p] is brought into an off state, and current does not flow between the wiring SL and the wiring BL. Measuring the amount of current flowing through the wiring BL at this time to show that current does not flow between the wiring SL and the wiring BL demonstrates that electrons are injected into the charge accumulation layer of the cell transistor CTr in the memory cell MC[p].

Between time T22 and time T23, a low-level potential is supplied to each of the wiring WL[p], the wiring WL[q], and the wiring WL[j]. Hence, the low-level potential is applied to each of the control gates of the cell transistors CTr included in the memory cell MC[1] to the memory cell MC[n].

Between time T23 and time T24, the potential $V_{PS}$ is supplied to the wiring WL[j]. Thus, the potential $V_{PS}$ is applied to the control gate of the cell transistor CTr included in the memory cell MC[j]. At this time, in the case where the low-level potential supplied from the wiring SL is applied to a first terminal of the cell transistor CTr in the memory cell MC[j], the cell transistor CTr is brought into an on state.

Furthermore, between time T23 and time T24, the potential $V_{PS}$ is supplied to the wiring WL[p]. Thus, the potential $V_{PS}$ is applied to the control gate of the cell transistor CTr included in the memory cell MC[p]. In this operation example, the cell transistor CTr is substantially brought into an on state because the potential $V_{PS}$ is applied to the control gate of the cell transistor CTr, although the threshold voltage of the cell transistor CTr in the memory cell MC[p] is increased because of electrons injected into the charge accumulation layer of the cell transistor CTr in the memory cell MC[p].

Moreover, between time T23 and time T24, a low-level potential is supplied to the wiring WL[q]. Hence, the low-level potential is applied to the control gate of the cell transistor CTr included in the memory cell MC[j]. The cell transistor CTr included in the memory cell MC operates with normally-on characteristics; accordingly, the cell transistor CTr in the memory cell MC[j] is brought into an on state even when the low-level potential is supplied from the wiring SL is applied to the first terminal of the cell transistor CTr.

That is, the cell transistors CTr included in the memory cell MC[1] to the memory cell MC[n] are brought into an on state, so that current flows between a source and a drain of each of the cell transistors CTr. In other words, measuring the amount of current flowing through the wiring BL at this time to show that current flows between the wiring SL and the wiring BL demonstrates that electrons are not injected into the charge accumulation layer of the cell transistor CTr in the memory cell MC[q].

Between time T24 and time T25, a low-level potential is supplied to each of the wiring WL[p], the wiring WL[q], and the wiring WL[j]. Thus, the low-level potential is applied to each of the control gates of the cell transistors CTr included in the memory cell MC[1] to the memory cell MC[n].

After time T25, a low-level potential is supplied to the wiring BSL and the wiring SSL. Thus, the low-level potential is applied to each of the gates of the transistor BTr and the transistor STr, so that the transistor BTr and the transistor STr are brought into an off state.

That is, in the case of reading out data from a memory cell MC, a low-level potential is applied to the control gate of the cell transistor CTr in the memory cell MC and a high-level potential is applied to the control gates of the cell transistors CTr in the other memory cells MC, and then the amount of current flowing between the wiring SL and the wiring BL is measured, whereby data retained in the memory cell MC can be read out.

Through the above operations, data can be written into and read out from the semiconductor device illustrated in FIG. 1(A) or 1(B).

<<Erase Operation>>

Figure 5A:
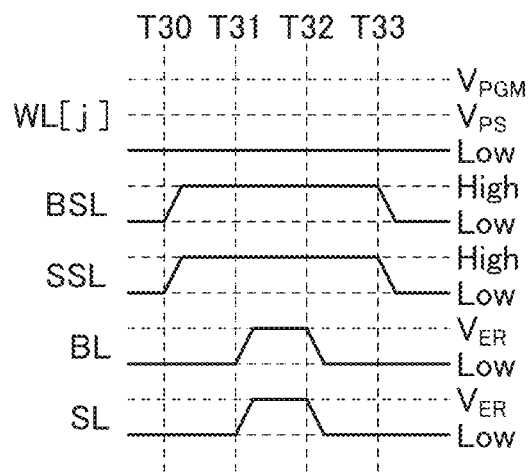
FIG. 5 Timing charts each showing an operation example of a semiconductor device.

FIG. 5(A) is a timing chart showing an operation example for erasing data retained in the semiconductor device. The timing chart in FIG. 5(A) shows changes in potential levels of the wiring WL[j] (here, j is an integer greater than or equal to 1 and less than or equal to n), the wiring BSL, the wiring SSL, the wiring BL, and the wiring SL. Note that an erase operation for a general NAND memory element is performed for each page and the same is applied to this operation example. Note that one embodiment of the present invention is not limited thereto; for example, an erase operation may be performed for each block.

Before time T30, a low-level potential is supplied to the wiring BL and the wiring SL.

Between time T30 and time T33, a low-level potential is constantly supplied to the wiring WL[j].

Between time T30 and time T31, a high-level potential is supplied to the wiring BSL and the wiring SSL. Thus, the high-level potential is applied to each of the gates of the transistor BTr and the transistor STr, so that the transistor BTr and the transistor STr are brought into an on state. When the transistor BTr and the transistor STr are brought into an on state, the low-level potential supplied from the wiring SL is applied to the second terminal of the cell transistor CTr included in the memory cell MC[1], and the low-level potential supplied from the wiring BL is applied to the first terminal of the cell transistor CTr included in the memory cell MC[n].

Between time T31 and time T32, a potential VER is supplied to the wiring BL and the wiring SL. Note that the potential VER is a potential higher than the high-level potential flowing through the wiring BL and the wiring SL. Accordingly, the potentials of the channel formation regions of all the cell transistors CTr included in the memory cell MC[1] to the memory cell MC[n] increase; hence, electrons injected into the charge accumulation layer of each of the cell transistors CTr are extracted to the channel formation region side.

Between time T32 and time T33, a low-level potential is supplied to the wiring BL and the wiring SL.

After time T33, a low-level potential is supplied to the wiring BSL and the wiring SSL. Thus, the low-level potential is applied to each of the gates of the transistor BTr and the transistor STr, so that the transistor BTr and the transistor STr are brought into an off state.

Through the above operation, data can be erased from the semiconductor device illustrated in FIG. 1(A) or 1(B).

Figure 5B:
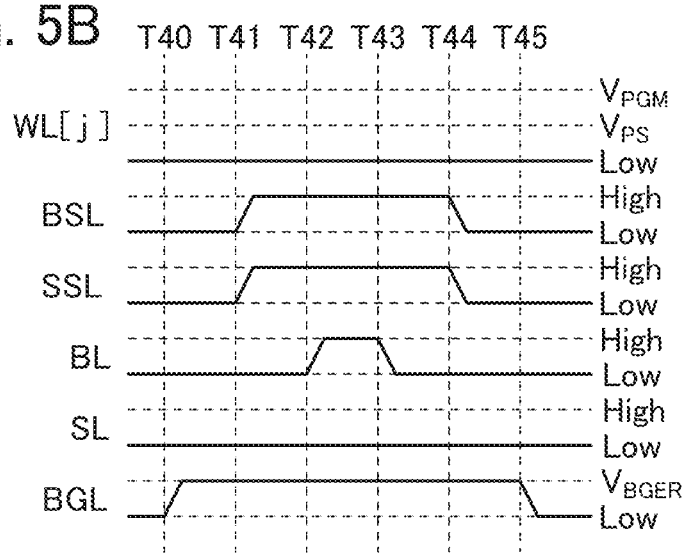

In the semiconductor device illustrated in FIG. 1(B), the erase operation different from the above erase operation can be performed by using the wiring BGL. FIG. 5(B) shows an example of the operation.

Before time T40, a low-level potential is supplied to the wiring BL and the wiring SL.

Between time T40 and time T45, a low-level potential is constantly supplied to the wiring WL[j].

Between time T40 and time T41, a low-level potential is supplied to the wiring BSL and the wiring SSL. Thus, the low-level potential is applied to each of the gates of the transistor BTr and the transistor STr, so that the transistor BTr and the transistor STr are brought into an off state. Consequently, the state between the second terminal of the transistor STr and the first terminal of the transistor BTr becomes floating.

Moreover, between time T40 and time T41, a potential $V_{BGER}$ is supplied to the wiring BGL. The potential $V_{BGER}$ is an extremely high potential. The state between the second terminal of the transistor STr and the first terminal of the transistor BTr is floating, and the potential of the wiring BGL becomes $V_{BGER}$, whereby the potentials of the channel formation regions of all the cell transistors CTr included in the memory cell MC[1] to the memory cell MC[n] are raised by capacitive coupling. Thus, electrons injected into the charge accumulation layer of each of the cell transistors CTr are extracted to the channel formation region side.

Between time T41 and time T42, a high-level potential is supplied to the wiring BSL and the wiring SSL. Hence, the high-level potential is applied to each of the gates of the transistor BTr and the transistor STr, so that the transistor BTr and the transistor STr are brought into an on state.

Between time T42 and time T43, a high-level potential is supplied to the wiring BL. Thus, the electrons that are extracted from the charge accumulation layer of the cell transistor CTr can flow through the wiring BL.

Between time T43 and time T44, a low-level potential is supplied to the wiring BL. Then, at time T44, a low-level potential is supplied to the wiring BSL and the wiring SSL. Thus, the low-level potential is applied to each of the gates of the transistor BTr and the transistor STr, so that the transistor BTr and the transistor STr are brought into an off state. Finally, after time T45, a low-level potential is supplied to the wiring BGL.

As shown in the above operation, data can be erased also from the semiconductor device illustrated in FIG. 1(B) by using the wiring BGL.

<Structure Example and Manufacturing Method Example>

For easy understanding of the structure of the semiconductor device in this embodiment, a method for manufacturing the semiconductor device will be described below.

Figure 6A:
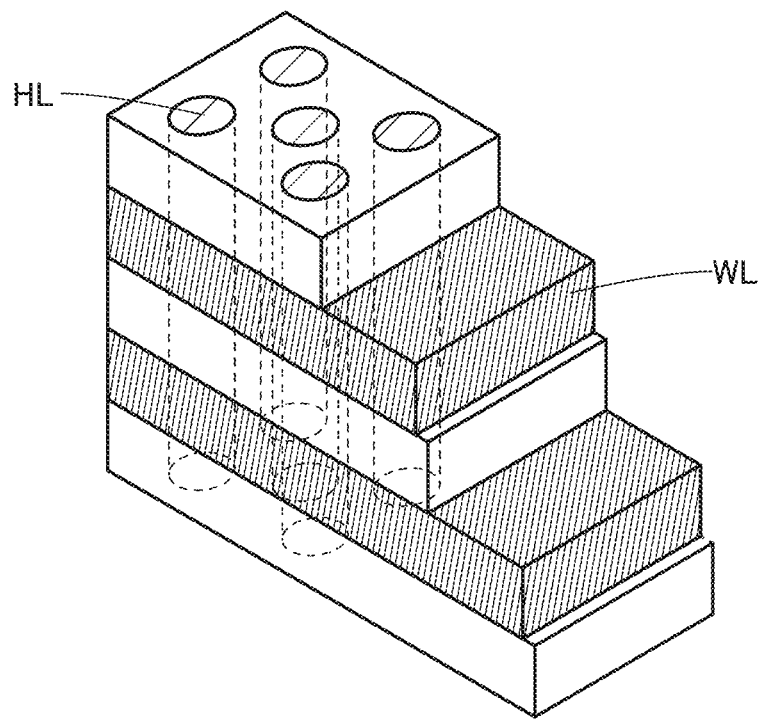
FIG. 6 A perspective view, a top view, and a cross-sectional view for illustrating a structure example of a semiconductor device.
Figure 6B:
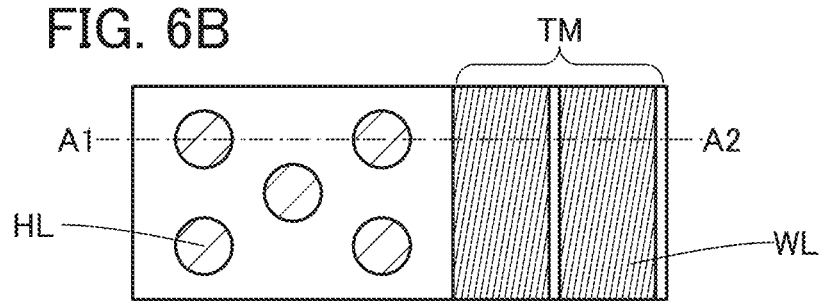
Figure 6C:
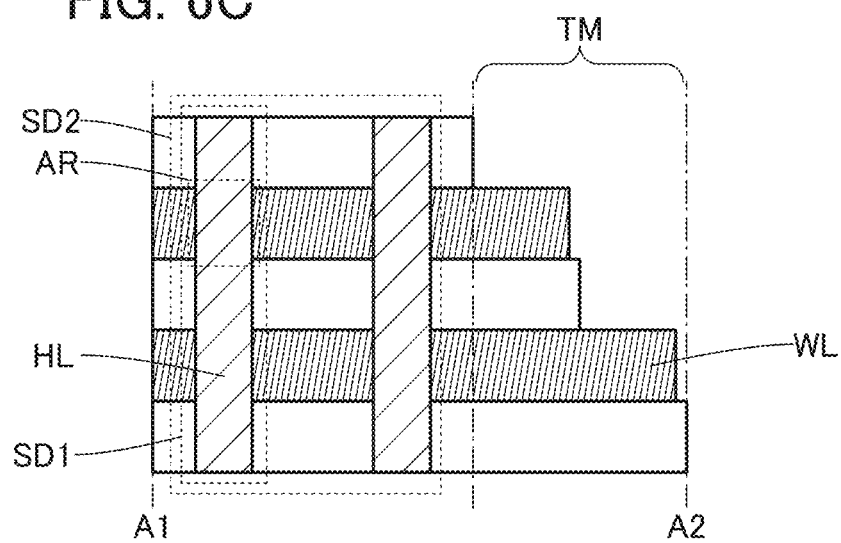

FIGS. 6(A), 6(B), and 6(C) are schematic view examples showing part of the semiconductor device in FIG. 2 or FIG. 3. FIG. 6(A) is a perspective view illustrating part of the semiconductor device, and FIG. 6(B) is a top view of FIG. 6(A). Furthermore, FIG. 6(C) is a cross-sectional view along the dashed-dotted line A1-A2 in FIG. 6(B).

The semiconductor device includes a structure body in which the wirings WL and insulators (regions without a hatching pattern in FIG. 6) are stacked.

An opening is formed in the structure body to penetrate the insulators and the wirings WL altogether. Then, to provide the memory cell MC in a region AR that penetrates the wirings WL, an insulator, a conductor, and a semiconductor are formed in the opening. Note that the conductor functions as a source electrode or a drain electrode of the cell transistor CTr in the memory cell MC, and the semiconductor functions as a channel formation region of the cell transistor CTr. Alternatively, without formation of the conductor, a channel formation region and a low-resistance region may be formed in the semiconductor and the low-resistance region may serve as the source electrode or the drain electrode of the cell transistor CTr. The region where the insulator, the conductor, and the semiconductor are formed in the opening is shown as a region HL in FIGS. 6(A), 6(B), and 6(C). In particular, in FIG. 6(A), the region HL included inside the structure body is indicated by a dashed line. Note that in the case where the transistor included in the memory cell MC is provided with a back gate, the conductor included in the region HL may function as the wiring BGL for electrical connection to the back gate.

In other words, FIG. 6(C) illustrate that the semiconductor device illustrated in any one of FIGS. 1(A) and 1(B) is formed in a region SD1, and the semiconductor device illustrated in FIG. 2 or FIG. 3 is formed in a region SD2.

A region TM where the wiring WL is exposed functions as a connection terminal for supplying a potential to the wiring WL. That is, electrically connecting a wiring to the region TM enables a potential to be supplied to the gate of the cell transistor CTr.

Figure 7A:
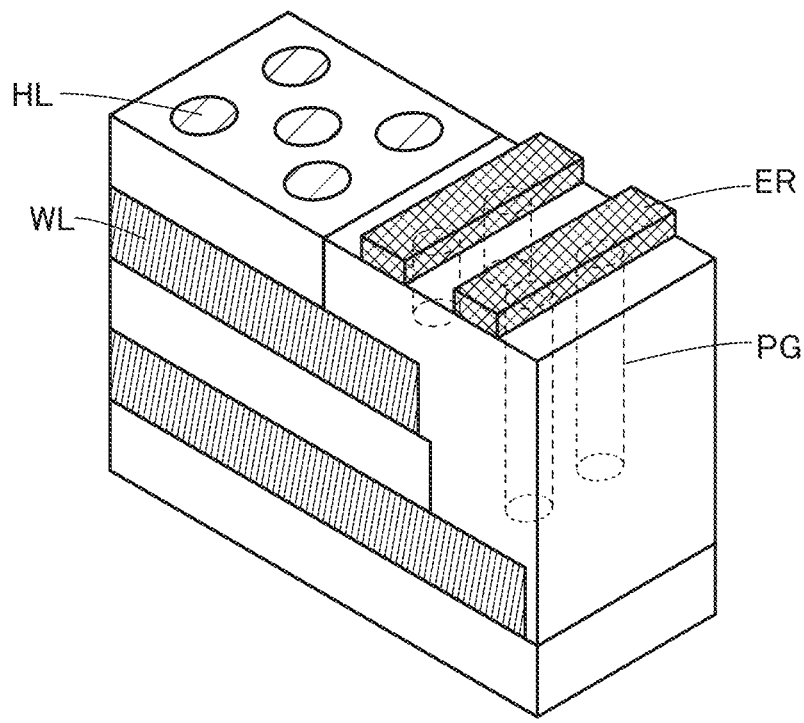
FIG. 7 A perspective view, a top view, and a cross-sectional view for illustrating a structure example of a semiconductor device.
Figure 7B:
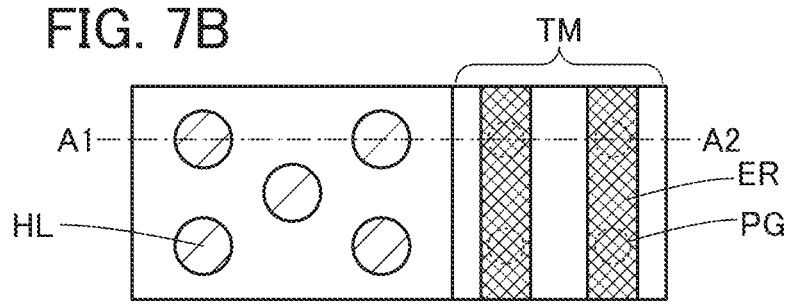
Figure 7C:
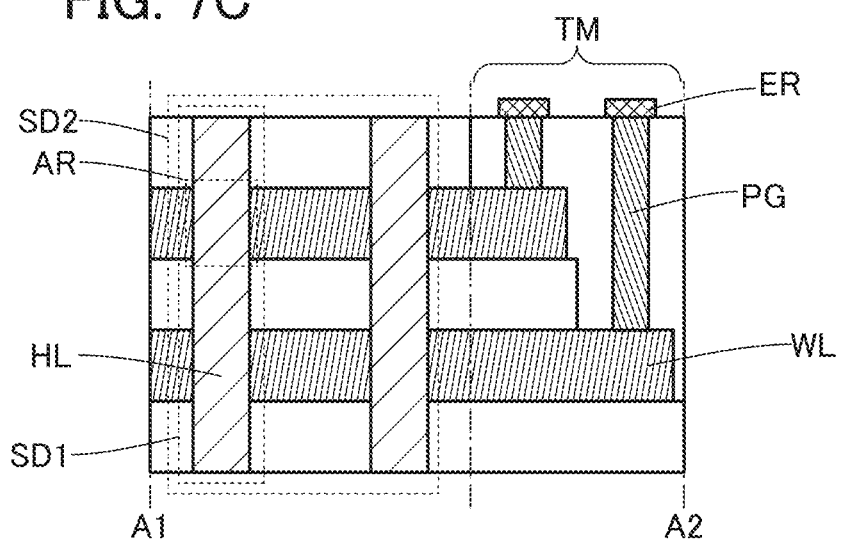

Note that the shape of the region TM is not limited to that in the structure example shown in FIG. 6. The semiconductor device of one embodiment of the present invention may be configured, for example, such that an insulator is formed over the region TM illustrated in FIG. 6, an opening is provided in the insulator, and a conductor PG is formed to fill the opening (FIGS. 7(A), 7(B), and 7(C)). Note that a wiring ER is formed over the conductor PG, whereby the wiring ER and the wiring WL are electrically connected to each other. Note that in FIG. 7(A), the conductor PG provided inside the structure body is indicated by a dashed line, and the dashed line representing the region HL is omitted.

A method for forming the memory cell MC in the region AR will be described in Manufacturing method example 1 and Manufacturing method example 2 below.

<<Manufacturing Method Example 1>>

FIG. 8 to FIG. 19 are cross-sectional views, top views, and a perspective view for illustrating a manufacturing example of the semiconductor device illustrated in FIG. 1(A), and the cross-sectional views specifically illustrate the cell transistor CTr in the channel length direction. In the cross-sectional views, the top views, and the perspective view of FIG. 8 to FIG. 19, some components are not illustrated for clarification of the drawing.

Figure 8A:
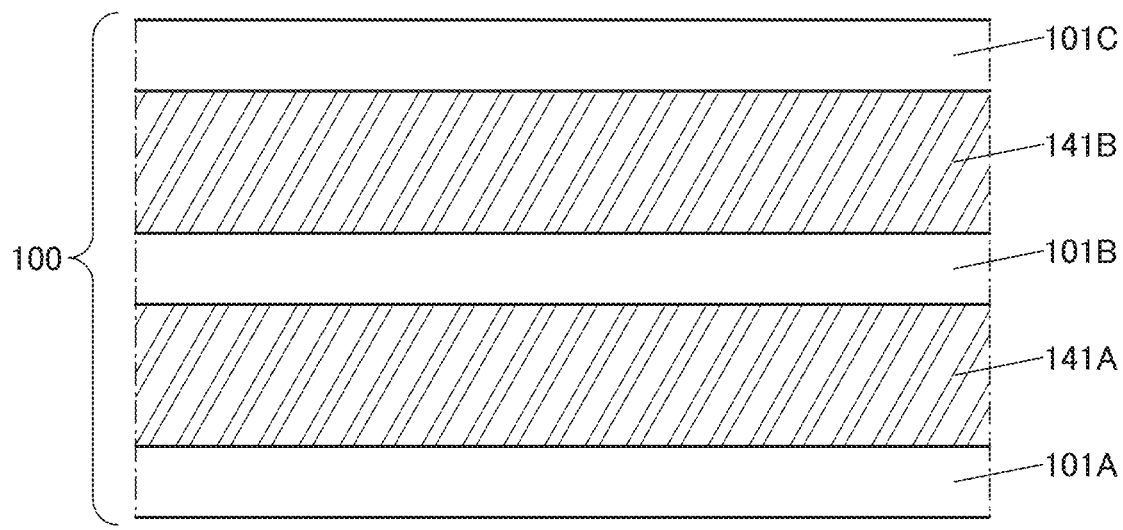
FIG. 8 Cross-sectional views for illustrating a manufacturing example of a semiconductor device.

As illustrated in FIG. 8(A), the semiconductor device in FIG. 1(A) includes an insulator 101A positioned over a substrate (not illustrated), a sacrificial layer 141A positioned over the insulator 101A, an insulator 101B positioned over the sacrificial layer 141A, a sacrificial layer 141B positioned over the insulator 101B, and an insulator 101C positioned over the sacrificial layer 141B. Note that a stack including these sacrificial layers and insulators (also including a conductor and the like depending on subsequent steps) is hereinafter referred to as a stack 100.

Note that as the substrate, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Furthermore, a semiconductor substrate in which an insulator region is included in the aforementioned semiconductor substrate, for example, an SOI (Silicon On Insulator) substrate or the like is used. Examples of the conductor substrate include a graphite substrate, a metal substrate, an alloy substrate, and a conductive resin substrate. Alternatively, a substrate including a metal nitride, a substrate including a metal oxide, or the like is used. Furthermore, an insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. Examples of the element provided over the substrate include a capacitor, a resistor, a switching element, a light-emitting element, and a memory element.

A flexible substrate may be used as the substrate. Note that as a method of providing a transistor over a flexible substrate, there is a method in which the transistor is fabricated over a non-flexible substrate and then the transistor is separated and transferred to a substrate which is a flexible substrate. In that case, a separation layer is preferably provided between the non-flexible substrate and the transistor. As the substrate, a sheet, a film, a foil, or the like containing a fiber may be used. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate which is a flexible substrate, metal, an alloy, a resin, glass, or fiber thereof can be used, for example. The substrate which is a flexible substrate preferably has a lower coefficient of linear expansion because deformation due to an environment is inhibited. For the substrate which is a flexible substrate, a material whose coefficient of linear expansion is lower than or equal to $1 \times 10^{-3}$/K, lower than or equal to $5 \times 10^{-5}$/K, or lower than or equal to $1 \times 10^{-5}$/K can be used, for example. Examples of the resin include polyester, polyolefin, polyamide (nylon, aramid, or the like), polyimide, polycarbonate, and acrylic. In particular, aramid is preferable for the substrate which is a flexible substrate because of its low coefficient of linear expansion.

In the manufacture example described in this embodiment, heat treatment is included in the process; therefore, a material having high heat resistance and a low coefficient of thermal expansion is preferably used for the substrate.

A variety of materials can be used for the sacrificial layer 141A and the sacrificial layer 141B. For example, as an insulator, silicon nitride, silicon oxide, or aluminum oxide may be used. Alternatively, as a semiconductor, silicon, gallium, germanium, or the like may be used. Alternatively, as a conductor, aluminum, copper, titanium, tungsten, tantalum, or the like may be used. That is, for the sacrificial layer 141A and the sacrificial layer 141B, a material that can have etching selectivity to the material used in the other part may be used.

The insulator 101A to the insulator 101C are preferably materials with a low concentration of impurities such as water or hydrogen. The amount of hydrogen released from the insulator 101A to the insulator 101C, which is converted into hydrogen molecules per area of one of the insulator 101A to the insulator 101C, is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in thermal desorption spectroscopy (TDS) in the range from 50° C. to 500° C., for example. The insulator 101A to the insulator 101C may be formed using an insulator from which oxygen is released by heating. Note that the materials usable for the insulator 101A to the insulator 101C are not limited to the above description.

For the insulator 101A to the insulator 101C, for example, a single layer or a stacked layer of an insulator including one or more materials selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used in some cases. For example, a material containing silicon oxide or silicon oxynitride can be used in some cases. Note that the materials usable for the insulator 101A to the insulator 101C are not limited to the above description.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

Figure 8B:
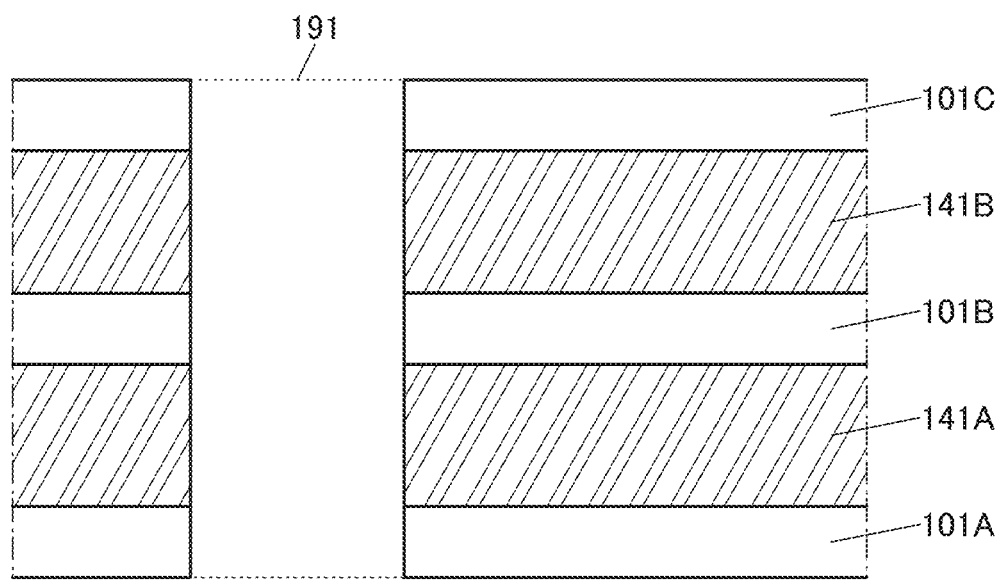

In the next step, as illustrated in FIG. 8(B), an opening 191 is formed in the stack 100 illustrated in FIG. 8(A) through formation of a resist mask and etching treatment, or the like.

The formation of the resist mask can be performed by a lithography method, a printing method, an inkjet method, or the like as appropriate. The formation of the resist mask by an inkjet method needs no photomask; thus, manufacturing cost can be reduced in some cases. For the etching treatment, either a dry etching method or a wet etching method or both of them may be used.

Figure 9A:
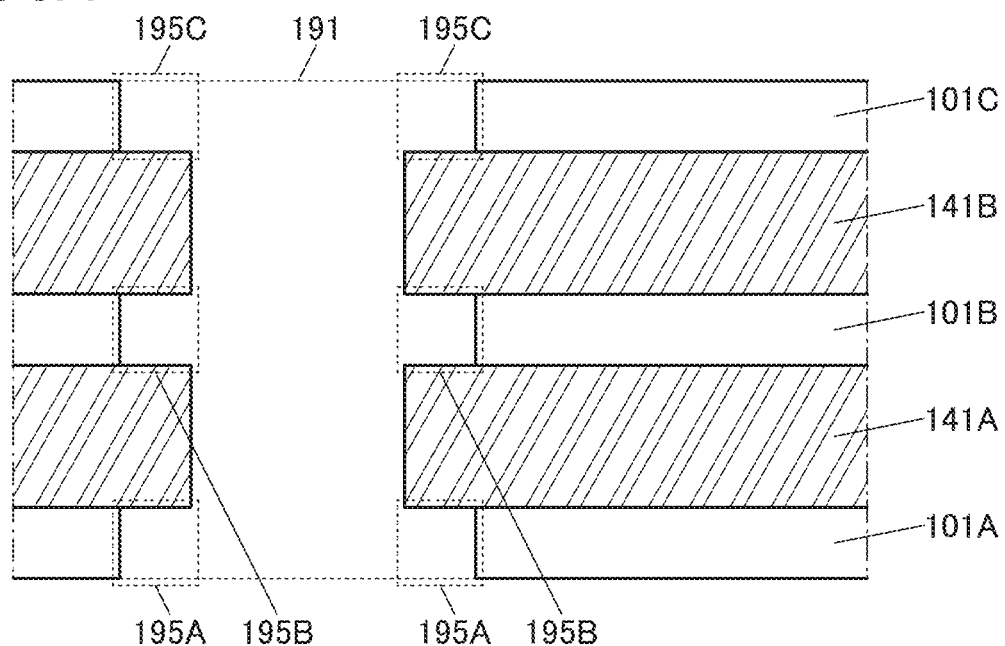
FIG. 9 Cross-sectional views for illustrating a manufacturing example of a semiconductor device.

Then, in a step illustrated in FIG. 9(A), the insulator 101A, the insulator 101B, and the insulator 101C on a side surface of the opening 191 are each partly removed by etching treatment or the like, and a recess portion 195A, a recess portion 195B, and a recess portion 195C are formed on the side surface. Here, for the insulator 101A, the insulator 101B, and the insulator 101C, a material is used such that the insulator 101A, the insulator 101B, and the insulator 101C are selectively removed in the stack 100 (a material with a higher etching rate than the sacrificial layer 141A and the sacrificial layer 141B).

In addition, in the manufacturing step of the semiconductor device illustrated in FIG. 8(B), the recess portion 195A, the recess portion 195B, and the recess portion 195C can be formed in some cases when the opening 191 is formed.

Figure 9B:
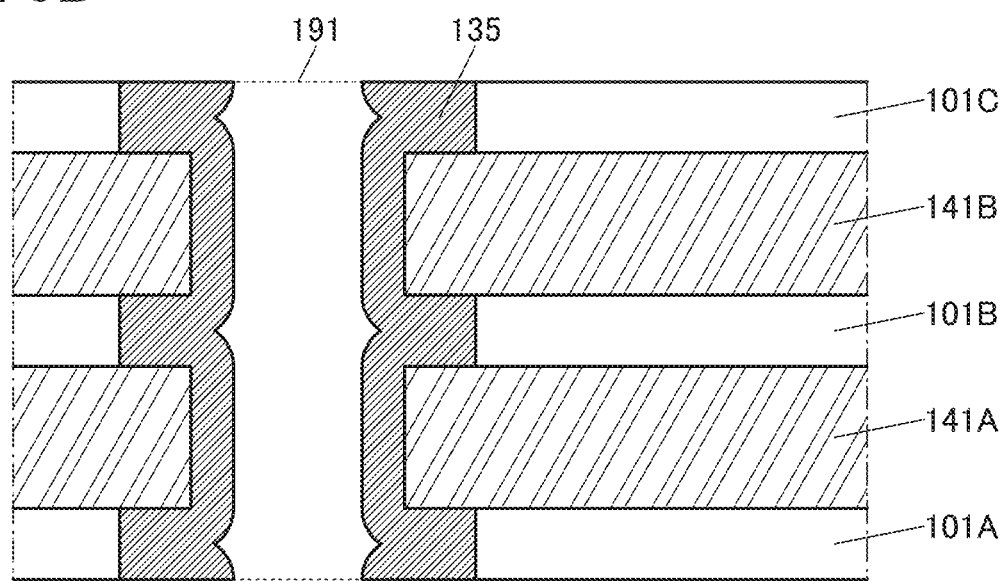

In the next step, as illustrated in FIG. 9(B), a conductor 135 is deposited on the side surface of the opening 191 and in the recess portion 195A, the recess portion 195B, and the recess portion 195C illustrated in FIG. 9(A). That is, the conductor 135 is deposited on each side surface of the insulator 101A to the insulator 101C.

In the case where a semiconductor 151 which will be described later is a material containing silicon, it is preferable that the conductor 135 be a material usable for a conductor 134 which will be described later and that the material usable for the conductor 134 contain an impurity (an element or an ion) to be diffused into the semiconductor 151, for example. As will be described in detail later, an n-type impurity (a donor) is used as the impurity in the case where the cell transistor CTr is formed as an n-channel transistor in this manufacturing method example. As the n-type impurity, phosphorus or arsenic can be used, for example. In addition, a p-type impurity (an acceptor) is used as the impurity in the case where the cell transistor CTr is a p-channel transistor in this manufacturing method example. As the p-type impurity, boron, aluminum, or gallium can be used, for example. Alternatively, the p-type impurity may be a material which can form silicide. For example, nickel, cobalt, molybdenum, tungsten, or titanium may be used.

Alternatively, the conductor 135 may be a material with high conductivity. For example, aluminum, copper, or silver may be used. Further alternatively, the conductor 135 may be a material with high heat resistance. For example, titanium, molybdenum, tungsten, or tantalum may be used.

In the case where the semiconductor 151 which will be described later is a material containing a metal oxide, the conductor 135 is preferably a material having a role of reducing the resistance of the semiconductor 151 deposited in a region over the formation surface of the conductor 135, for example. Although the low resistance of the semiconductor 151 will be described later, for the conductor 135, a metal with a resistance of $2.4\times10^3$ [Ω/sq] or less, preferably $1.0\times10^3$ [Ω/sq] or less, a nitride containing a metal element, or an oxide containing a metal element is used. For the conductive material, it is possible to use, for example, a metal film of aluminum, ruthenium, titanium, tantalum, tungsten, or chromium, a nitride film containing a metal element, such as Al—Ti nitride or titanium nitride, or an oxide film containing a metal element, such as indium tin oxide or In—Ga—Zn oxide.

As long as the conductor 135 is the material having a role of reducing the resistance of the semiconductor 151, it is not limited to the above conductive material. For example, an insulator such as silicon nitride can be used in some cases as an alternative to the conductor 135. A semiconductor device in the case where an insulator such as silicon nitride is used as an alternative to the conductor 135 will be described later.

Figure 10A:
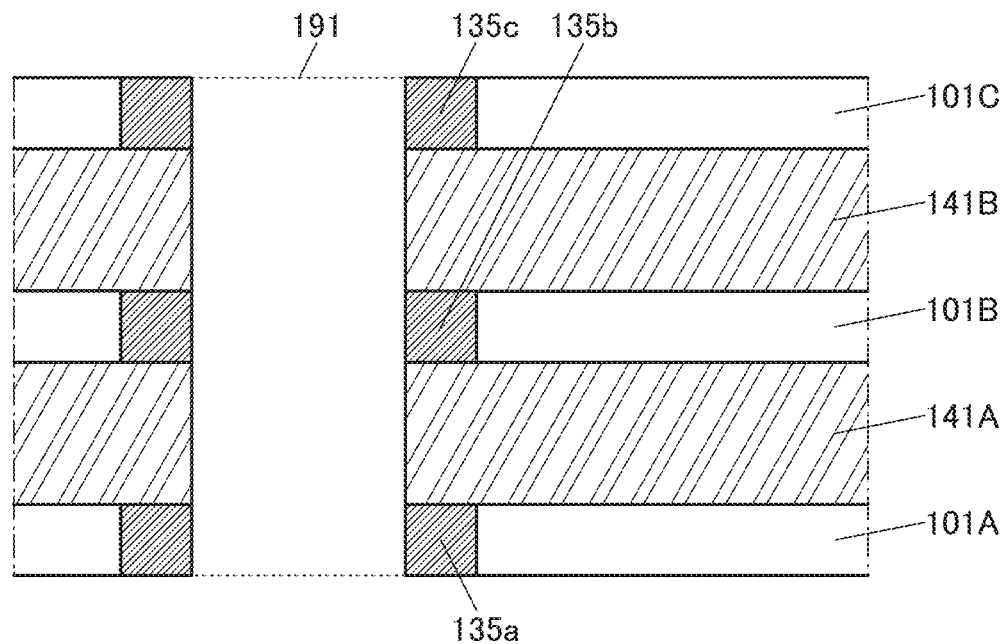
FIG. 10 Cross-sectional views for illustrating a manufacturing example of a semiconductor device.

In the next step, as illustrated in FIG. 10(A), the conductor 135 included in the opening 191 is removed by resist mask formation and etching treatment, or the like so that the conductor 135 remains only in the aforementioned recess portion 195A, recess portion 195B, and recess portion 195C. At this time, removal of the conductor 135 is performed until the sacrificial layer 141A and the sacrificial layer 141B are exposed. Thus, a conductor 135a, a conductor 135b, and a conductor 135c are formed.

Note that the description of FIG. 8(B) is referred to for the resist mask formation and the etching treatment, or the like.

Figure 10B:
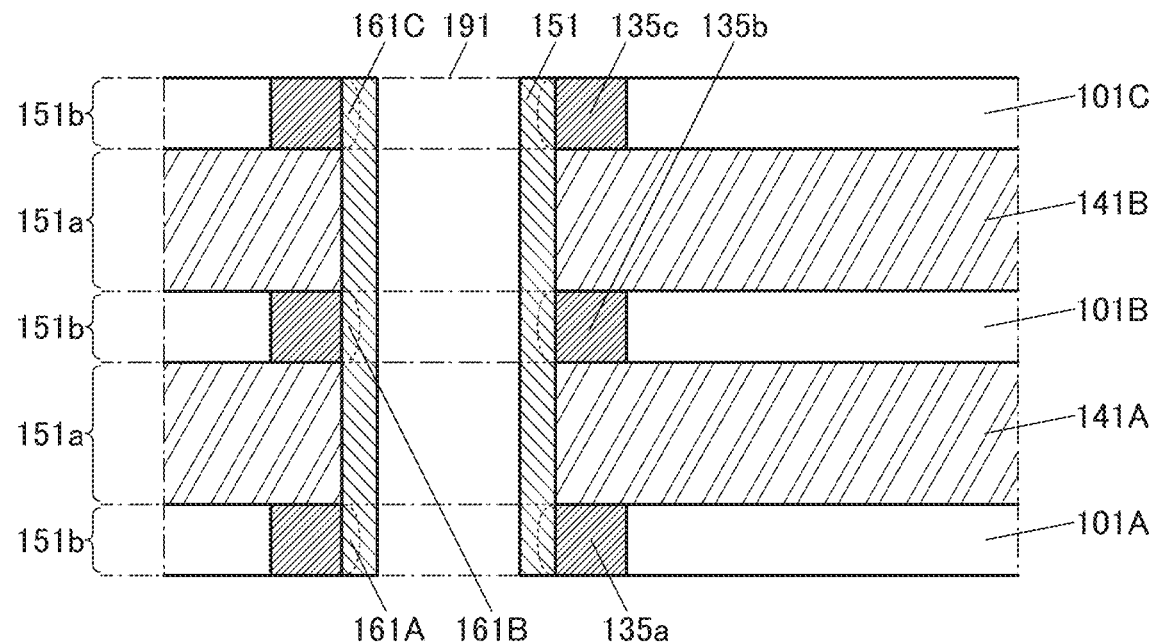

Next, as illustrated in FIG. 10(B), the semiconductor 151 is formed so as to cover the conductor 135a, the conductor 135b, the conductor 135c, the sacrificial layer 141A, and the sacrificial layer 141B on the side surface of the opening 191.

In the case where a material containing silicon is used for the semiconductor 151, an impurity (an element, an ion, or the like) contained in the conductor 135a (the conductor 135b, the conductor 135c) is in some cases diffused into the semiconductor 151 when the semiconductor 151 is in contact with the conductor 135a (the conductor 135b, the conductor 135c). At this time, heat treatment is preferably performed on the stack 100 according to circumstances or depending on the case. That is, an impurity region is formed on a surface of the semiconductor 151 which is in contact with the conductor 135a (the conductor 135b, the conductor 135c) and around the interface therebetween.

In the case where the impurity contained in the conductor 135a (the conductor 135b, the conductor 135c) is an n-type impurity (a donor), an n-type impurity region is in some cases formed in a region 151b of the semiconductor 151 or in the semiconductor 151 around the interface with the conductor 135a (the conductor 135b, the conductor 135c). On the other hand, when the impurity contained in the conductor 135a (the conductor 135b, the conductor 135c) is a p-type impurity (an acceptor), a p-type impurity region is in some cases formed in the region 151b of the semiconductor 151 or in the semiconductor 151 around the interface with the conductor 135a (the conductor 135b, the conductor 135c). Accordingly, carriers are in some cases formed in the region 151b of the semiconductor 151 or in the semiconductor 151 around the interface with the conductor 135a (the conductor 135b, the conductor 135c), resulting in lower resistance of the region 151b.

By performing heat treatment, a metal silicide is in some cases formed in the semiconductor 151 around the interface with the conductor 135a (the conductor 135b, the conductor 135c) from the conductive material of the conductor 135a (the conductor 135b, the conductor 135c) and the component of the semiconductor 151. In this case, a compound 161A (a compound 161B, a compound 161C) is illustrated in FIG. 10(B) as the metal silicide. Moreover, an impurity region is in some cases formed in the semiconductor 151 around the interface with the compound 161A (the compound 161B, the compound 161C).

In the case where a material containing a metal oxide is used for the semiconductor 151, when heat treatment is performed while the semiconductor 151 and the conductor 135a (the conductor 135b, the conductor 135c) are in contact with each other, the compound 161A (the compound 161B, the compound 161C) is in some cases formed from the component of the conductor 135a (the conductor 135b, the conductor 135c) and the component of the semiconductor 151, resulting in lower resistance of the region 151b of the semiconductor 151. Note that at least the resistance of the surface of the semiconductor 151 which is in contact with the conductor 135a (the conductor 135b, the conductor 135c) and around the interface therebetween is reduced. The resistance of the region 151b is reduced probably because part of oxygen in the semiconductor 151 at or around the interface between the semiconductor 151 and the conductor 135a (the conductor 135b, the conductor 135c) is absorbed by the conductor 135a (the conductor 135b, the conductor 135c) and oxygen vacancies are formed in the semiconductor 151.

In addition, heat treatment may be performed in an atmosphere containing nitrogen while the semiconductor 151 and the conductor 135a (the conductor 135b, the conductor 135c) are in contact with each other. In some cases, with the heat treatment, from the conductor 135a (the conductor 135b, the conductor 135c), the metal element which is the component of the conductor 135a (the conductor 135b, the conductor 135c) is diffused into the semiconductor 151, or the metal element which is the component of the semiconductor 151 is diffused into the conductor 135a (the conductor 135b, the conductor 135c), and therefore, a metal compound is formed by the semiconductor 151 and the conductor 135a (the conductor 135b, the conductor 135c). Note that at this time, the metal element of the semiconductor 151 and the metal element of the conductor 135a (the conductor 135b, the conductor 135c) may be alloyed. When the metal element of the semiconductor 151 and the metal element of the conductor 135a (the conductor 135b, the conductor 135c) are alloyed, the metal elements become comparatively stable; thus, a highly reliable semiconductor device can be provided.

In the case where hydrogen in the semiconductor 151 is diffused into the region 151b and enters an oxygen vacancy in the region 151b, the hydrogen becomes comparatively stable. Hydrogen in an oxygen vacancy in a region 151a is released from the oxygen vacancy by heat treatment at 250° C. or higher, diffused into the region 151b, enters an oxygen vacancy in the region 151b, and becomes comparatively stable. Thus, by the heat treatment, the resistance of the region 151b is further reduced, and the resistance of the region 151a is further increased by high purification (reduction of impurities such as water or hydrogen).

That is, by the above manufacturing method, the region 151b of the semiconductor 151 can be formed as a low-resistance region and the region 151a of the semiconductor 151 can be formed as a channel formation region. Note that the region 151b serving as the low-resistance region corresponds to the first terminal and/or the second terminal of the cell transistor CTr; hence, the electric resistance between the cell transistors, which are electrically connected in series with each other, can be reduced by the above manufacturing method.

Note that as described above, in the case where a material containing a metal oxide is used for the semiconductor 151, the metal oxide will be described in Embodiment 3.

Figure 11A:
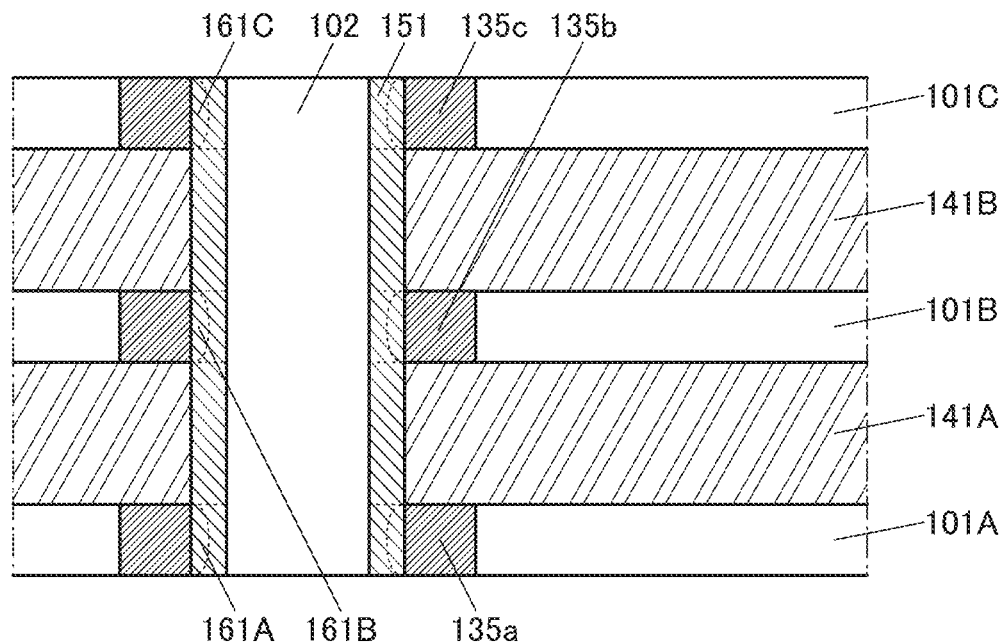
FIG. 11 Cross-sectional views for illustrating a manufacturing example of a semiconductor device.

In the next step, as illustrated in FIG. 11(A), an insulator 102 is deposited on the formation surface of the semiconductor 151 to fill the remaining opening 191.

An insulating material having a function of inhibiting transmission of oxygen is preferably used for the insulator 102, for example. For the insulator 102, silicon nitride, silicon nitride oxide, silicon oxynitride, aluminum nitride, or aluminum nitride oxide is preferably used, for example. When such an insulator 102 is formed, oxygen is prevented from releasing from the region 151a of the semiconductor 151 and diffusing into the insulator 102. Consequently, it is possible to prevent reduction of the resistance of the region 151a of the semiconductor 151 due to release of oxygen from the region 151a of the semiconductor 151.

An insulating material having a function of transmitting oxygen is preferably used for the insulator 102, for example. For example, the insulator 102 is doped with oxygen so that oxygen is diffused, whereby oxygen can be supplied to the semiconductor 151. As a result, it is possible to prevent reduction of the resistance of the region 151a of the semiconductor 151.

Figure 11B:
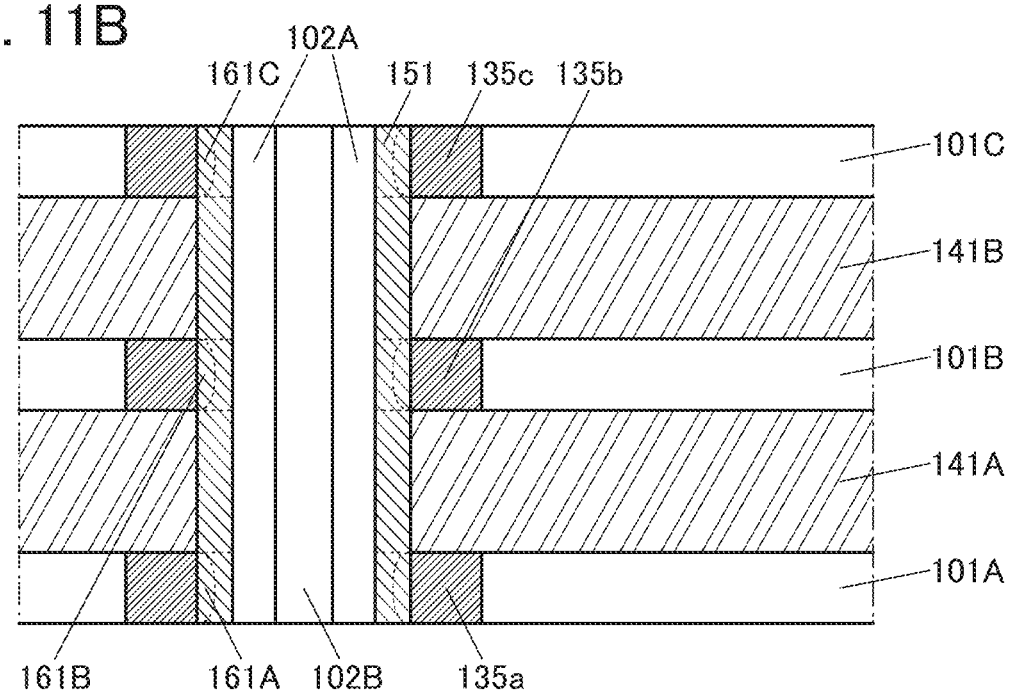

Alternatively, a plurality of insulators 102 may be stacked. For example, as illustrated in FIG. 11(B), silicon oxide may be used for an insulator 102A in contact with the semiconductor 151 and aluminum oxide or hafnium oxide may be used for an insulator 102B in contact with the insulator 102A. For example, in the case where aluminum oxide is deposited by a sputtering method, oxygen is supplied to the insulator 102A. Oxygen which has been supplied to the insulator 102A is supplied to the semiconductor 151. As a result, it is possible to prevent reduction of the resistance of the region 151a of the semiconductor 151.

Moreover, an insulating material having a function of inhibiting transmission of impurities such as water or hydrogen is preferably used for the insulator 102, for example. For example, for the insulator 102, aluminum oxide can be used. Note that a material usable for the insulator 102 is not limited to the above material; for example, for the insulator 102, any of the above materials usable for the insulator 101A to the insulator 101C can be used as a film with a low concentration of impurities such as water and hydrogen.

Figure 12:
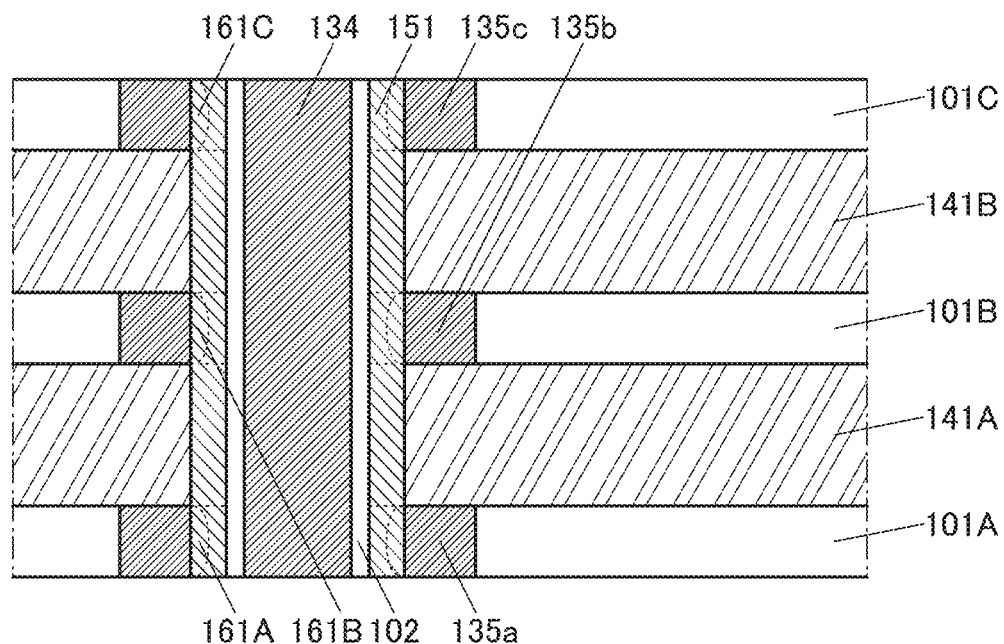
FIG. 12 A cross-sectional view for illustrating a manufacturing example of a semiconductor device.

In the case where the cell transistor included in the semiconductor device is provided with a back gate, the step illustrated in FIG. 12 may be performed instead of the steps in FIGS. 11(A) and 11(B). In the step illustrated in FIG. 12, the insulator 102 is deposited on the formation surface of the semiconductor 151, and the conductor 134 is deposited to fill the remaining opening 191.

At this time, the conductor 134 functions as the wiring BGL illustrated in FIG. 1(B) and FIG. 3.

It is possible to use, for the conductor 134, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. Furthermore, it is also possible to use, for the conductor 134, a semiconductor having high electrical conductivity, typified by polycrystalline silicon containing an impurity element such as phosphorus, or silicide such as a nickel silicide.

For example, for the conductor 134, a conductive material containing oxygen and a metal element contained in a metal oxide usable for the semiconductor 151 may be used. Alternatively, a conductive material containing the aforementioned metal element and nitrogen may be used. For example, a conductive material containing nitrogen, such as titanium nitride or tantalum nitride, can be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used. Furthermore, indium gallium zinc oxide containing nitrogen can be used. Using such a material in some cases allows capture of hydrogen entering from a surrounding insulator or the like.

Moreover, a conductive material having a function of inhibiting transmission of impurities such as water or hydrogen is preferably used for the conductor 134, for example. For example, tantalum, tantalum nitride, titanium, titanium nitride, ruthenium, or ruthenium oxide is preferably used, and a single layer or a stacked layer can be used.

A plurality of the above materials may be stacked for the conductor 134. For example, a stacked-layer structure combining a material containing the aforementioned metal element and a conductive material containing oxygen may be employed. Furthermore, a stacked-layer structure combining a material containing the aforementioned metal element and a conductive material containing nitrogen may be employed. Furthermore, a stacked-layer structure combining a material containing the aforementioned metal element, a conductive material containing oxygen, and a conductive material containing nitrogen may be employed. When an insulator including an excess-oxygen region is used as the insulator in contact with the surrounding of the conductor, oxygen is in some cases diffused into a region of the conductor in contact with the insulator. Accordingly, a stacked-layer structure combining a material containing the metal element and a conductive material containing oxygen can be formed in some cases. Similarly, when an insulator including an excess-nitrogen region is used as the insulator in contact with the surrounding of the conductor, nitrogen is in some cases diffused into a region of the conductor in contact with the insulator. Accordingly, a stacked-layer structure combining a material containing the metal element and a conductive material containing nitrogen can be formed in some cases.

Note that the insulator 102 illustrated in FIG. 12 may have a structure of a stack including a plurality of insulators. The structure of the stack including a plurality of insulators may be, for example, a structure of a stack including the insulator 102A and the insulator 102B described with reference to FIG. 11(B) (not illustrated).

Figure 13A:
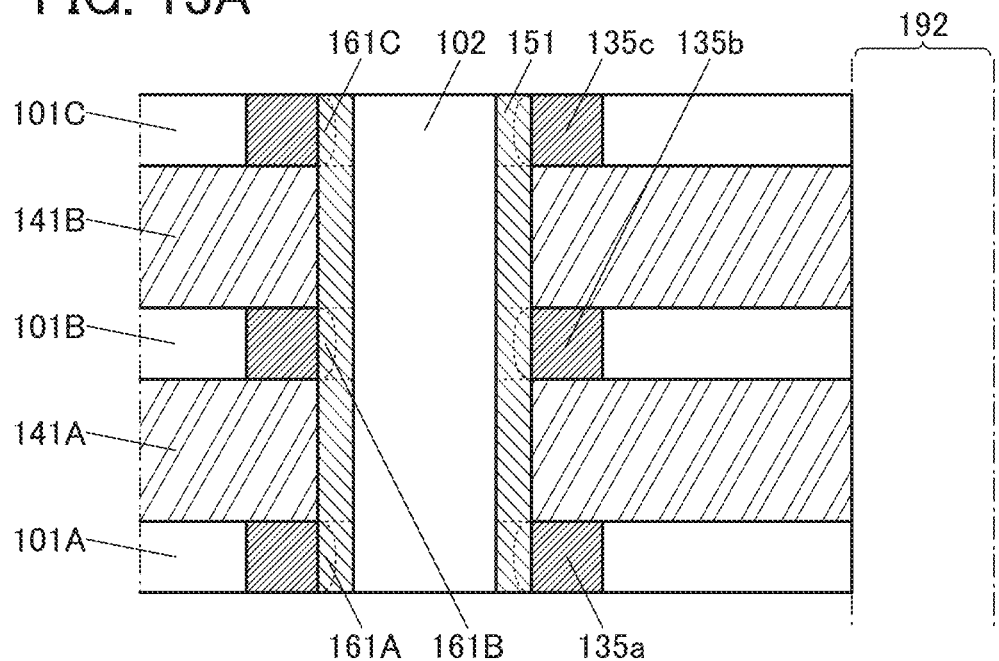
FIG. 13 Cross-sectional views for illustrating a manufacturing example of a semiconductor device.

In the next step, as illustrated in FIG. 13(A), resist mask formation and etching treatment, or the like are performed on the stack 100 to form a slit 192. Note that in this step, an opening may be formed instead of the slit.

Note that the description of FIG. 8(B) is referred to for the resist mask formation and the etching treatment, or the like.

Figure 13B:
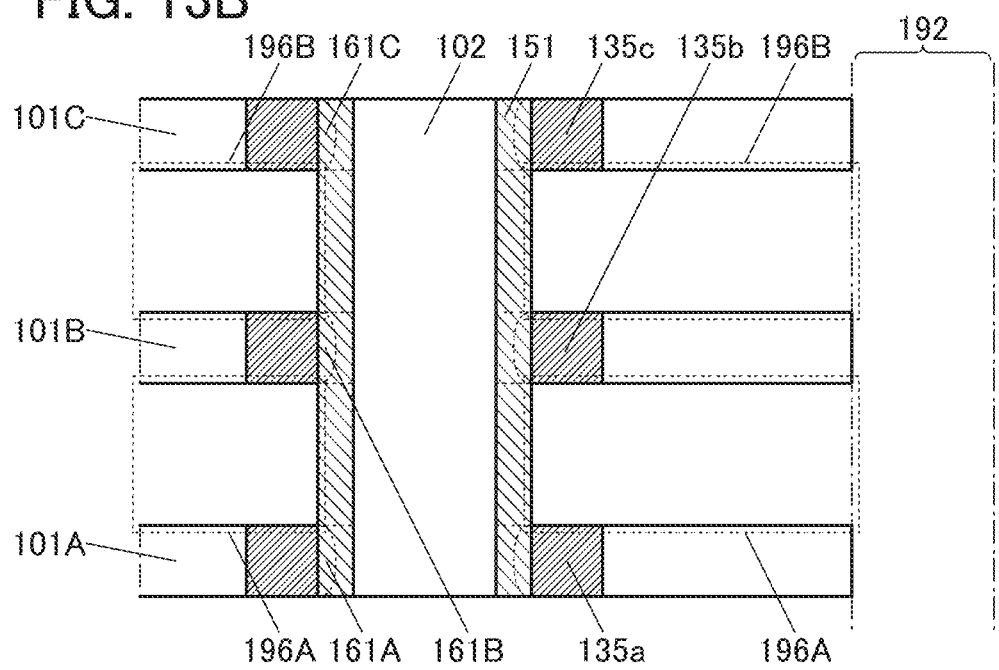

Then, in a step illustrated in FIG. 13(B), the sacrificial layer 141A and the sacrificial layer 141B are removed from the side surface of the slit 192 by etching treatment or the like, and a recess portion 196A and a recess portion 196B are formed in the stack 100.

Note that in some cases, the recess portion 196A and the recess portion 196B can be formed at the same time as the formation of the slit 192 at the stage of the manufacturing step of the semiconductor device, which is illustrated in FIG. 13(A).

Figure 14A:
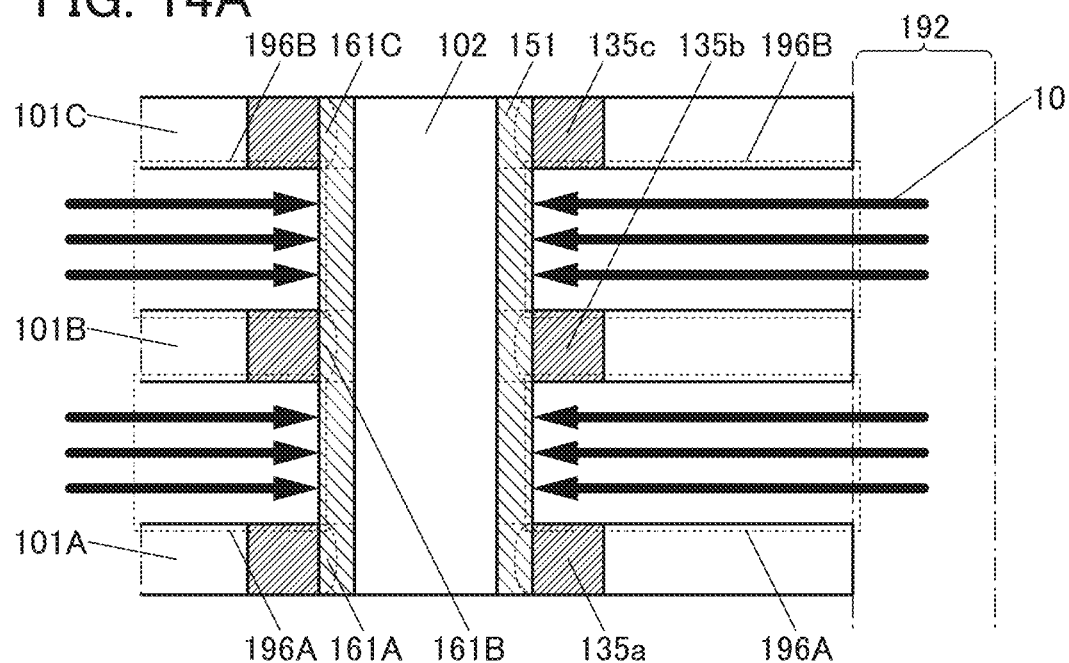
FIG. 14 A cross-sectional view and a perspective view for illustrating a manufacturing example of a semiconductor device.

In the case where a material containing silicon is used for the semiconductor 151, treatment for supplying an impurity from the slit 192 may be performed on the regions 151a of the semiconductor 151 which are exposed at the recess portion 196A and the recess portion 196B after the slit 192, the recess portion 196A, and the recess portion 196B are formed. FIG. 14(A) illustrates a step of performing impurity supply treatment 10 on the regions 151a. Note that heat treatment is preferably performed on the semiconductor device during the supply treatment 10. Note that in the case where the cell transistor CTr is an n-channel transistor, a p-type impurity (an acceptor) is used as the impurity so that the regions 151a of the semiconductor 151 each become a p-type channel formation region. As the p-type impurity, boron, aluminum, or gallium can be used, for example. Note that in the case where the cell transistor CTr is a p-channel transistor, an n-type impurity (a donor) is used as the impurity so that the regions 151a of the semiconductor 151 each become an n-type channel formation region. As the n-type impurity, phosphorus or arsenic can be used, for example.

In the case where a material containing a metal oxide is used for the semiconductor 151, treatment for supplying oxygen from the slit 192 may be performed on the regions 151a of the semiconductor 151 which are exposed at the recess portion 196A and the recess portion 196B after the slit 192, the recess portion 196A, and the recess portion 196B are formed. In that case, the supply treatment 10 illustrated in FIG. 14(A) is treatment for supplying oxygen. Examples of the treatment for supplying oxygen include plasma treatment containing oxygen in a reduced pressure and heat treatment in an oxygen atmosphere. As the plasma treatment containing oxygen, it is particularly preferable to use an apparatus including a power source for generating high-density plasma using microwaves, for example.

Figure 14B:
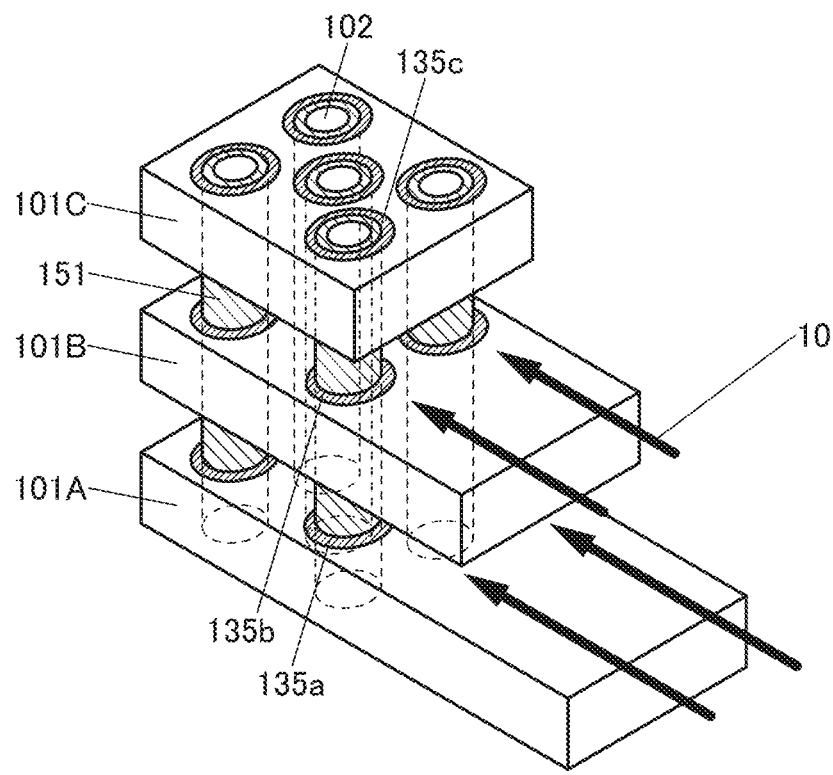

Alternatively, in the treatment for supplying an impurity, oxygen, or the like to the semiconductor 151 as described above, an impurity, oxygen, or the like may be supplied from a terminal extraction portion as illustrated in FIG. 14(B) instead of supply of an impurity, oxygen, or the like from the slit 192. FIG. 14(B) is a perspective view of the structure body illustrated in FIG. 14(A), and illustrates the middle of the manufacturing process of the semiconductor device illustrated in FIG. 6 or FIG. 7.

Figure 15A:
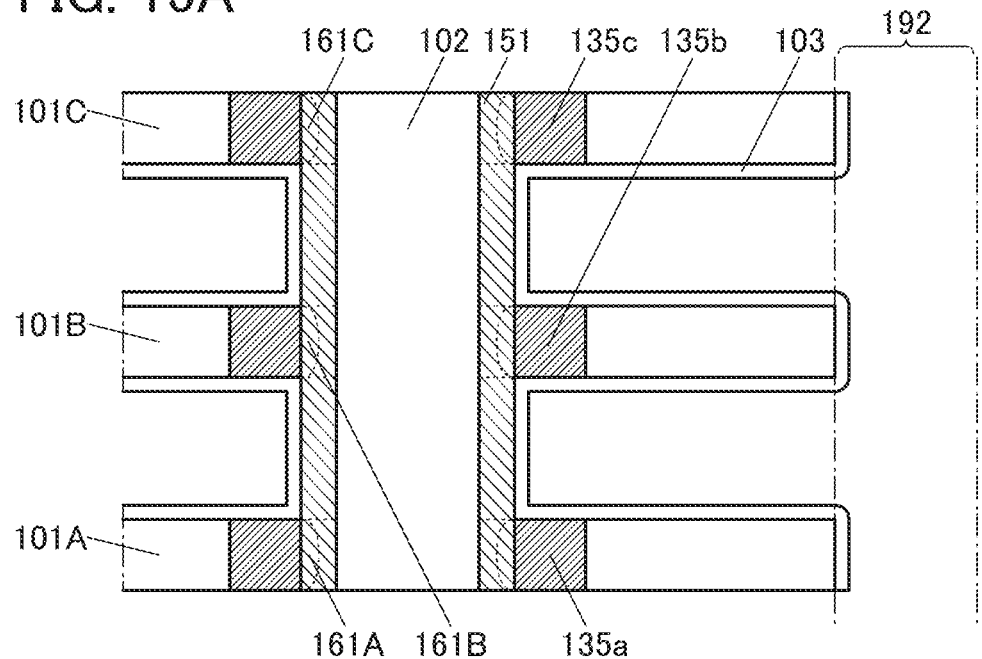
FIG. 15 Cross-sectional views for illustrating a manufacturing example of a semiconductor device.

In the next step, as illustrated in FIG. 15(A), an insulator 103 is deposited on the side surface of the slit 192 (each side surface of the insulator 101A to the insulator 101C) and in the recess portion 196A and the recess portion 196B illustrated in FIG. 13(B).

The insulator 103 functions as a tunnel insulating film of the cell transistor CTr.

It is preferable to use silicon oxide or silicon oxynitride for the insulator 103, for example. Alternatively, for the insulator 103, aluminum oxide, hafnium oxide, or an oxide containing aluminum and hafnium may be used, for example. The insulator 103 may be an insulator including a stack of any of the above.

In the case where the semiconductor 151 is a material containing a metal oxide, the insulator 103 can be an insulator in which the material usable for the insulator 102 is stacked on the above material. In particular, when, for the insulator 103, a material having a function of inhibiting transmission of oxygen or impurities such as water and hydrogen is used, diffusion of water or hydrogen into the semiconductor 151 and release of oxygen from the semiconductor 151 can be prevented in some cases.

Figure 15B:
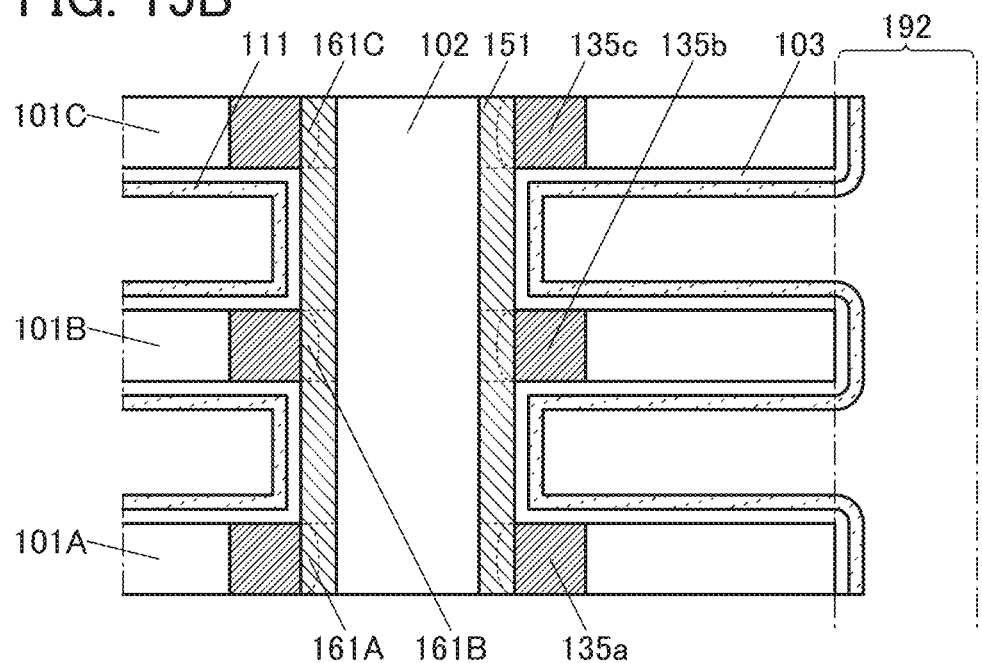

In the next step, as illustrated in FIG. 15(B), an insulator 111 is deposited on the side surface of the slit 192 and in the formed recess portions illustrated in FIG. 15(A). That is, the insulator 111 is formed on the formation surface of the insulator 103.

A region of the insulator 111 overlapping the region 151a of the semiconductor 151 with the insulator 103 therebetween functions as the charge accumulation layer of the cell transistor CTr.

It is possible to use silicon nitride or silicon nitride oxide for the insulator 111, for example. Note that a material usable for the insulator 111 is not limited thereto.

Figure 16A:
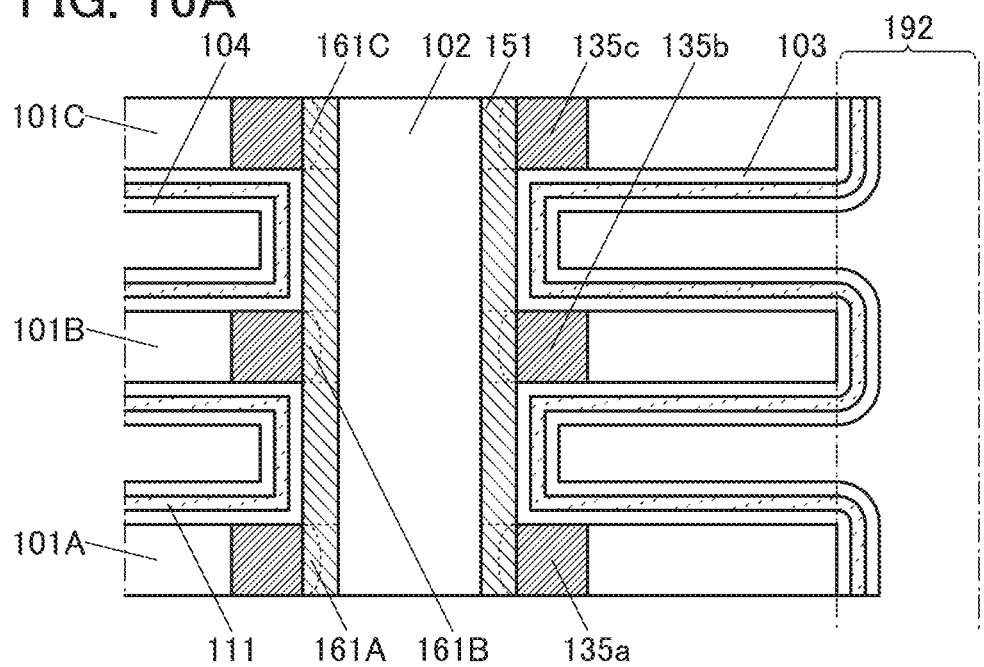
FIG. 16 Cross-sectional views for illustrating a manufacturing example of a semiconductor device.

In the next step, as illustrated in FIG. 16(A), an insulator 104 is deposited on the side surface of the slit 192 and in the formed recess portions illustrated in FIG. 15(A). That is, the insulator 104 is formed on the formation surface of the insulator 111.

The insulator 104 functions as a gate insulating film of the cell transistor CTr.

It is preferable to use silicon oxide or silicon oxynitride for the insulator 104, for example. Alternatively, for the insulator 104, aluminum oxide, hafnium oxide, or an oxide containing aluminum and hafnium may be used, for example. The insulator 104 may be an insulator including a stack of any of the above. The insulator 104 is preferably thicker than the insulator 103. When the insulator 104 is made thicker than the insulator 103, charge can be moved from the semiconductor 151 to the insulator 111 through the insulator 103.

Figure 16B:
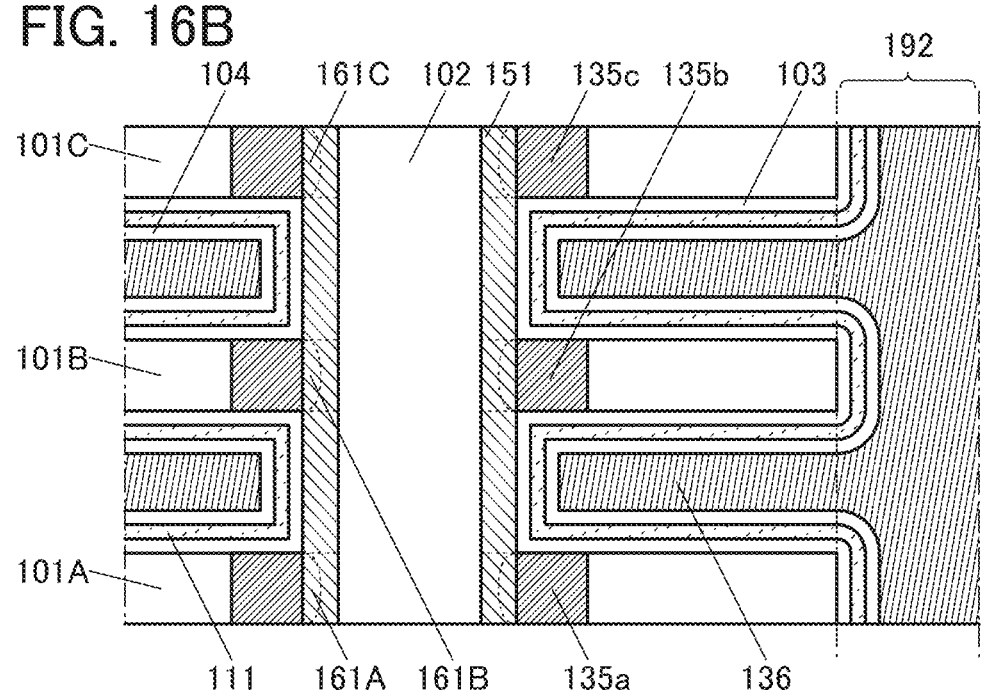

In the next step, as illustrated in FIG. 16(B), a conductor 136 is deposited on the side surface of the slit 192 and in the formed recess portions illustrated in FIG. 16(A). That is, conductor 136 is formed on the formation surface of the insulator 104.

For the conductor 136, any of the materials usable for the aforementioned conductor 134 can be used, for example.

Figure 17A:
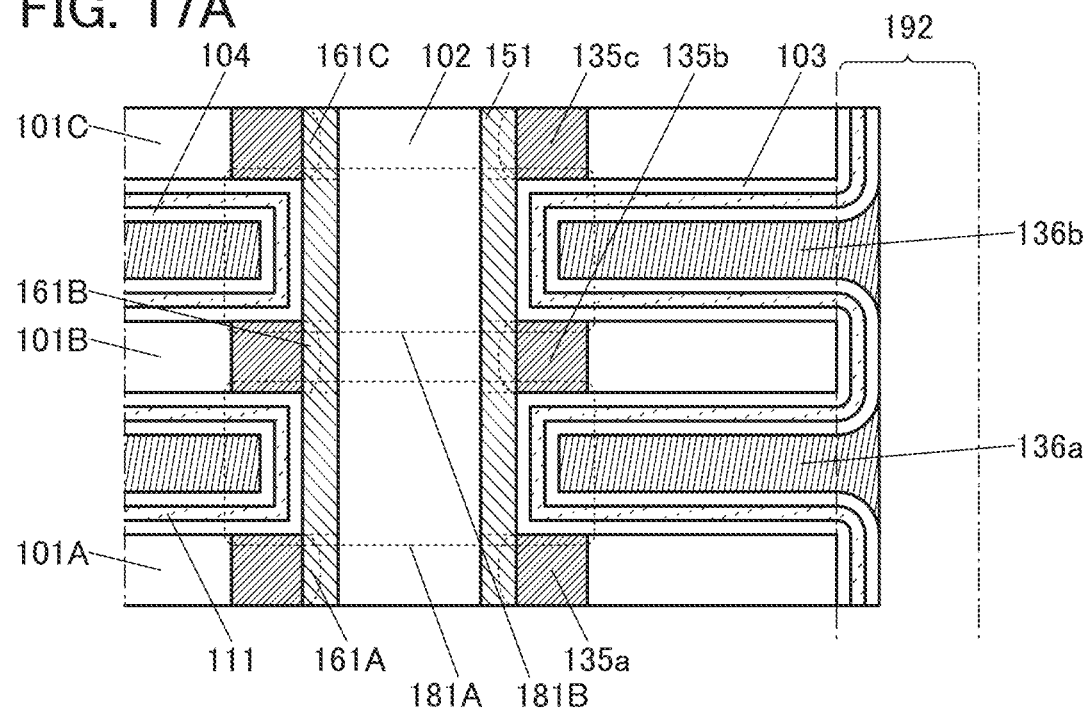
FIG. 17 Cross-sectional views for illustrating a manufacturing example of a semiconductor device.

In the next step, as illustrated in FIG. 17(A), the conductor 136 included in the slit 192 is removed by resist mask formation and etching treatment, or the like so that the conductor 136 remains only in the aforementioned recess portions. Thus, a conductor 136a and a conductor 136b are formed. Note that at this time, part of the insulator 104 may be removed as long as the insulator 111 is not exposed at the slit 192.

Note that the description of FIG. 8(B) is referred to for the resist mask formation and the etching treatment, or the like.

The conductor 136a (the conductor 136b) functions as the gate electrode of the cell transistor CTr and the wiring WL illustrated in FIGS. 1(A) and 1(B). That is, the cell transistor CTr is formed in a region 181A (a region 181B) illustrated in FIG. 17(A).

Figure 17B:
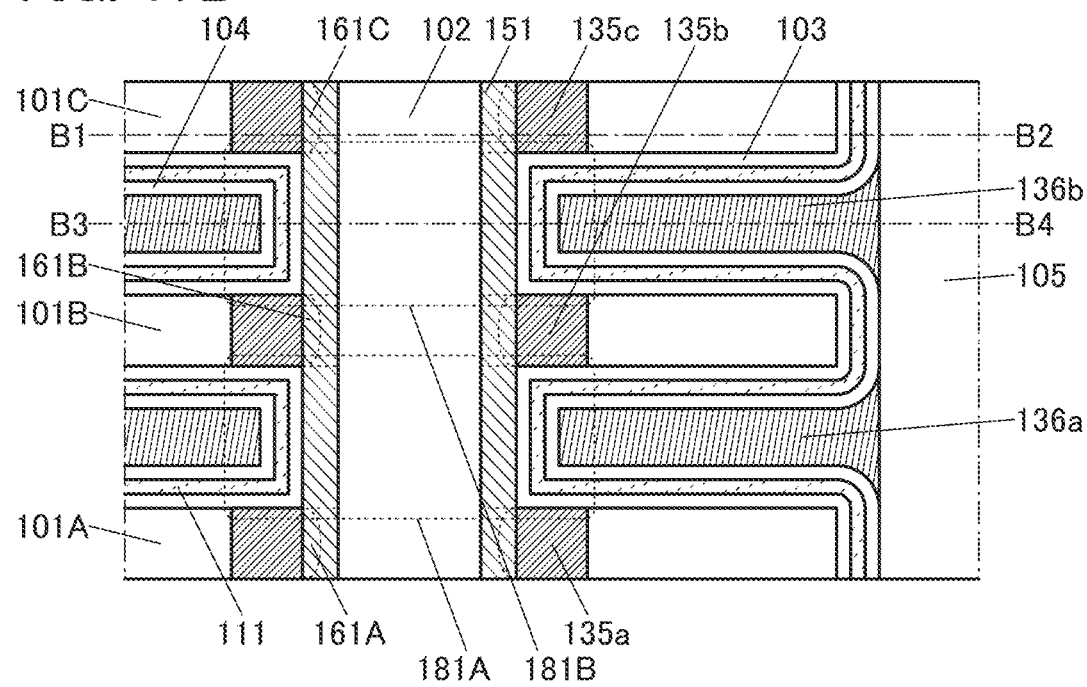

In the next step, as illustrated in FIG. 17(B), an insulator 105 is deposited to fill the slit 192.

Any of the above materials usable for the insulators 102 can be used for the insulator 105, for example.

As described above, the semiconductor device illustrated in FIG. 1(A) can be manufactured through the steps from FIG. 8(A) to FIG. 17(B).

Figure 18A:
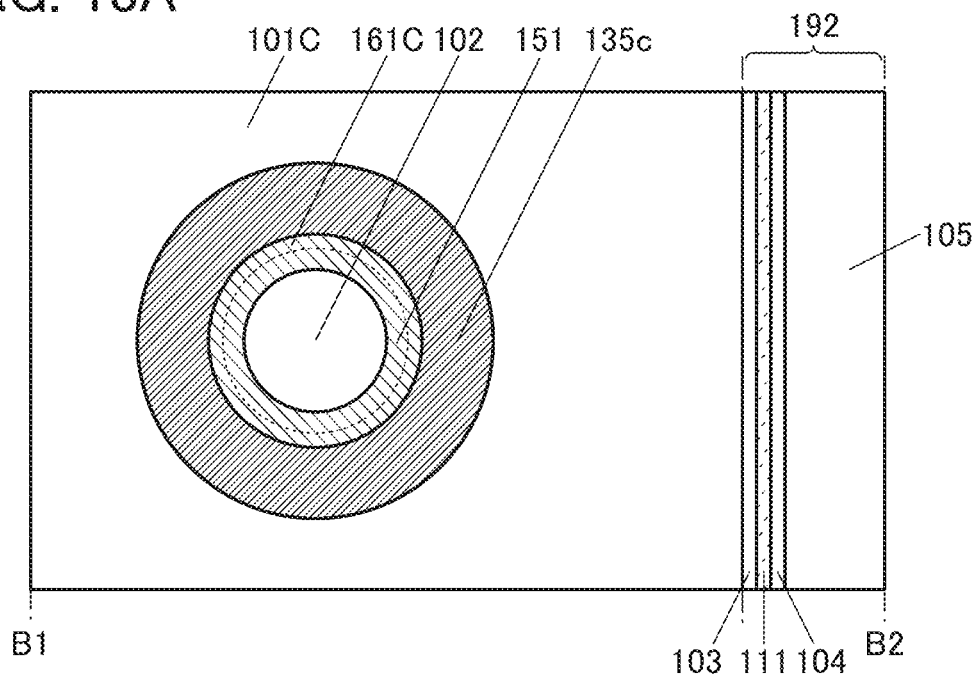
FIG. 18 Top views for illustrating a manufacturing example of a semiconductor device.
Figure 18B:
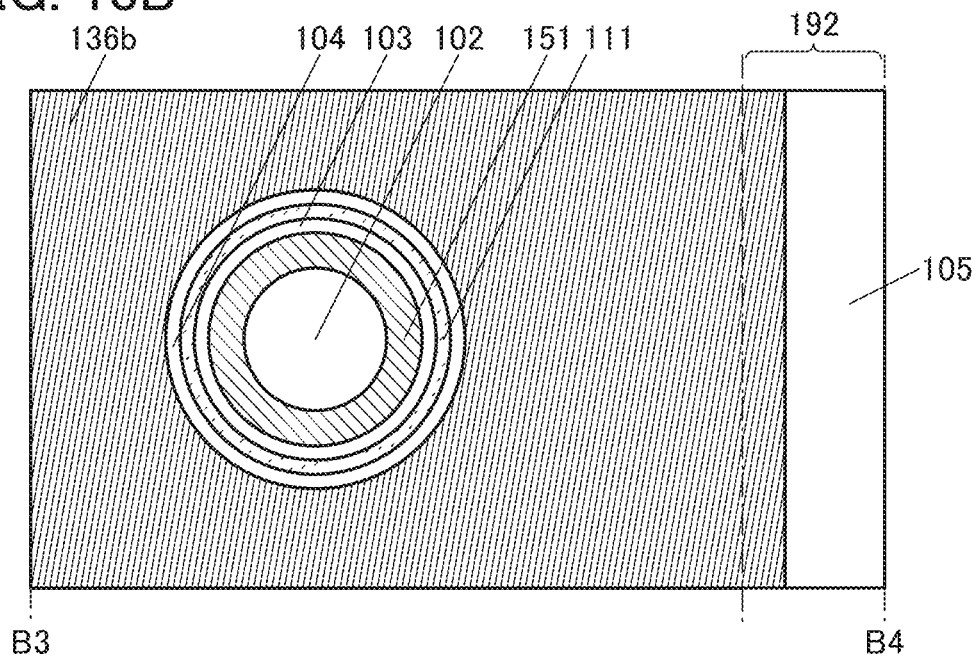
Figure 19A:
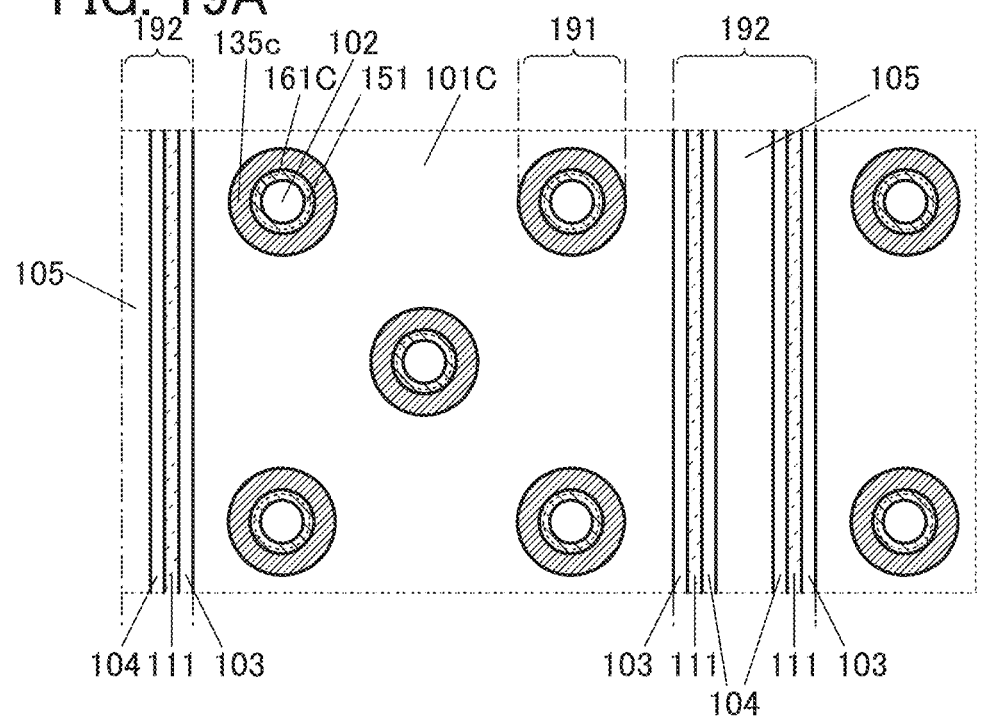
FIG. 19 Top views for illustrating a manufacturing example of a semiconductor device.
Figure 19B:
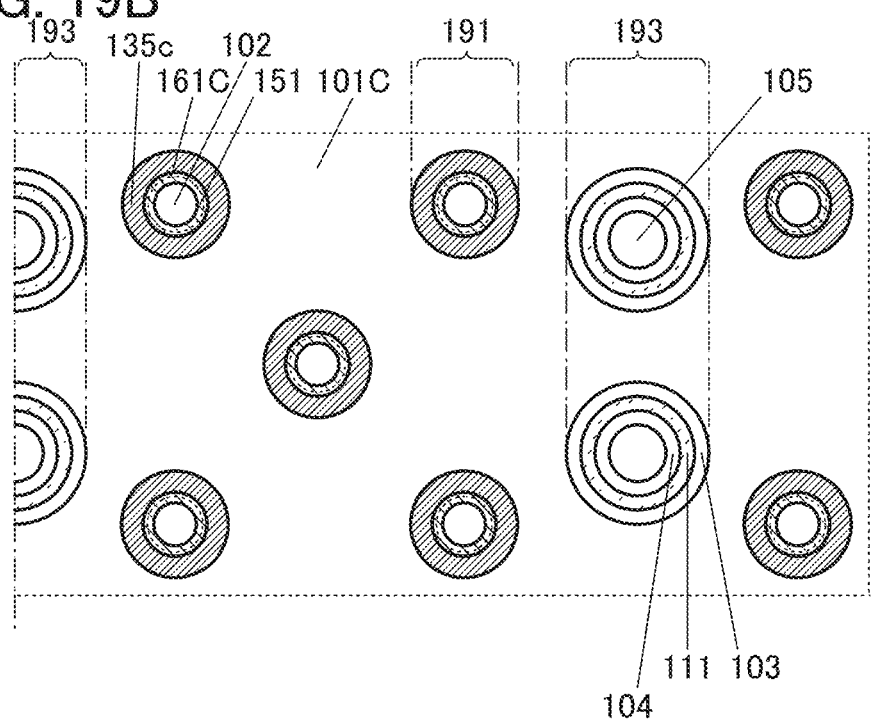

FIGS. 18(A) and 18(B) are top views of the semiconductor device illustrated in FIG. 17(B) along the dashed-dotted line B1-B2 and the dashed-dotted line B3-B4, respectively. FIG. 19(A) is a top view of the semiconductor device in the case of providing a plurality of openings 191 as in the structure example illustrated in FIG. 6. Note that this is a top view of the semiconductor device in FIG. 17(B) along the dashed-dotted line B1-B2, which is in the case of providing the plurality of openings 191. In the semiconductor device illustrated in FIG. 19(A), a plurality of slits 192 are included and the opening 191 is provided between adjacent slits 192. Note that an opening may be formed instead of the slit 192 as described in the step illustrated in FIG. 13. In FIG. 19(B), the opening 193 is provided instead of the slit 192, and the insulator 103 to the insulator 105 and the insulator 111 are formed in the opening 193. Note that the openings 193 may be provided along columns in two or more different directions instead of being provided along columns in one direction as in the slit 192 in FIG. 19(A). Alternatively, the openings 193 may be formed without the regularity as describe above.

One embodiment of the present invention is not limited to the structure example of the semiconductor device illustrated in FIG. 17(B). One embodiment of the present invention can have a structure which is changed as appropriate from that of the semiconductor device illustrated in FIG. 17(B) depending on the case, according to circumstances, or as needed.

For example, as described above, one embodiment of the present invention can also be a semiconductor device in which the cell transistor CTr is provided with a back gate as illustrated in FIG. 1(B). In the case of manufacturing the semiconductor device illustrated in FIG. 1(B), the step illustrated in FIG. 12 is performed instead of the step illustrated in FIG. 11(A) in the process of manufacturing the semiconductor device in FIG. 1(A). The semiconductor device illustrated in FIG. 20 can be constituted by performing the step illustrated in FIG. 12 instead of the step illustrated in FIG. 11(A).

Figure 20:
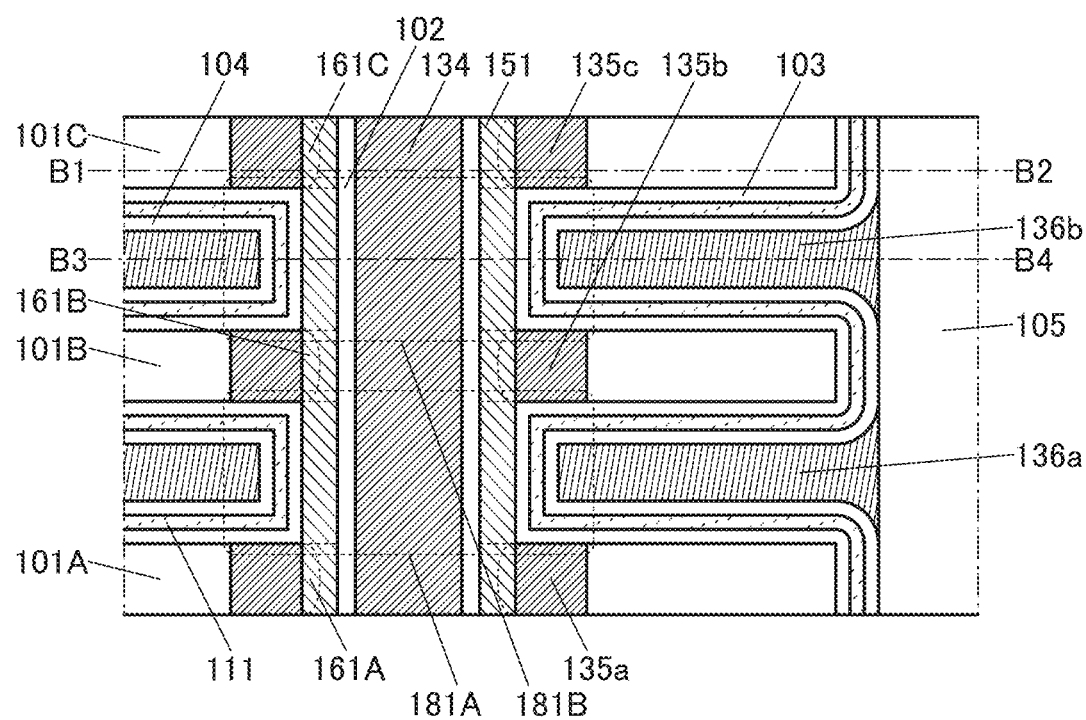
FIG. 20 A cross-sectional view for illustrating a manufacturing example of a semiconductor device.
Figure 21A:
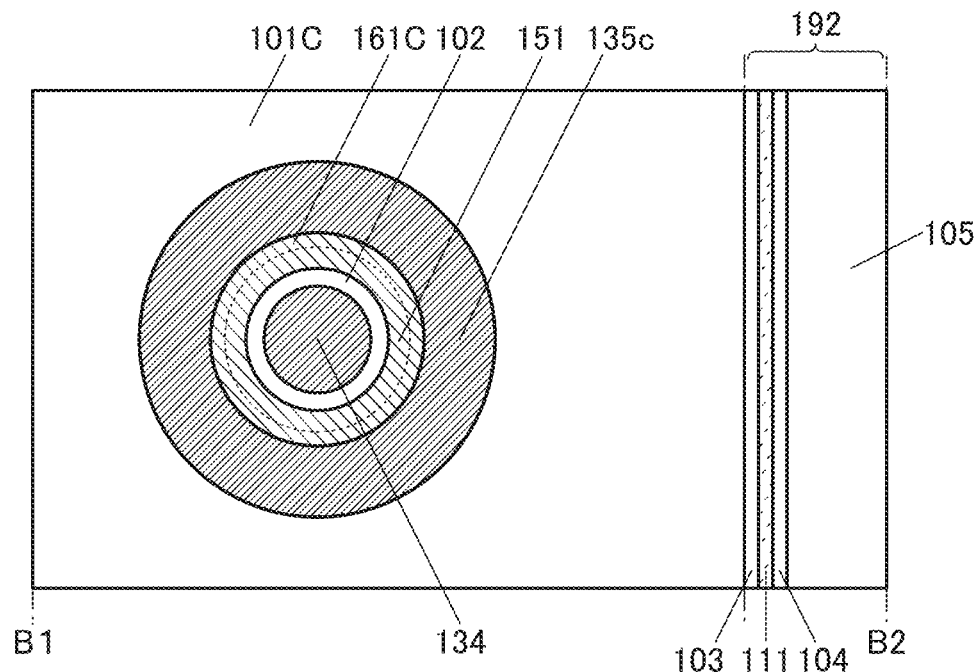
FIG. 21 Top views for illustrating a manufacturing example of a semiconductor device.
Figure 21B:
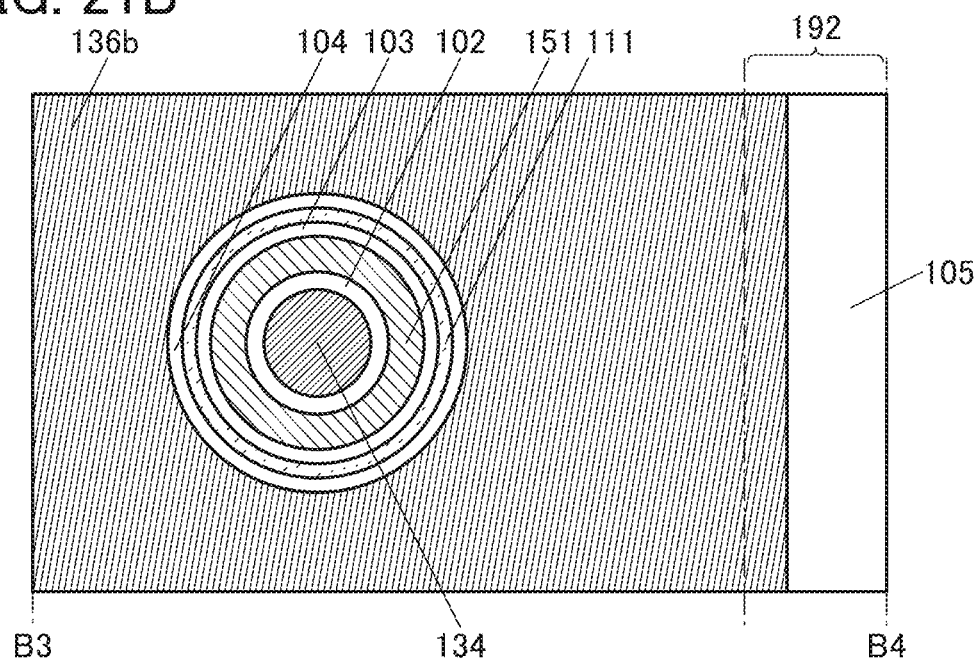

Note that FIGS. 21(A) and 21(B) are top views of the semiconductor device illustrated in FIG. 20 along the dashed-dotted line B1-B2 and the dashed-dotted line B3-B4, respectively. Since the semiconductor device illustrated in FIG. 20 is a structure example in which the conductor 134 is formed, the top views in FIGS. 21(A) and 21(B) have structures in which the conductor 134 is formed inside the insulator 102 illustrated in FIGS. 18(A) and 18(B), respectively.

Figure 22:
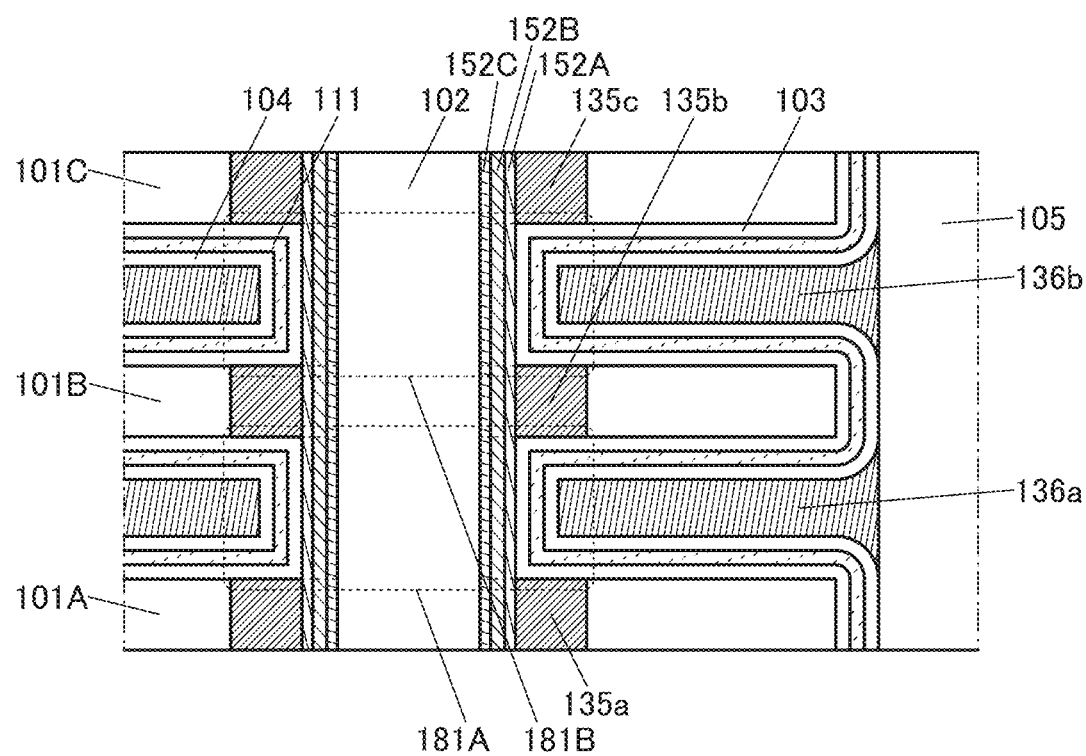
FIG. 22 A cross-sectional view for illustrating a manufacturing example of a semiconductor device.

In addition, for example, in the case where a material containing a metal oxide is used for the semiconductor 151, in one embodiment of the present invention, the semiconductor 151 can have a three-layer structure as in the semiconductor device illustrated in FIG. 22. In the semiconductor device illustrated in FIG. 22, the semiconductor 151 has a three-layer structure, and a semiconductor 152A, a semiconductor 152B, and a semiconductor 152C are sequentially formed as the semiconductor 151 by the step illustrated in FIG. 10(B) in the process of manufacturing the semiconductor device in FIG. 1(A).

Figure 23A:
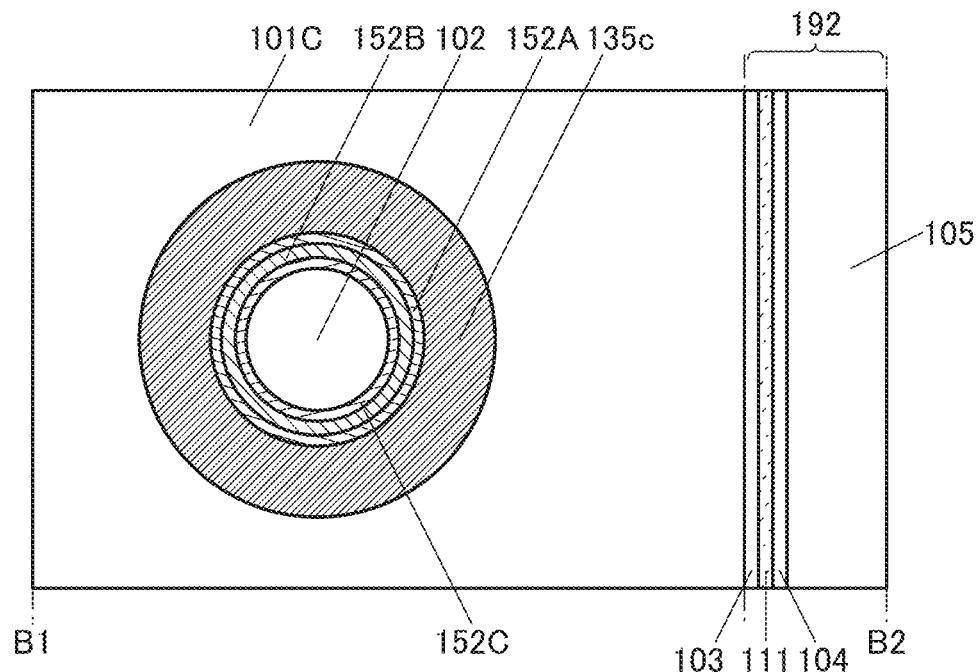
FIG. 23 Top views for illustrating a manufacturing example of a semiconductor device.
Figure 23B:
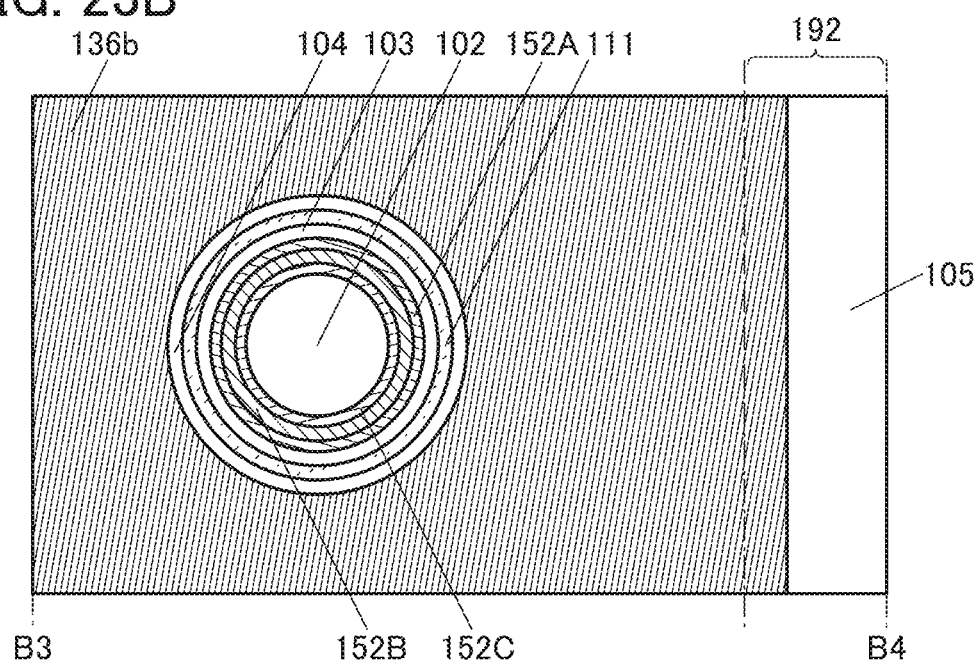

Note that FIGS. 23(A) and 23(B) are top views of the semiconductor device illustrated in FIG. 22 along the dashed-dotted line B1-B2 and the dashed-dotted line B3-B4, respectively. The semiconductor device illustrated in FIG. 22 is a structure example of the semiconductor layer having a three-layer structure obtained by sequential deposition of the semiconductor 152A, the semiconductor 152B, and the semiconductor 152C from the outer side; therefore, the top views in FIGS. 23(A) and 23(B) have structures in which the semiconductor 151 illustrated in FIGS. 18(A) and 18(B) have three-layer structures, respectively.

It is preferable that the semiconductor 152A be provided in contact with the insulator 103 and the conductor 135a (the conductor 135b, the conductor 135c) and the semiconductor 152C be provided in contact with the insulator 102. At this time, an oxide with a relatively wide energy gap compared to that of the semiconductor 152B is preferably used for the semiconductor 152A and the semiconductor 152C. Here, in some cases, an oxide with a wide energy gap is referred to as a wide gap, and an oxide with a narrow energy gap is referred to as a narrow gap.

In the case where the semiconductor 152A and the semiconductor 152C each have a narrow gap and the semiconductor 152B has a wide gap, the conduction band minimum energy of each of the semiconductor 152A and the semiconductor 152C is preferably higher than the conduction band minimum energy of the semiconductor 152B. In other words, the electron affinity of each of the semiconductor 152A and the semiconductor 152C is preferably less than the electron affinity of the semiconductor 152B.

A combination of materials containing metal elements with different atomic ratios is preferably used for the semiconductor 152A to the semiconductor 152C. Specifically, the atomic ratio of the element M to the other constituent elements in the metal oxide used for the semiconductor 152A and the semiconductor 152C is preferably higher than the atomic ratio of the element M to the constituent elements in the metal oxide used for the semiconductor 152B. Moreover, the atomic ratio of the element M to In in the metal oxide used for the semiconductor 152A and the semiconductor 152C is preferably higher than the atomic ratio of the element M to In in the metal oxide used for the semiconductor 152B. Moreover, the atomic ratio of In to the element M in the metal oxide used for the semiconductor 152B is preferably higher than the atomic ratio of In to the element M in the metal oxide used for the semiconductor 152A and the semiconductor 152C.

For the semiconductor 152A and the semiconductor 152C, a metal oxide with a composition of or close to In:Ga:Zn=1:3:4, In:Ga:Zn=1:3:2, or In:Ga:Zn=1:1:1 can be used, for example. For the semiconductor 152B, a metal oxide with a composition of or close to In:Ga:Zn=4:2:3 to 4:2:4.1, In:Ga:Zn=1:1:1, or In:Ga:Zn=5:1:6 can be used, for example. These semiconductor 152A to semiconductor 152C are preferably used in combination to satisfy the above relation of the atomic ratios. For example, it is preferable that a metal oxide with a composition of or close to In:Ga:Zn=1:3:4 be used for the semiconductor 152A and the semiconductor 152C and a metal oxide with a composition of or close to In:Ga:Zn=4:2:3 to 4:2:4.1 be used for the semiconductor 152B. Note that the above composition represents the atomic ratio of an oxide formed over a base or the atomic ratio of a sputtering target.

In addition, a CAAC-OS and a CAC-OS which will be described later are preferably used for the semiconductor 152A and the semiconductor 152B, respectively. In the case where the CAAC-OS is used for the semiconductor 152A and the semiconductor 152C, the c-axis is preferably aligned perpendicularly to the formation surfaces of the semiconductor 152A and the semiconductor 152C in FIG. 22.

Here, the conduction band minimum varies gradually at a junction portion of the semiconductor 152A (the semiconductor 152C) and the semiconductor 152B. In other words, the conduction band minimum at the junction portion of the semiconductor 152A (the semiconductor 152C) and the semiconductor 152B varies continuously or is continuously connected. To obtain such a structure, the density of defect states in a mixed layer formed at an interface between the semiconductor 152A (the semiconductor 152C) and the semiconductor 152B is preferably made low.

Specifically, when the semiconductor 152A (the semiconductor 152C) and the semiconductor 152B contain the same element (as a main component) in addition to oxygen, a mixed layer with a low density of defect states can be formed. For example, in the case where the semiconductor 152B is an In—Ga—Zn oxide, it is preferable to use an In—Ga—Zn oxide, a Ga—Zn oxide, gallium oxide, or the like as the semiconductor 152A (the semiconductor 152C). Accordingly, the density of defect states at the interface between the semiconductor 152A and the semiconductor 152B can be reduced. Thus, the influence of interface scattering on carrier conduction becomes small, and the cell transistor can have a high on-state current in some cases.

Note that in the semiconductor device illustrated in FIG. 22, the three-layer structure of the semiconductor 151 in FIG. 17(B) is used; alternatively, a two-layer structure or a structure including four or more layers may be employed.

In the semiconductor device illustrated in FIG. 17(B), the structure in which the insulator 111 is deposited on the entire formation surface of the insulator 103 is used, for example; alternatively, in one embodiment of the present invention, the insulator 111 can be divided into the charge accumulation layers included in each of the cell transistors CTr. FIG. 24(A) illustrates a step of removing the insulator 111 included in the slit 192 by resist mask formation and etching treatment, or the like after the step illustrated in FIG. 15(B) so that the insulator 111 remains only on the formation surface of the insulator 103 in the aforementioned recess portion 196A and recess portion 196B. Alternatively, in the step of removing the insulator 111, regions of the insulator 103 which are exposed at the slit 192 may also be removed as illustrated in FIG. 24(B) depending on the case or according to circumstances. After the step in FIG. 24(A), steps similar to those in from FIG. 16(A) to FIG. 17(B) are performed, whereby a semiconductor device illustrated in FIG. 25(A) can be constituted.

Figure 25A:
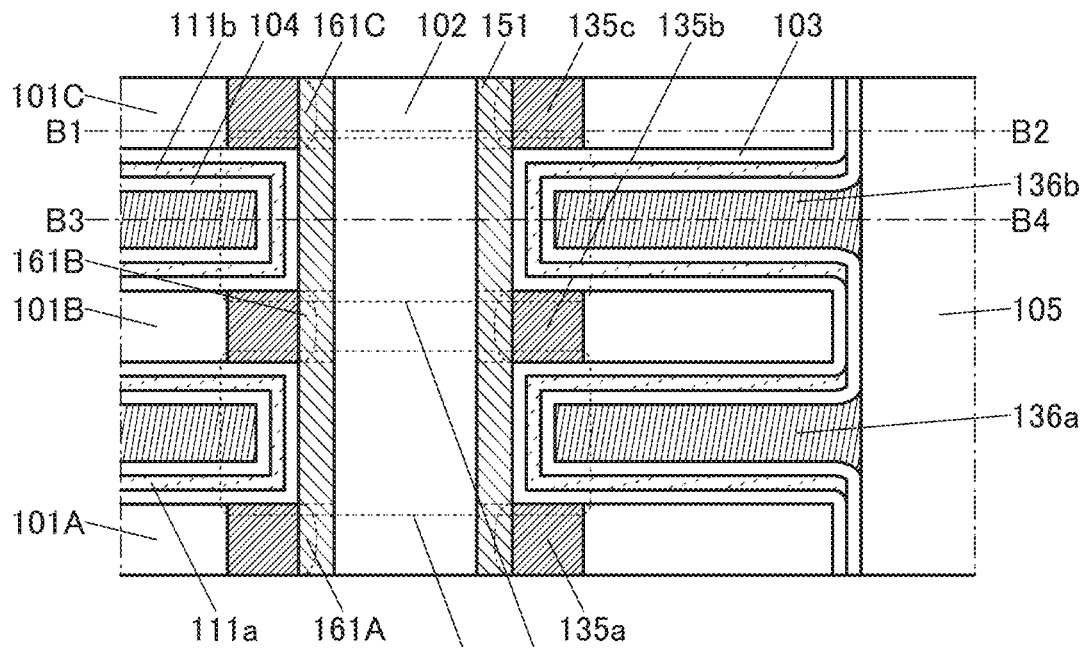
FIG. 25 A cross-sectional view and a top view for illustrating a manufacturing example of a semiconductor device.
Figure 25B:
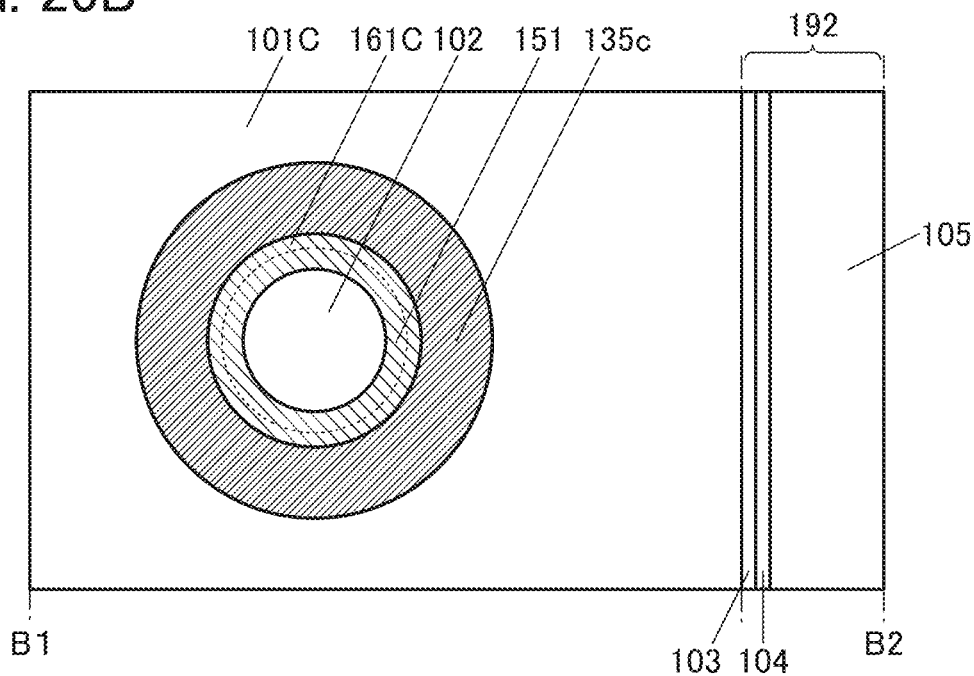

Note that FIG. 25(B) is a top view of the semiconductor device illustrated in FIG. 25(A) along the dashed-dotted line B1-B2. In the semiconductor device illustrated in FIG. 25(A), the insulator 111 in a region that overlaps the region 151a of the semiconductor 151 with the conductor 135a (the conductor 135b, the conductor 135c) therebetween has been removed; hence, the top view of FIG. 25(B) illustrates a structure without the insulator 111 between the insulator 103 and the insulator 104, which is illustrated in the top view in FIG. 18(B). The top view in FIG. 25(A) along the dashed-dotted line B3-B4 is in some cases approximately the same as that in FIG. 18(B).

Figure 26A:
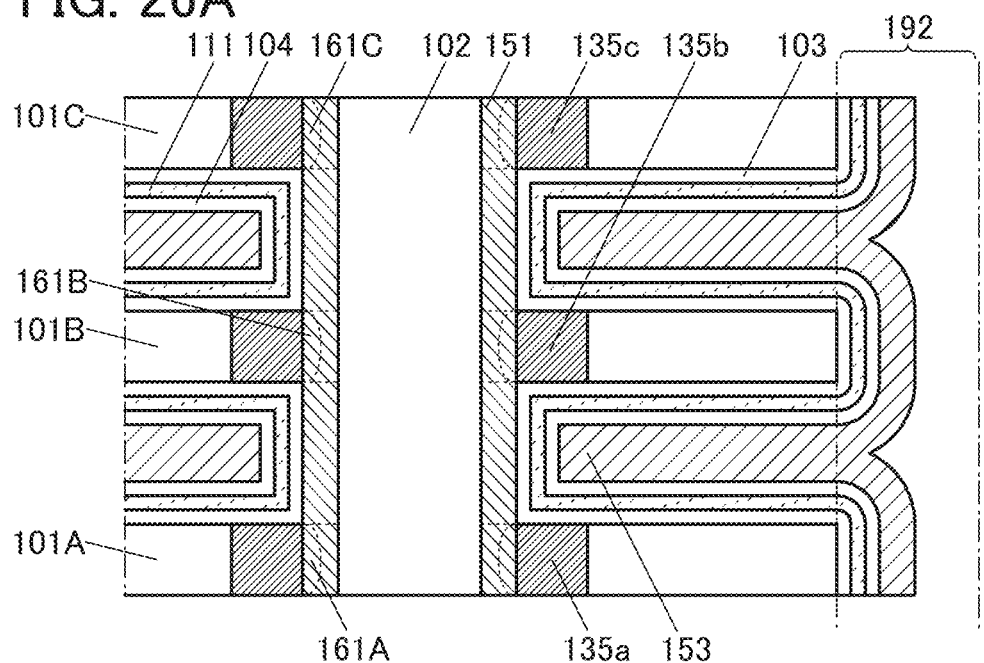
FIG. 26 Cross-sectional views for illustrating a manufacturing example of a semiconductor device.
Figure 26B:
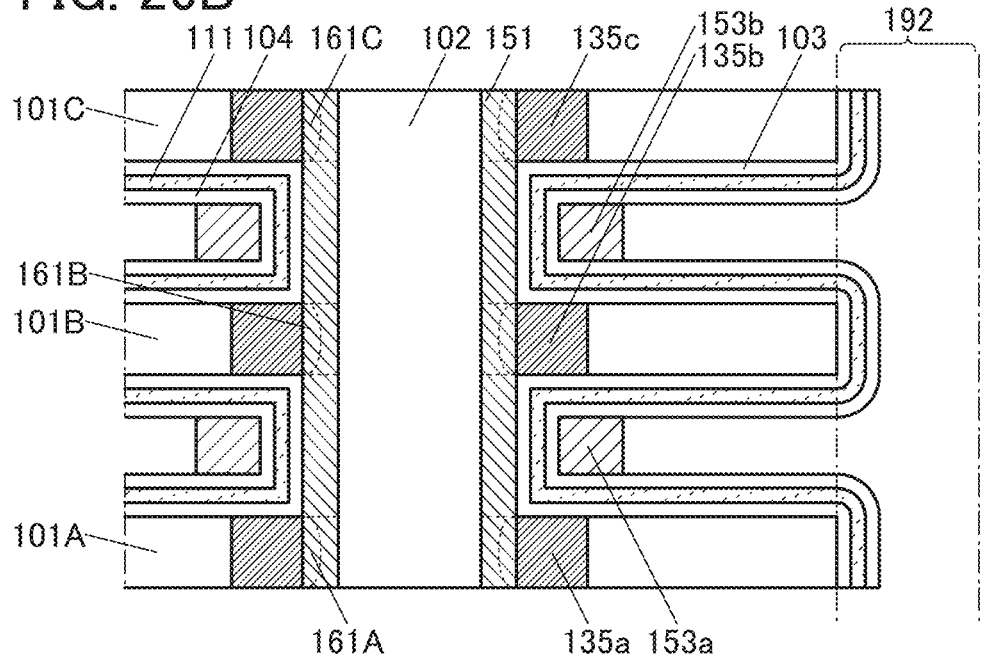
Figure 27A:
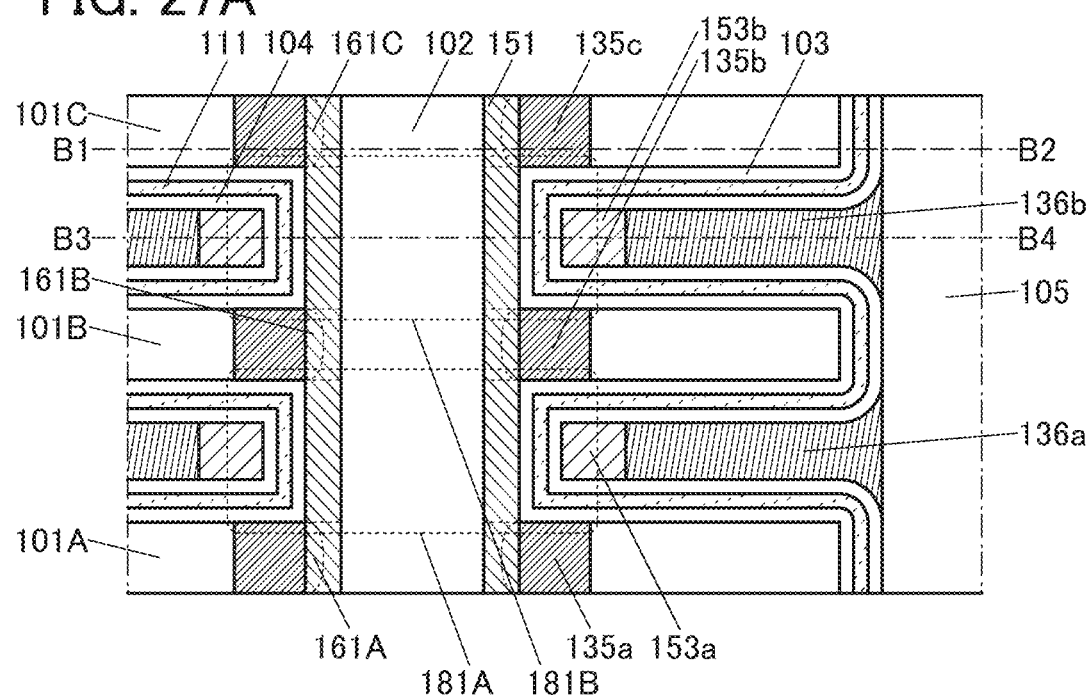
FIG. 27 A cross-sectional view and a top view for illustrating a manufacturing example of a semiconductor device.

For example, in one embodiment of the present invention, the structure of the gate electrode of the cell transistor CTr may be changed from the structure illustrated in FIG. 17(B) in order to improve the reliability of the cell transistor CTr. FIGS. 26(A) and 26(B) and FIG. 27(A) show an example of a method for manufacturing such a semiconductor device. In FIG. 26(A), a semiconductor 153 is deposited on the formation surface of the insulator 104 which is deposited on the side surface of the slit 192 and in the recess portion 196A and the recess portion 196B in FIG. 16(A).

For the semiconductor 153, a material containing a metal oxide which will be described in Embodiment 3 is used, for example. Note that a material usable for the semiconductor 153 is not limited thereto. For example, a material other than a metal oxide can be used for the semiconductor 153 in some cases. Alternatively, for example, a conductor or an insulator can be used as an alternative to the semiconductor 153 in some cases.

In the next step, as illustrated in FIG. 26(B), part of the remaining semiconductor 153 in the aforementioned recess portion 196A and recess portion 196B and the semiconductor 153 included in the slit 192 are removed by resist mask formation and etching treatment, or the like so that the semiconductor 153 remains in part of the recess portion 196A and the recess portion 196B. Thus, a semiconductor 153a and a semiconductor 153b are formed.

Note that the description of FIG. 8(B) is referred to for the resist mask formation and the etching treatment, or the like.

Subsequently, steps similar to those in from FIG. 16(B) to FIG. 17(B) are performed, whereby a semiconductor device illustrated in FIG. 27(A) can be constituted.

Figure 27B:
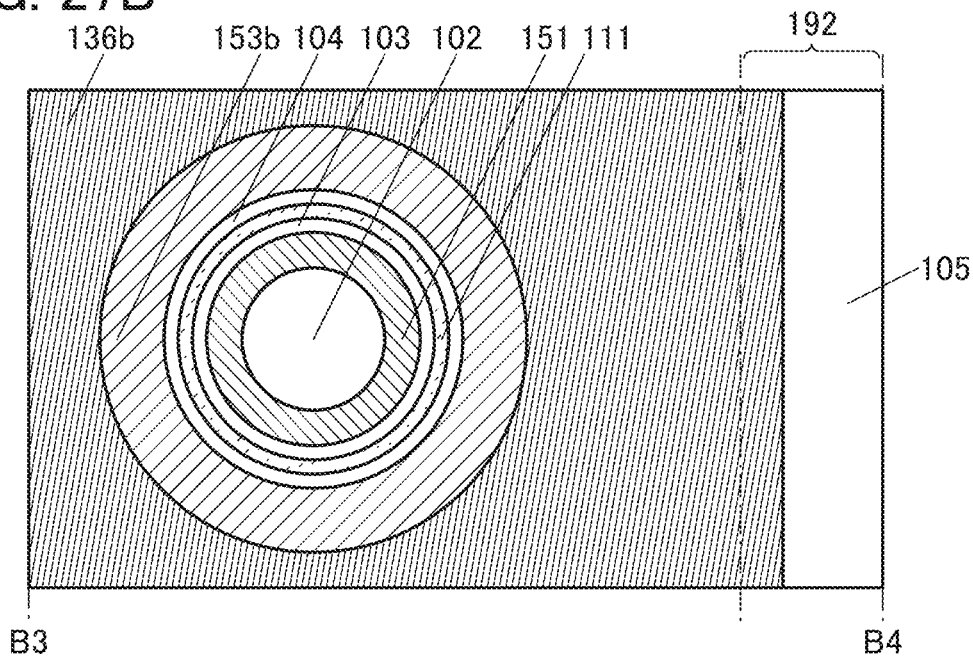

Note that FIG. 27(B) is a top view of the semiconductor device in FIG. 27(A) along the dashed-dotted line B3-B4. In the semiconductor device illustrated in FIG. 27(A), the semiconductor 153a (the semiconductor 153b) is included between the conductor 136a (the conductor 136b) and the insulator 104 in the region 151a of the semiconductor 151; hence, the top view in FIG. 27(B) illustrates a structure in which the semiconductor 153b is included between the conductor 136b and the insulator 104. The top view in FIG. 27(A) along the dashed-dotted line B1-B2 is in some cases approximately the same as that in FIG. 18(A).

Since the semiconductor 153a (the semiconductor 153b) is in contact with the insulator 104, impurities such as hydrogen and water contained in the insulator 104 are sometimes diffused into the semiconductor 153a (the semiconductor 153b). In addition, since the semiconductor 153a (the semiconductor 153b) is in contact with the conductor 136a (the conductor 136b), impurities such as hydrogen and water contained in the conductor 136a (the conductor 136b) are sometimes diffused into the semiconductor 153a (the semiconductor 153b). That is, the semiconductor 153a (the semiconductor 153b) has a function of capturing impurities such as hydrogen and water in some cases. Thus, the resistance of the semiconductor 153a (the semiconductor 153b) is reduced, and the semiconductor 153a (the semiconductor 153b) can function as the gate electrode of the cell transistor CTr. In other words, in the semiconductor device illustrated in FIG. 27(A), the semiconductor 153a (the semiconductor 153b) captures surrounding impurities such as hydrogen and water, whereby the reliability of the cell transistor CTr can be increased.

Figure 28A:
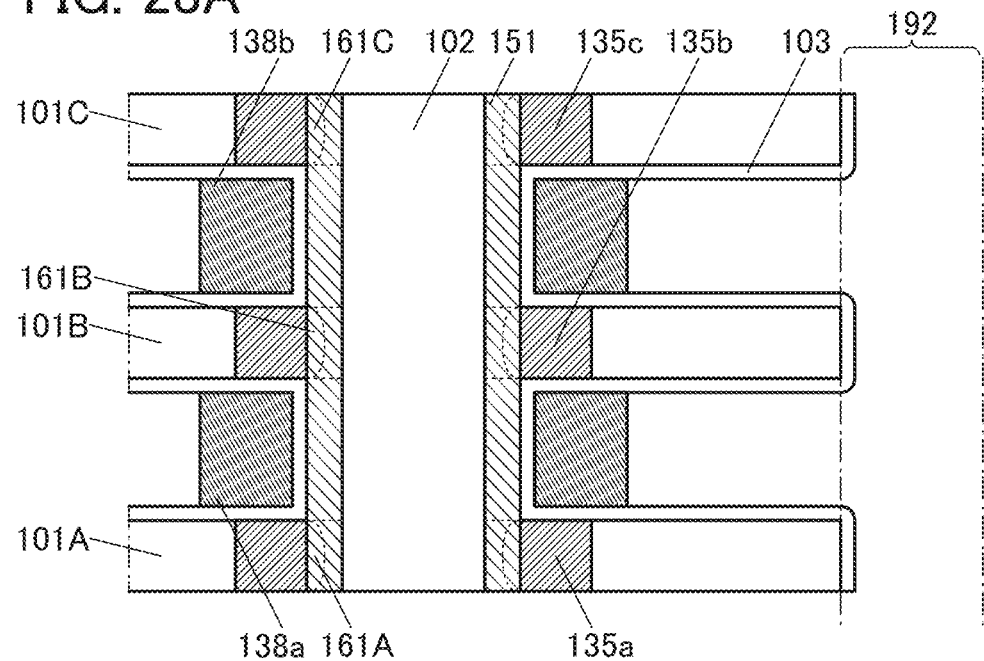
FIG. 28 Cross-sectional views for illustrating a manufacturing example of a semiconductor device.
Figure 28B:
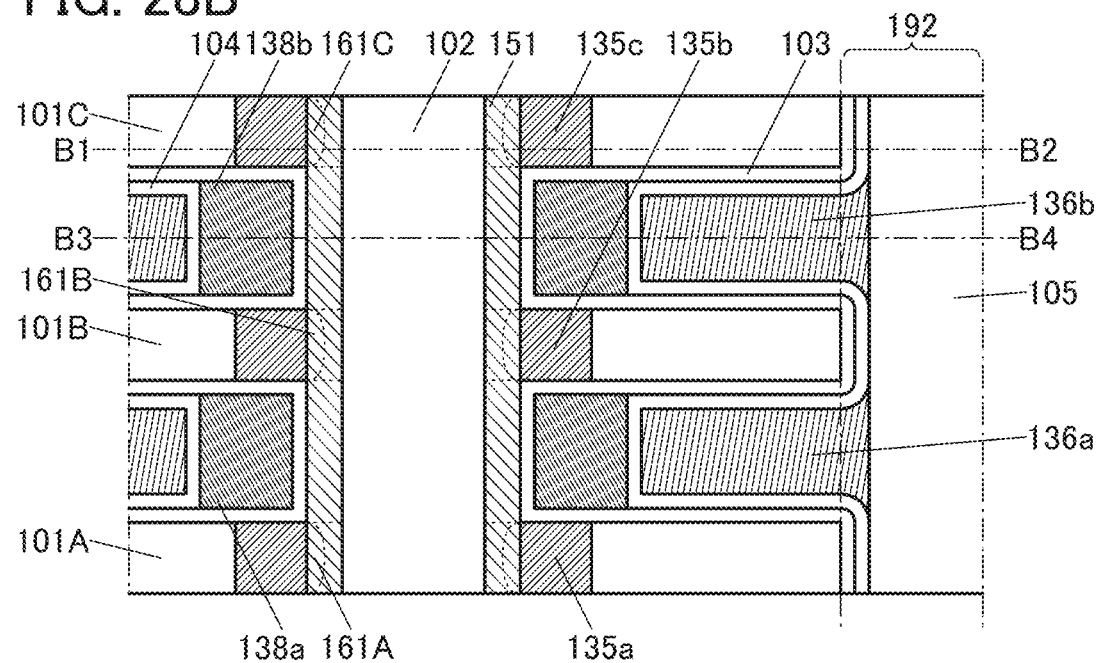

For example, in one embodiment of the present invention, a floating gate may be used instead of the insulator 111 usable for the charge accumulation layer. FIGS. 28(A) and 28(B) show an example of a manufacturing method thereof. In FIG. 28(A), a conductor 138a and a conductor 138b are formed in part of the recess portion 196A and part of the recess portion 196B, respectively, in FIG. 15. As a method for forming the conductor 138a and the conductor 138b, a conductive material to be the conductor 138a and the conductor 138b is deposited in the slit 192, the recess portion 196A, and the recess portion 196B and is then removed by resist mask formation and etching treatment, or the like so that the conductor 138a and the conductor 138b remain in part of the recess portion 196A and part of the recess portion 196B, respectively. After that, steps from the step of depositing the insulator 104 illustrated in FIG. 16(A) to the step of depositing the insulator 105 illustrated in FIG. 17(B) are similarly performed, whereby the semiconductor device illustrated in FIG. 28(B) can be constituted.

Figure 29:
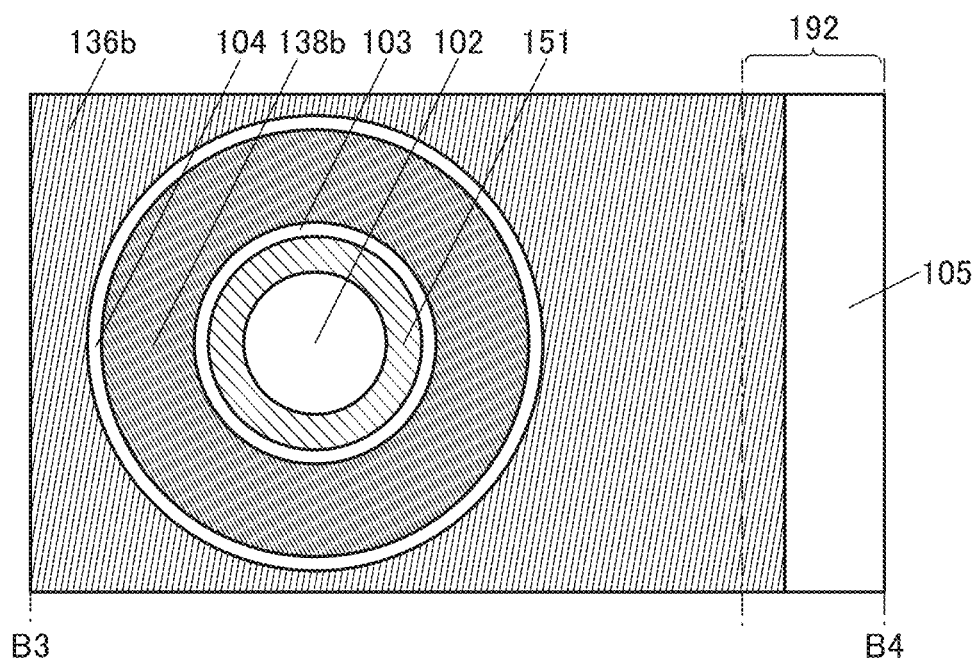
FIG. 29 A top view for illustrating a manufacturing example of a semiconductor device.

Note that FIG. 29 is a top view of the semiconductor device illustrated in FIG. 28(B) along the dashed-dotted line B3-B4. In the semiconductor device illustrated in FIG. 28(B), the conductor 138a (the conductor 138b) is included between the insulator 103 and the insulator 104 in a region that overlaps the region 151a of the semiconductor 151; hence, the top view in FIG. 29 illustrates a structure in which the conductor 138b is included between the insulator 103 and the insulator 104. The top view in FIG. 28(B) along the dashed-dotted line B1-B2 is in some cases approximately the same as that in FIG. 25(B).

For the conductor 138a and/or the conductor 138b, any of the materials usable for the aforementioned conductor 136 can be used, for example. Note that a material usable for the conductor 138a and/or the conductor 138b is not limited thereto. An insulator, a semiconductor, or the like can be used as an alternative to the conductor 138a and/or the conductor 138b in some cases.

Figure 30A:
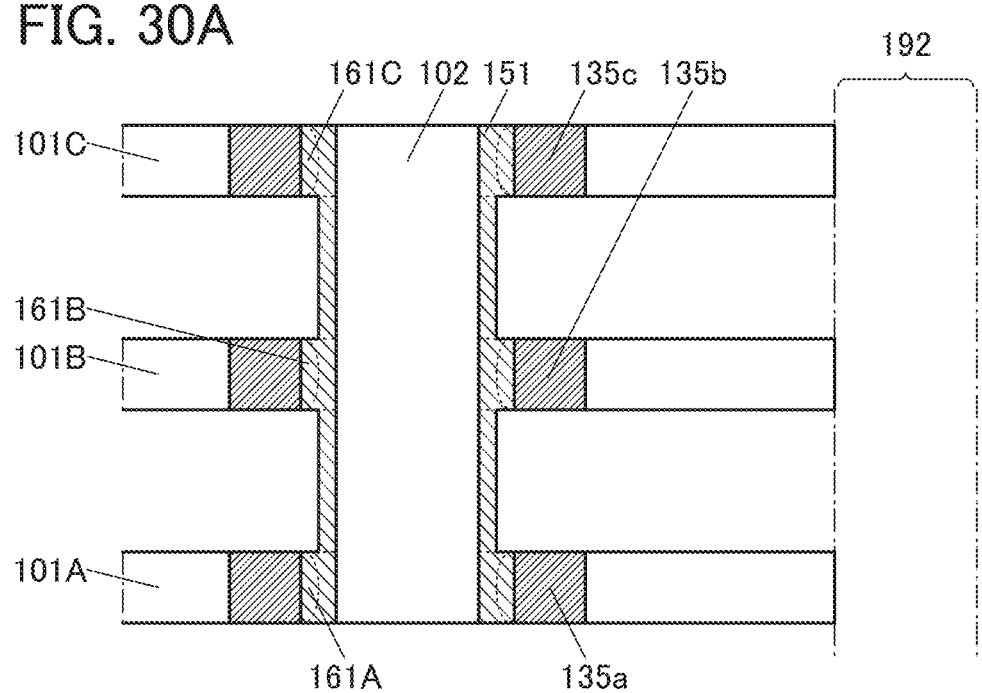
FIG. 30 Cross-sectional views for illustrating a manufacturing example of a semiconductor device.
Figure 30B:
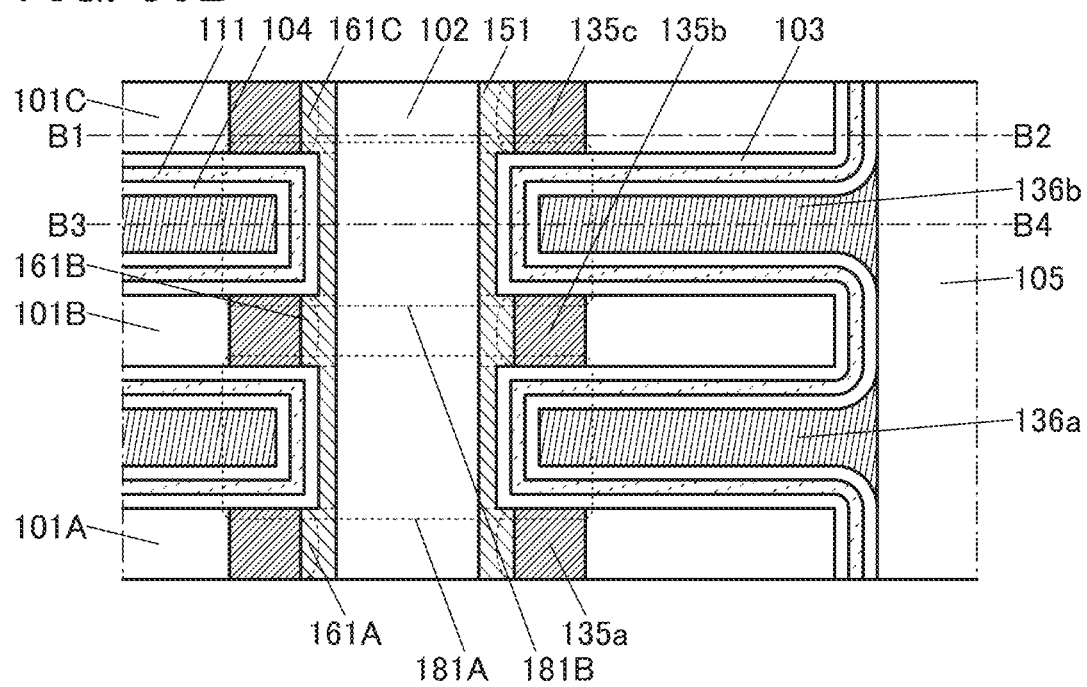

In addition, in one embodiment of the present invention, a structure in which the thickness of the channel formation region of the cell transistor CTr is reduced can be employed, for example. FIGS. 30(A) and 30(B) show an example of a method for manufacturing such a semiconductor device. In FIG. 30(A), after the sacrificial layer 141A and the sacrificial layer 141B are removed in FIG. 13(B), the surface of the semiconductor 151 is removed by etching treatment or the like. Accordingly, the thickness of the semiconductor 151 included in the region 151a gets smaller than the thickness of the semiconductor 151 included in the region 151b. This step is effective in the case where an impurity region is formed on the surface of the semiconductor 151, and the above step enables the impurity region to be removed; accordingly, the region 151a of the semiconductor 151 can have higher resistance.

The thickness of the semiconductor 151 which is removed in the region 151a may also be, for example, 30 nm or more and 60 nm or less of the deposited semiconductor 151, ⅕ or more and ½ or less the thickness of the deposited semiconductor 151, ⅕ or more and ½ or less the thickness of the insulator 103 which is deposited later, or ⅕ or more and ½ or less the thickness of the conductor 135a (the conductor 135b, the conductor 135c). Note that the thickness of the deposited semiconductor 151 is at least larger than the thickness of the semiconductor 151 which is removed in the region 151a. Subsequently, steps similar to those in from FIG. 15(A) to FIG. 17(B) are performed, whereby a semiconductor device illustrated in FIG. 30(B) can be constituted.

Figure 31A:
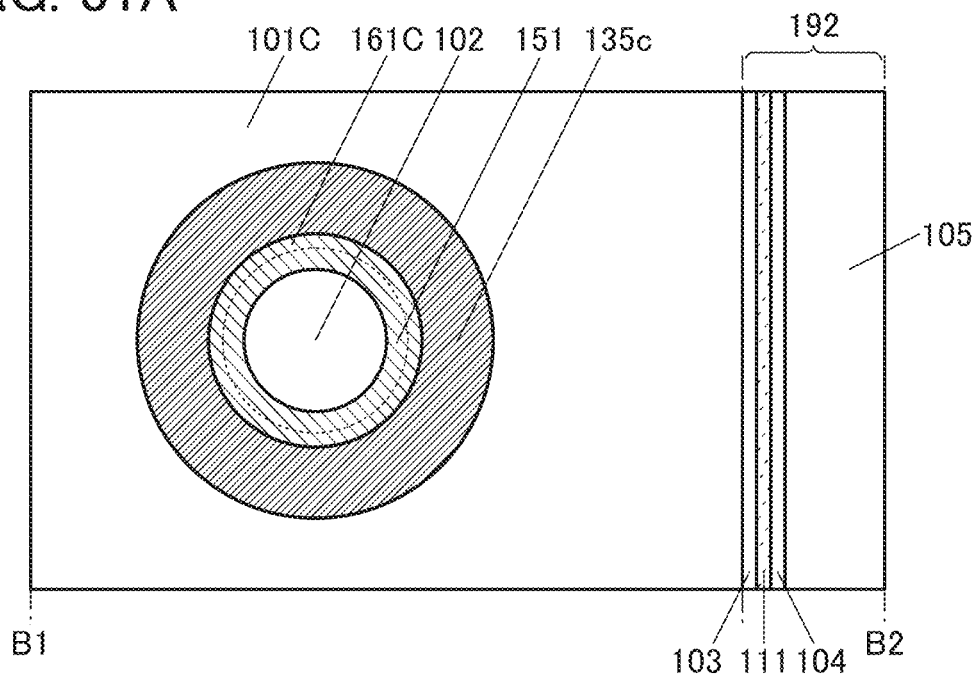
FIG. 31 Top views for illustrating a manufacturing example of a semiconductor device.
Figure 31B:
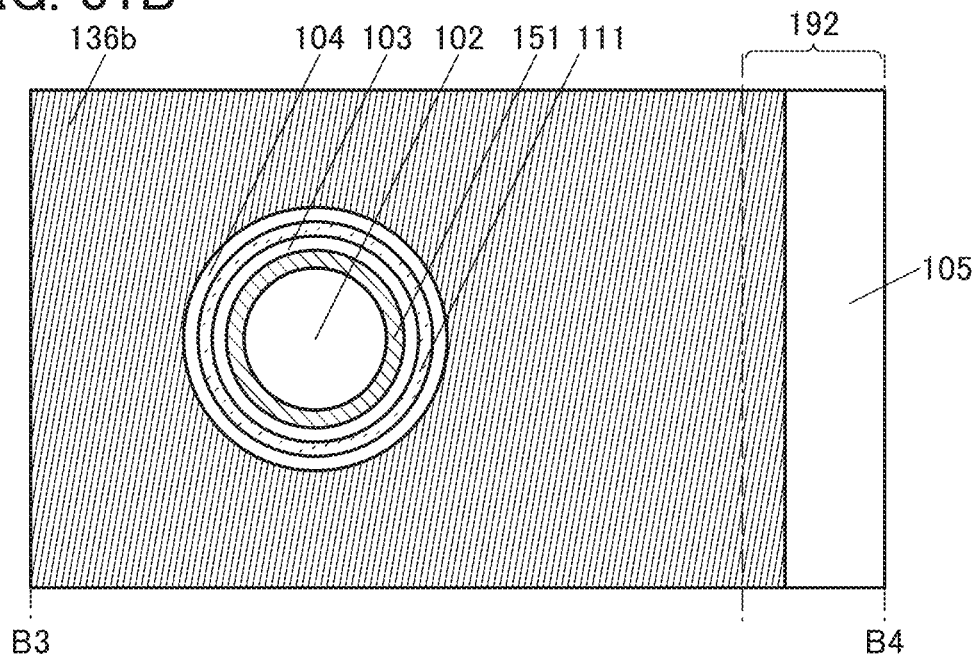

Note that FIGS. 31(A) and 31(B) are top views of the semiconductor device illustrated in FIG. 30(B) along the dashed-dotted line B1-B2 and the dashed-dotted line B3-B4, respectively. In the semiconductor device illustrated in FIG. 30(B), the thickness of the semiconductor 151 in the region 151a is smaller than the thickness of the semiconductor 151 in the region 151b; therefore, the semiconductor 151 in the top view in FIG. 31(B) is thinner than the semiconductor 151 in the top view in FIG. 31(A).

Figure 32A:
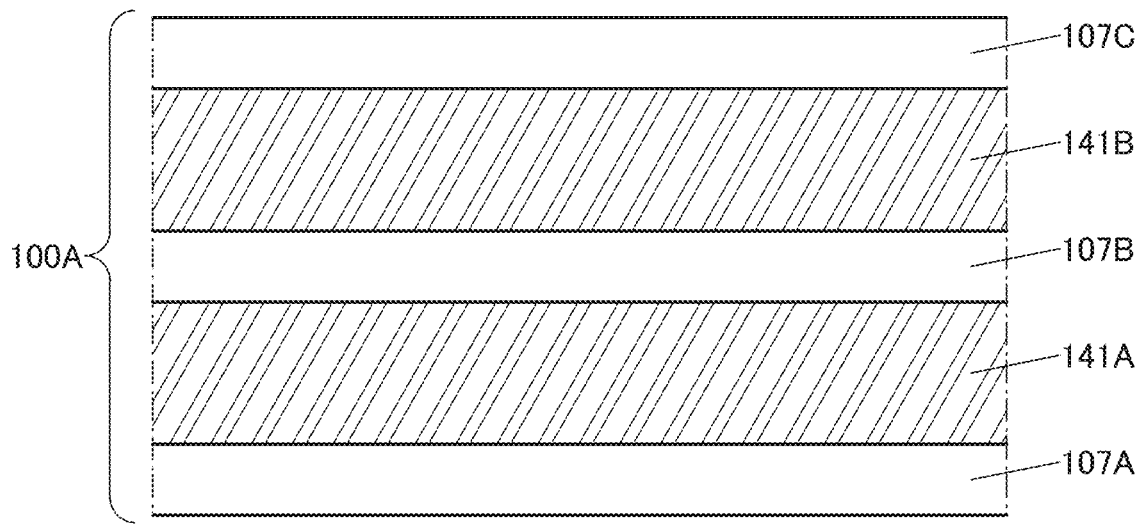
FIG. 32 Cross-sectional views for illustrating a manufacturing example of a semiconductor device.

For example, as described above, the semiconductor device of one embodiment of the present invention can have a structure in which an insulator such as silicon nitride is used as an alternative to the conductor 135. FIG. 32(A) illustrates a stack 100A in which an insulator 107A to an insulator 107C are substituted for the insulator 101A to the insulator 101C illustrated in FIG. 8(A). For the insulator 107A to the insulator 107C, silicon nitride or the like can be used as described above. Note that materials usable for the insulator 107A to the insulator 107C are not limited thereto. For example, as long as a low-resistance region is formed in the region 151b of the semiconductor 151 by reaction between the component included in the insulator 107A to the insulator 107 C and the component included in the semiconductor 151, the materials usable for the insulator 107A to the insulator 107C may be materials other than silicon nitride.

Figure 32B:
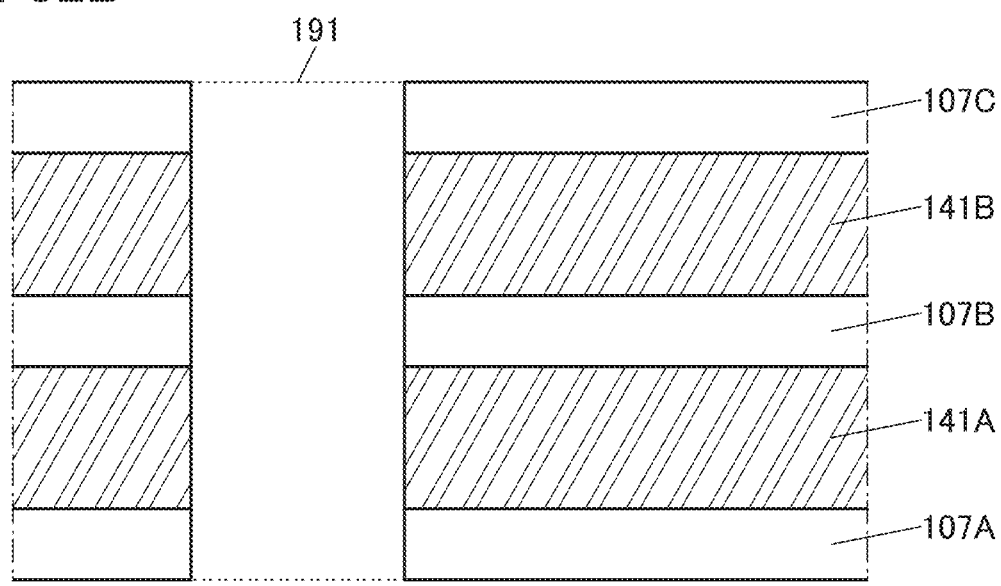
Figure 33A:
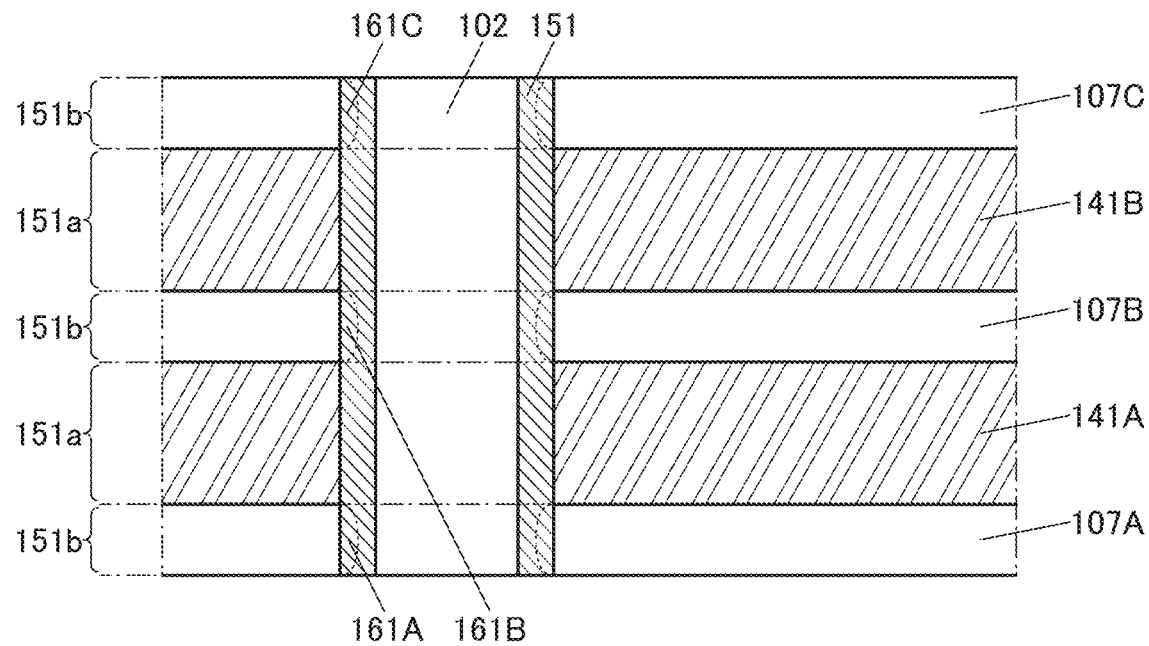
FIG. 33 Cross-sectional views for illustrating a manufacturing example of a semiconductor device.

The opening 191 is formed in the stack 100A in the same manner as the step illustrated in FIG. 8(B) (see FIG. 32(B)). Next, as in the step illustrated in FIG. 10(B) and FIG. 11(A), the semiconductor 151 is deposited on the side surface of the opening 191 illustrated in FIG. 32(B), and the insulator 102 is deposited over the formation surface of the semiconductor 151 to fill the opening 191 (see FIG. 33(A)). When the semiconductor 151 is a metal oxide, in the cross-sectional view in FIG. 33(A), the compound 161A (the compound 161B, the compound 161C) is formed in the semiconductor 151 at and around the interface with the insulator 107A (the insulator 107B, the insulator 107C) by nitrogen, nitride, and other components diffused from the insulator 107A (the insulator 107B, the insulator 107C). Accordingly, the resistance of the region 151b of the semiconductor 151 is reduced. In other words, the resistance of the adjacent cell transistors CTr electrically connected to each other can be reduced in some cases.

Subsequently, steps similar to those in FIGS. 13(A) and 13(B) and those in from FIG. 14 to FIG. 17(B) are performed, whereby a semiconductor device illustrated in FIG. 33(B) can be constituted. That is, the formation of the conductor 135a to the conductor 135c in FIG. 9(A) to FIG. 10(A) can be omitted; therefore, the manufacturing process of the semiconductor device can be shortened.

Figure 33B:
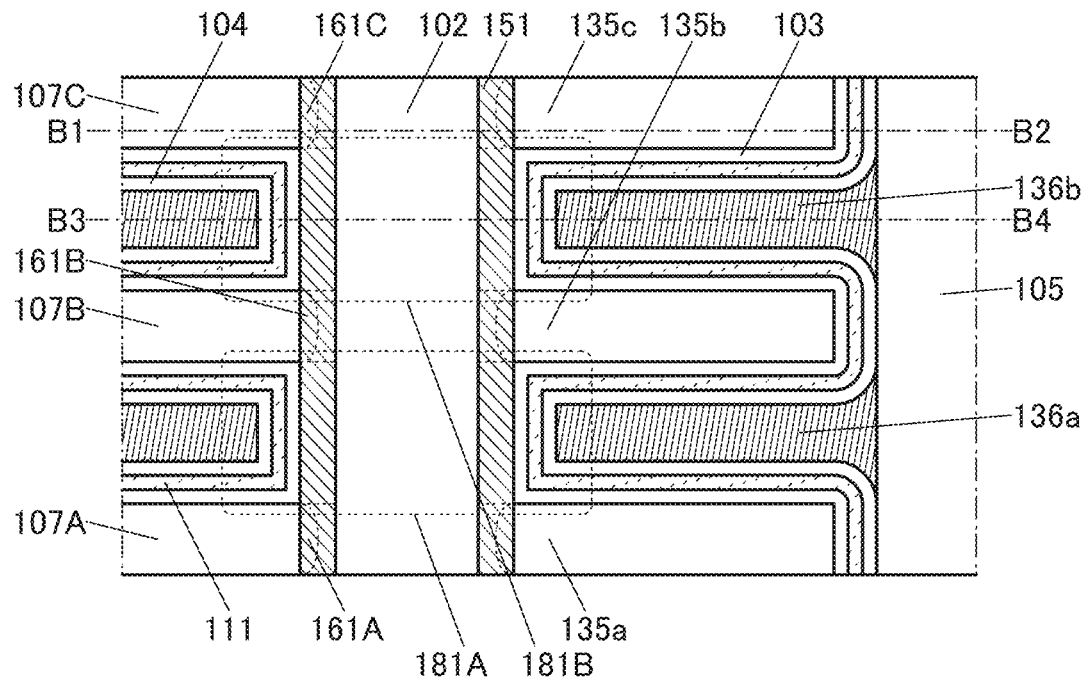
Figure 34A:
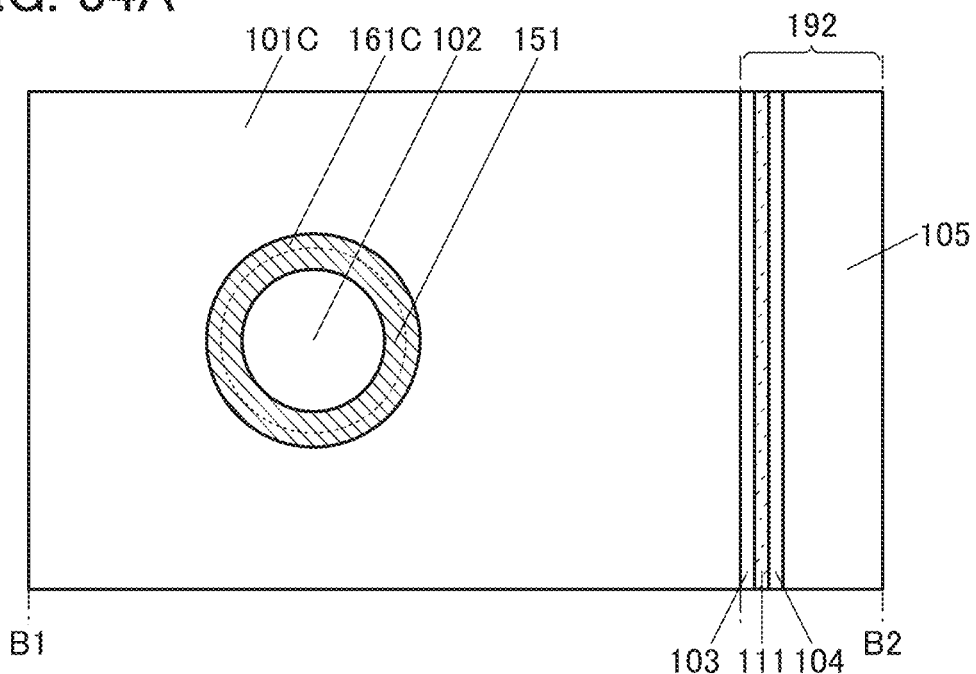
FIG. 34 Top views for illustrating a manufacturing example of a semiconductor device.
Figure 34B:
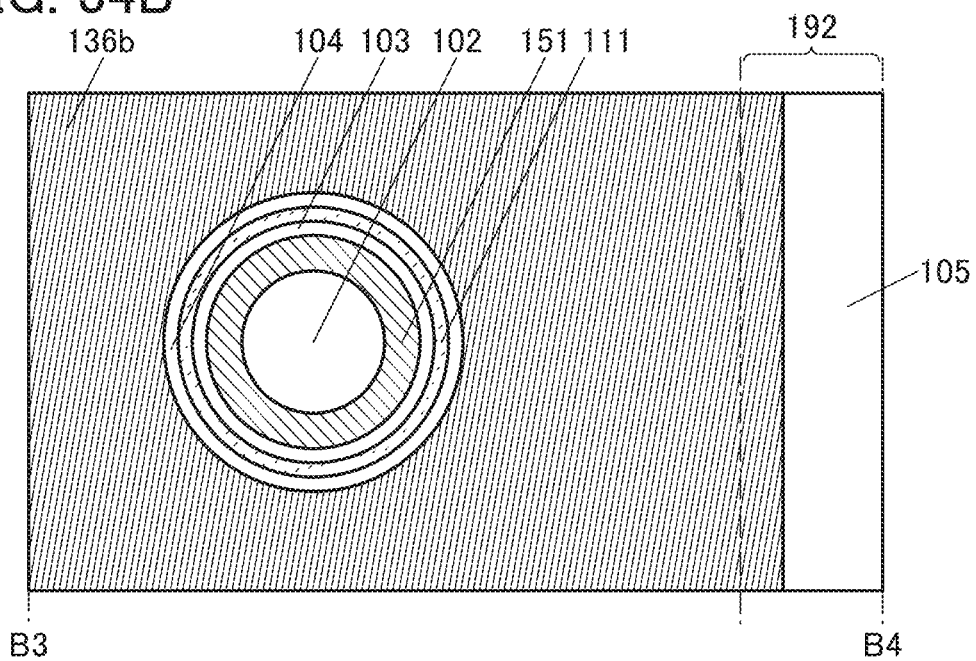

Note that FIGS. 34(A) and 34(B) are top views of the semiconductor device illustrated in FIG. 33(B) along the dashed-dotted line B1-B2 and the dashed-dotted line B3-B4, respectively. Since the semiconductor device illustrated in FIG. 33(B) is the structure example in which the formation of the conductor 135a to the conductor 135c is omitted, the top views in FIGS. 34(A) and 34(B) have structures in which the conductor 135c (the conductor 135a, the conductor 135b) is omitted from the structures in FIGS. 18(A) and 18(B), respectively.

<<Manufacturing Method Example 2>>

Here, a structure example of the semiconductor device in this embodiment that is different from that in Manufacturing method example 1 will be described with reference to FIG. 35 to FIG. 45.

As in FIG. 8 to FIG. 19, FIG. 35 to FIG. 45 are cross-sectional views, top views, and a perspective view for illustrating a manufacturing example of the semiconductor device illustrated in FIG. 1(A), and the cross-sectional views specifically illustrate the cell transistor CTr in the channel length direction. As in FIG. 8 to FIG. 19, in FIG. 35 to FIG. 45, some components are not illustrated for clarification of the drawing.

The description of FIG. 8(A) to FIG. 8(B) made in Manufacturing method example 1 is referred to for the beginning steps.

Figure 35A:
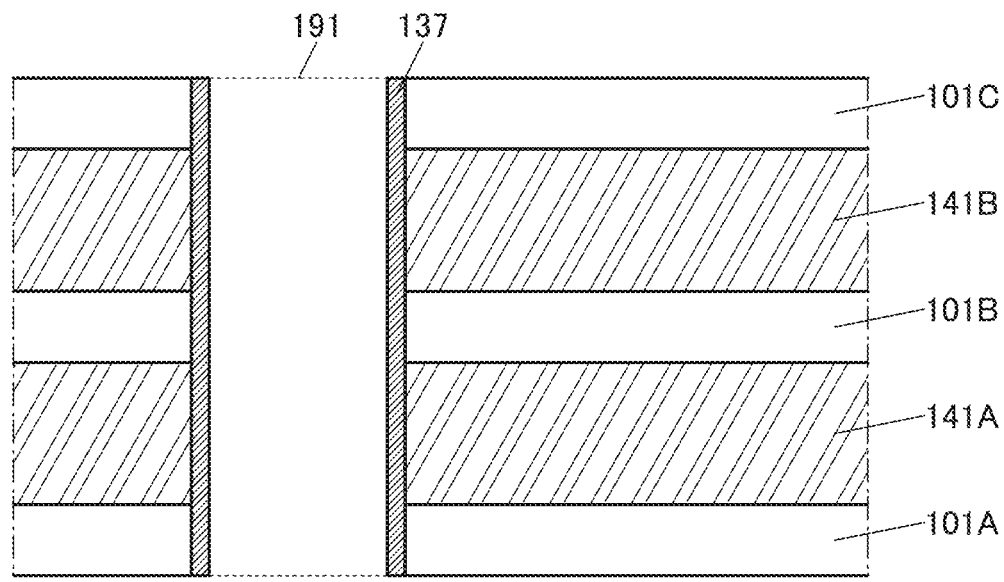
FIG. 35 Cross-sectional views for illustrating a manufacturing example of a semiconductor device.

A step illustrated in FIG. 35(A) is subsequent to the step illustrated in FIG. 8(B). In FIG. 35(A), a conductor 137 is deposited on the side surface of the opening 191 illustrated in FIG. 8(B) (each side surface of the insulator 101A to the insulator 101C, the sacrificial layer 141A, and the sacrificial layer 141B).

The description of the conductor 135 made in Manufacturing method example 1 is referred to for the conductor 137.

Figure 35B:
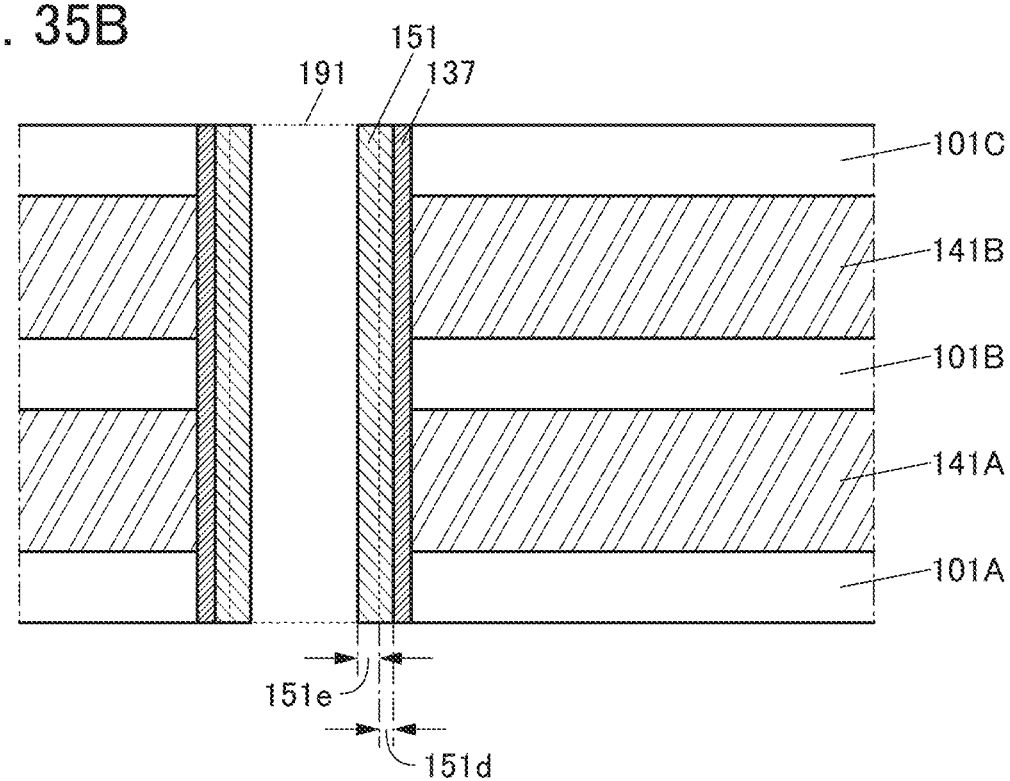

In FIG. 35(B), the semiconductor 151 is deposited on the side surface of the opening 191 and in the formed recess portions illustrated in FIG. 35(A). That is, the semiconductor 151 is formed on the formation surface of the conductor 137.

The description of the semiconductor 151 made in Manufacturing method example 1 is referred to for the semiconductor 151.

At this time, since the semiconductor 151 is in contact with the conductor 137, a low-resistance region is in some cases formed around the interface between the semiconductor 151 and the conductor 137. Note that in FIG. 35(B), a region 151d is illustrated as a low-resistance region and a region 151e is illustrated as a region whose resistance is comparatively higher than that of the low-resistance region. Note that the low-resistance region is not formed in some cases.

Note that when heat treatment is performed at this time, a compound from the component of the semiconductor 151 and the component of the conductor 137 is formed in some cases around the interface between the semiconductor 151 and the conductor 137. Therefore, the heat treatment is not performed after this step unless otherwise specified. Specifically, heat treatment is not performed until a predetermined step is completed but may be performed after the predetermined step.

Figure 36A:
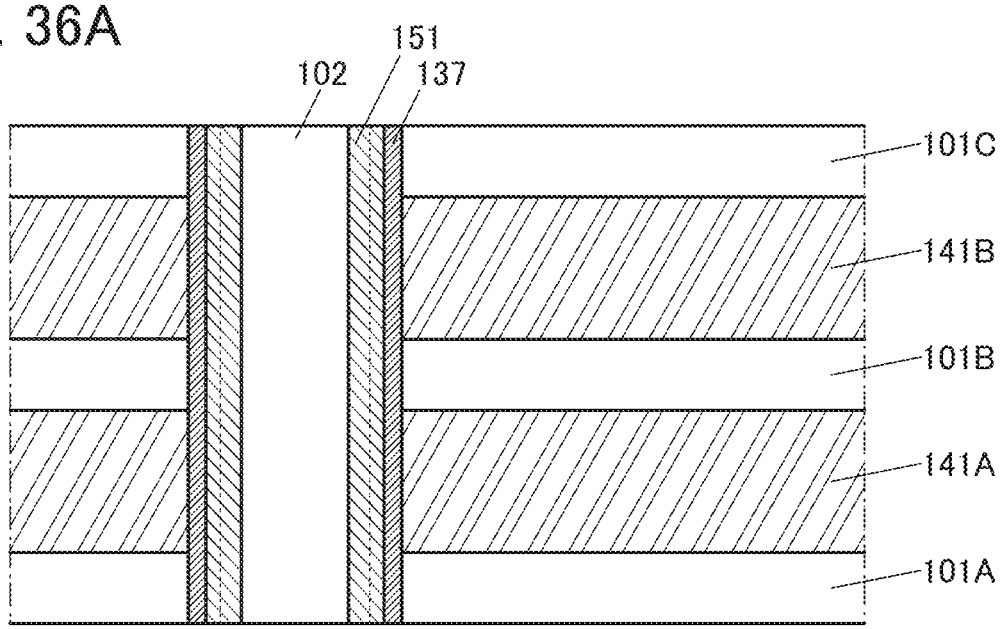
FIG. 36 Cross-sectional views for illustrating a manufacturing example of a semiconductor device.

In the next step, as illustrated in FIG. 36(A), the insulator 102 is deposited on the formation surface of the semiconductor 151 to fill the remaining opening 191.

An insulating material having a function of transmitting oxygen is preferably used for the insulator 102, for example. For example, the insulator 102 is doped with oxygen so that oxygen is diffused, whereby oxygen can be supplied to the semiconductor 151. As a result, it is possible to prevent reduction of the resistance of the region 151a of the semiconductor 151.

Alternatively, a plurality of insulators 102 may be stacked. For example, as illustrated in FIG. 36, silicon oxide may be used for the insulator 102A in contact with the semiconductor 151 and aluminum oxide or hafnium oxide may be used for the insulator 102B in contact with the insulator 102A. For example, in the case where aluminum oxide is deposited by a sputtering method, oxygen is supplied to the insulator 102A. Oxygen which has been supplied to the insulator 102A is supplied to the semiconductor 151. As a result, it is possible to prevent reduction in the resistance of the region 151a which will be formed after the semiconductor 151.

The description of the insulator 102 made in Manufacturing method example 1 is referred to for another material usable for the insulator 102.

Figure 36B:
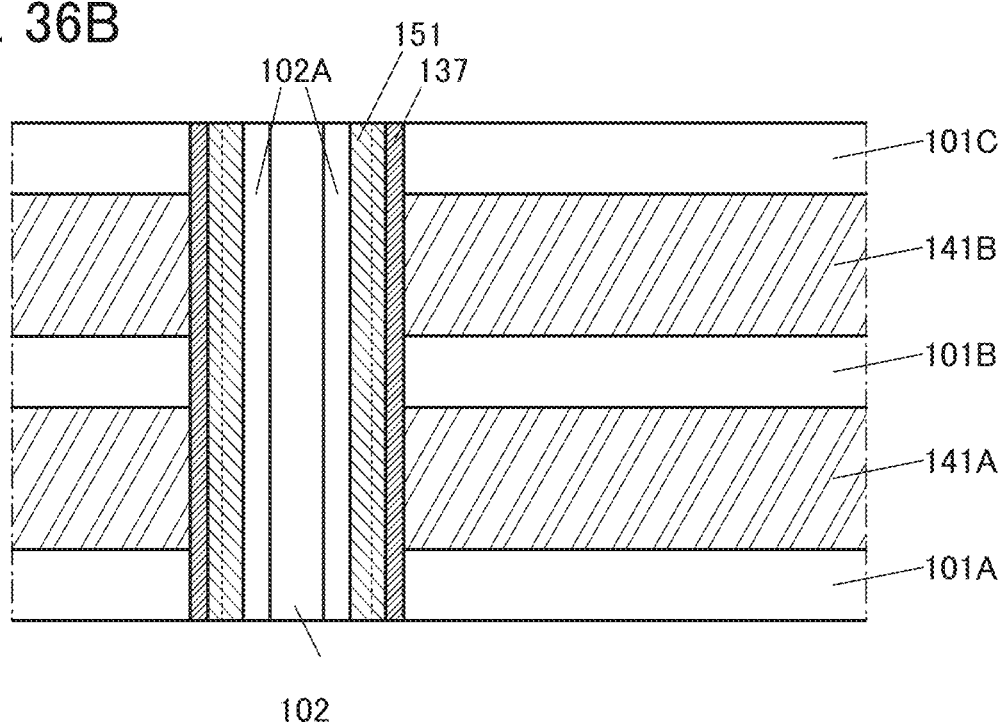
Figure 37A:
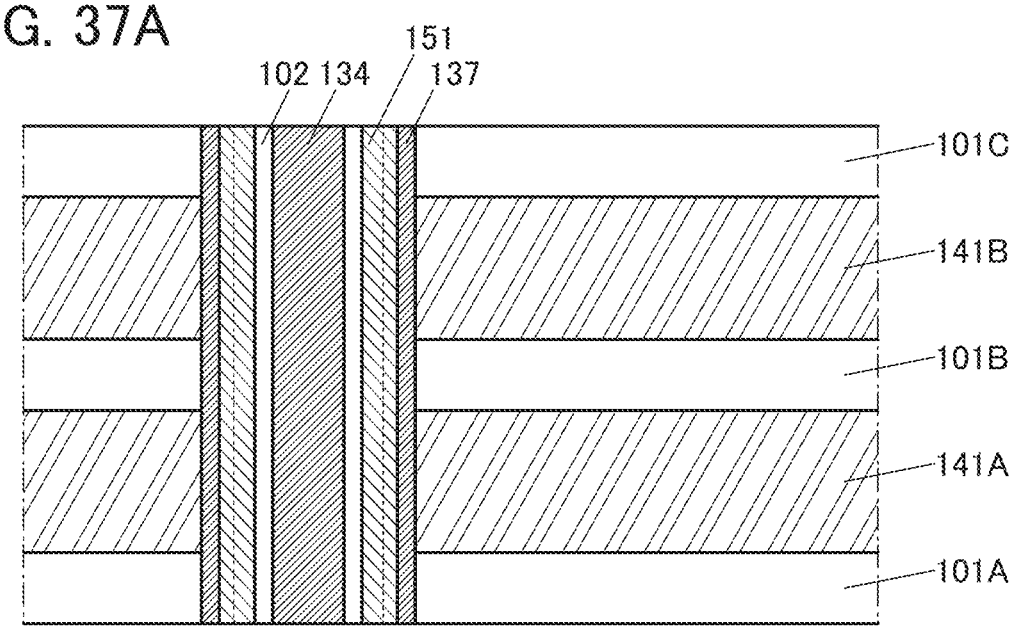
FIG. 37 A cross-sectional view for illustrating a manufacturing example of a semiconductor device.

In the case where the cell transistor included in the semiconductor device is provided with a back gate, the step illustrated in FIG. 37 may be performed instead of the steps in FIGS. 36(A) and 36(B). In the step illustrated in FIG. 37, the insulator 102 is deposited on the formation surface of the semiconductor 151, and the conductor 134 is deposited to fill the remaining opening 191.

Note that the insulator 102 illustrated in FIG. 37 may have a structure of a stack including a plurality of insulators (not illustrated). The structure of the stack including a plurality of insulators may be, for example, a structure of a stack including the insulator 102A and the insulator 102B described with reference to FIG. 36(B).

At this time, the conductor 134 functions as the wiring BGL illustrated in FIG. 1(B) and FIG. 3.

The description of the conductor 134 made in Manufacturing method example 1 is referred to for a material usable for the conductor 134.

Figure 38A:
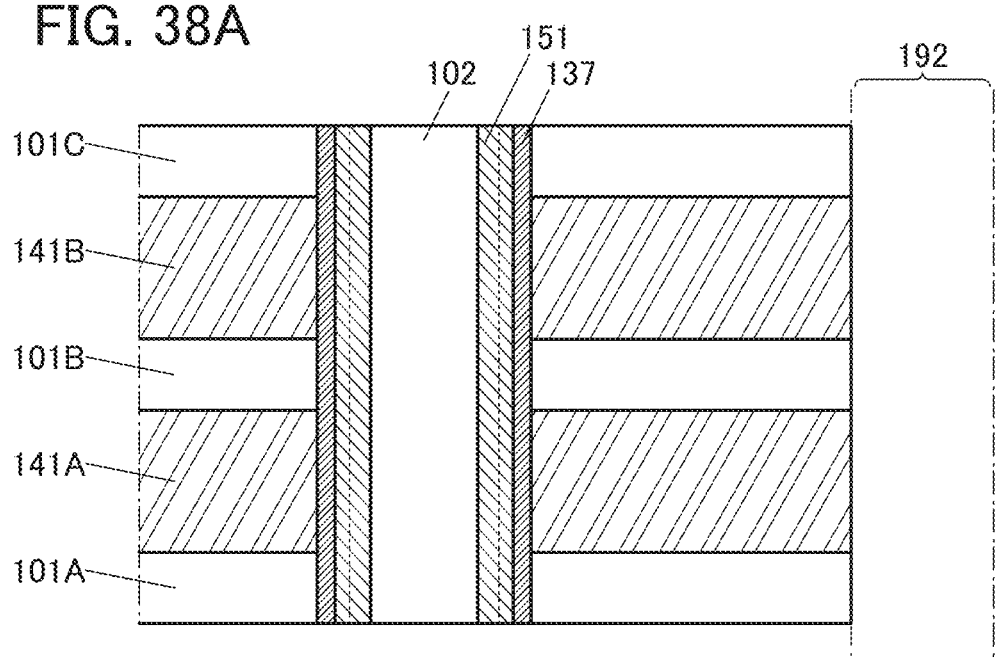
FIG. 38 Cross-sectional views for illustrating a manufacturing example of a semiconductor device.

In the next step, as illustrated in FIG. 38(A), resist mask formation and etching treatment, or the like are performed on the stack 100 to form the slit 192. Note that in this step, an opening may be formed instead of the slit.

Note that the description of FIG. 8(B) is referred to for the resist mask formation and the etching treatment, or the like.

Figure 38B:
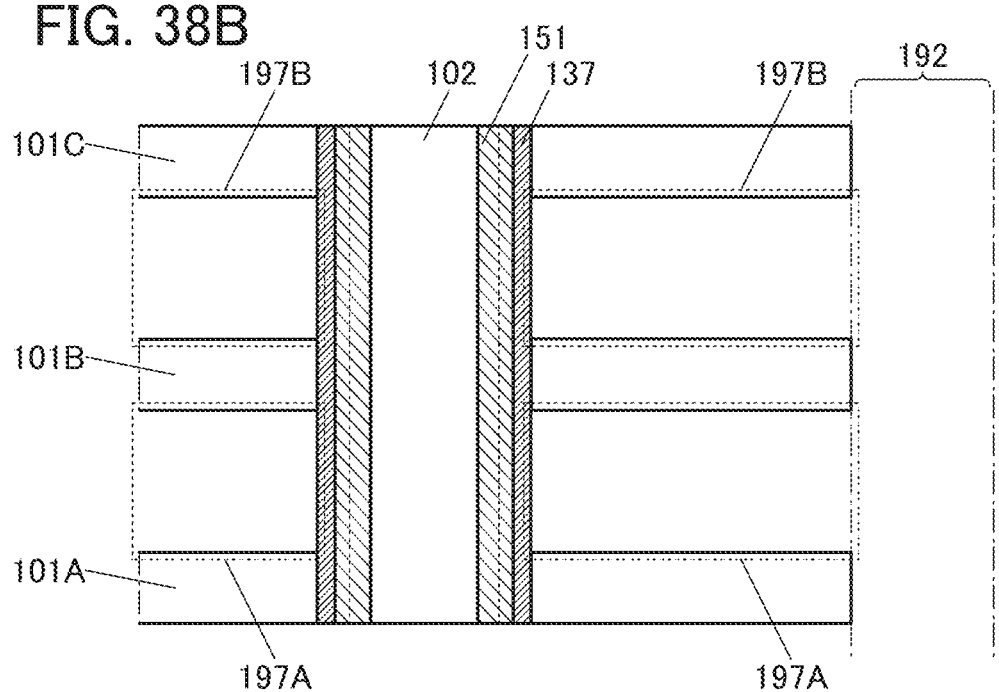

Then, as illustrated in FIG. 38(B), the sacrificial layer 141A and the sacrificial layer 141B are removed from the side surface of the slit 192 by etching treatment or the like, and a recess portion 197A and a recess portion 197B are formed in the stack 100.

Note that in some cases, the recess portion 197A and the recess portion 197B can be formed at the same time as the formation of the slit 192 at the stage of the manufacturing step illustrated in FIG. 38(A).

Figure 39A:
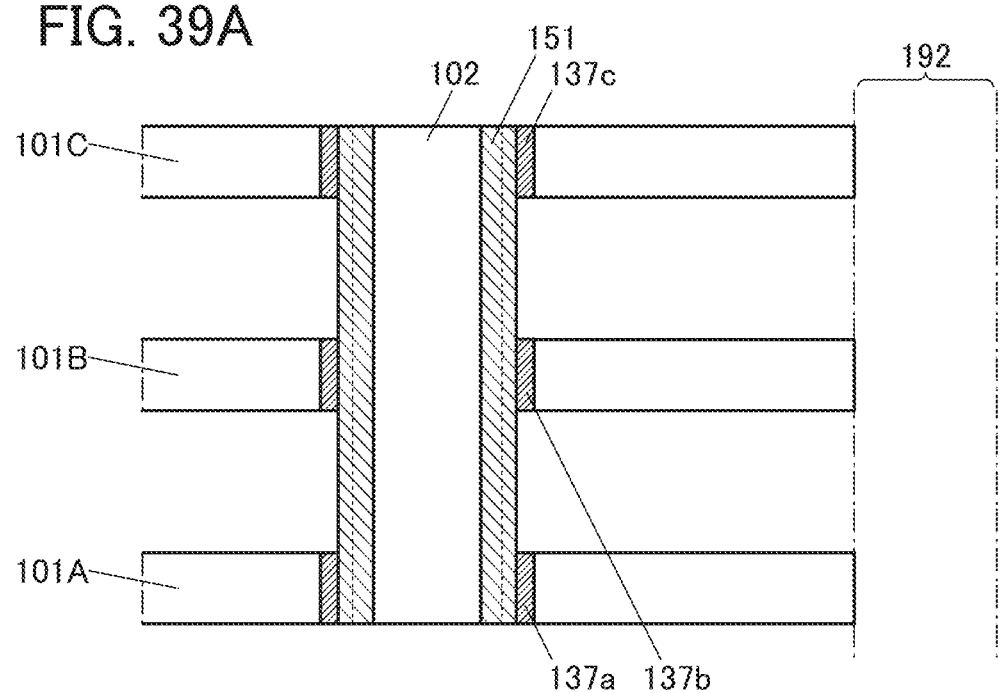
FIG. 39 Cross-sectional views for illustrating a manufacturing example of a semiconductor device.

Furthermore, as illustrated in FIG. 39(A), the conductors 137 included in the recess portion 197A and the recess portion 197B are removed by etching treatment or the like. Accordingly, the semiconductor 151 is exposed, and a conductor 137a, a conductor 137b, and a conductor 137c are formed.

Note that in some cases, the manufacturing step illustrated in FIG. 39(A) can be achieved at the same time as the formation of the slit 192 at the stage of the manufacturing step illustrated in FIG. 38(A).

Figure 39B:
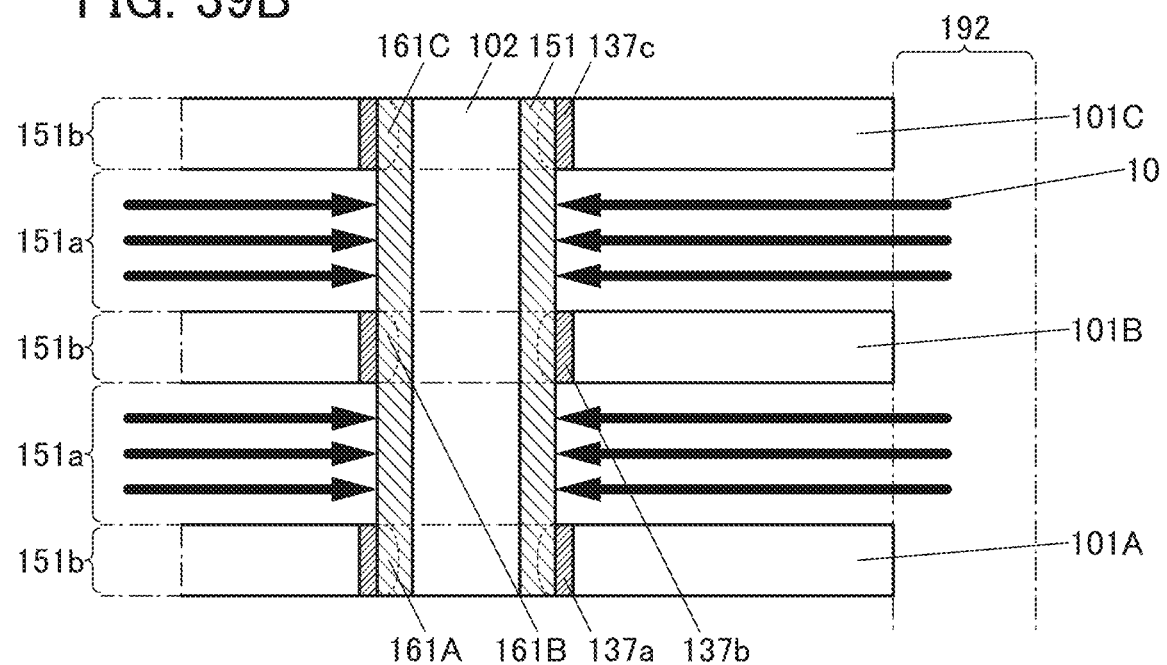

In the next step, as illustrated in FIG. 39(B), treatment for supplying an impurity, oxygen, or the like from the slit 192 is performed on the semiconductor 151, as in the step of FIG. 14(A) described in Manufacturing method example 1. FIG. 39(B) illustrates a step of performing the impurity supply treatment 10 on the regions 151a of the semiconductor 151. Through this step, the regions 151a of the semiconductor 151 each function as a channel formation region of the cell transistor CTr. Note that by this treatment, the region 151d serving as the low-resistance region in the region 151a disappears.

In addition, heat treatment is preferably performed during or after the treatment of FIG. 39(B). By this heat treatment, the compound 161A, the compound 161B, and the compound 161C from the component of the semiconductor 151 and the component of the conductor 137 are formed around the interface between the semiconductor 151 and the conductor 137. That is, the low-resistance regions are formed in the regions 151b of the semiconductor 151. Note that the description of the compound 161A, the compound 161B, and the compound 161C made in Manufacturing method example 1 is referred to for the compound 161A, the compound 161B, and the compound 161C.

Figure 40:
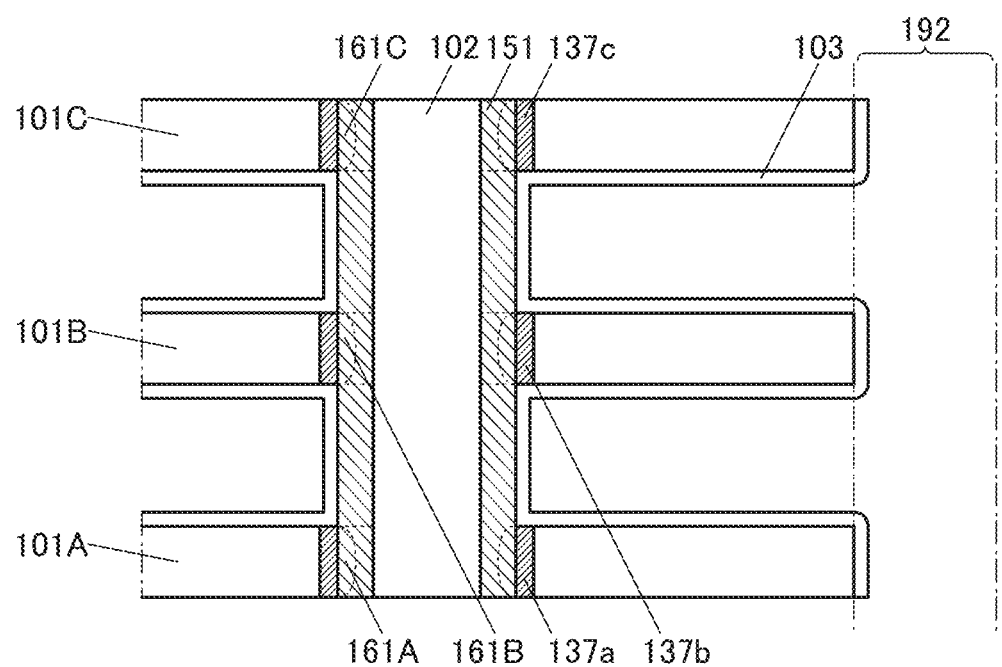
FIG. 40 A cross-sectional view for illustrating a manufacturing example of a semiconductor device.

In the next step, as illustrated in FIG. 40, the insulator 103 is deposited on the side surface of the slit 192 (each side surface of the insulator 101A to the insulator 101C) and in the formed recess portions illustrated in FIG. 39(B).

The description of the insulator 103 made in Manufacturing method example 1 is referred to for a material usable for the insulator 103.

Figure 41A:
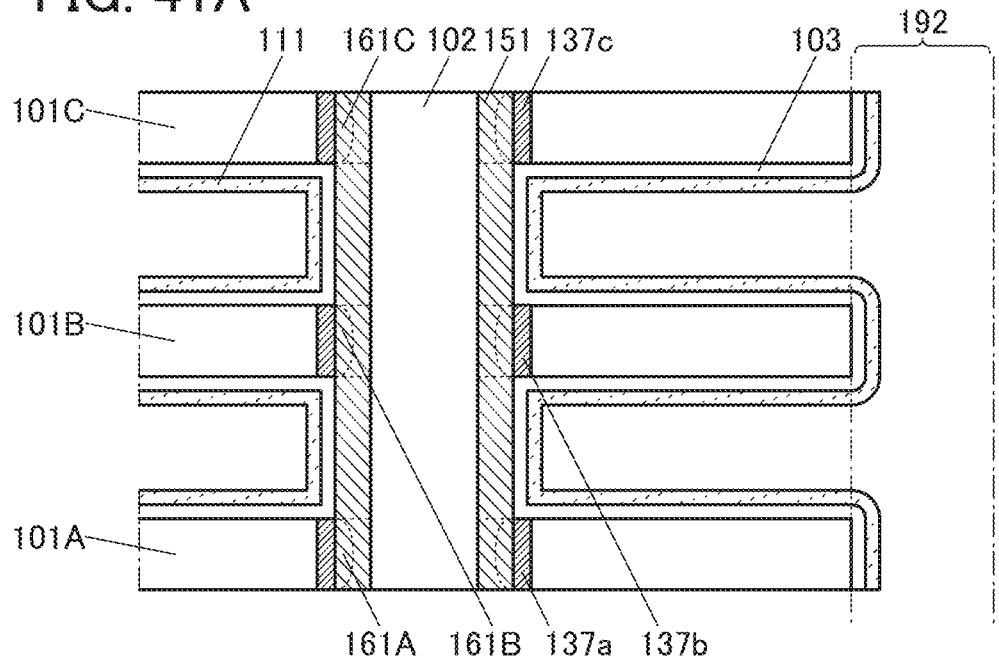
FIG. 41 Cross-sectional views for illustrating a manufacturing example of a semiconductor device.

In the next step, as illustrated in FIG. 41(A), the insulator 111 is deposited on the side surface of the slit 192 and in the formed recess portions illustrated in FIG. 40. That is, the insulator 111 is formed on the formation surface of the insulator 103.

The description of the insulator 111 made in Manufacturing method example 1 is referred to for a material usable for the insulator 111.

Figure 41B:
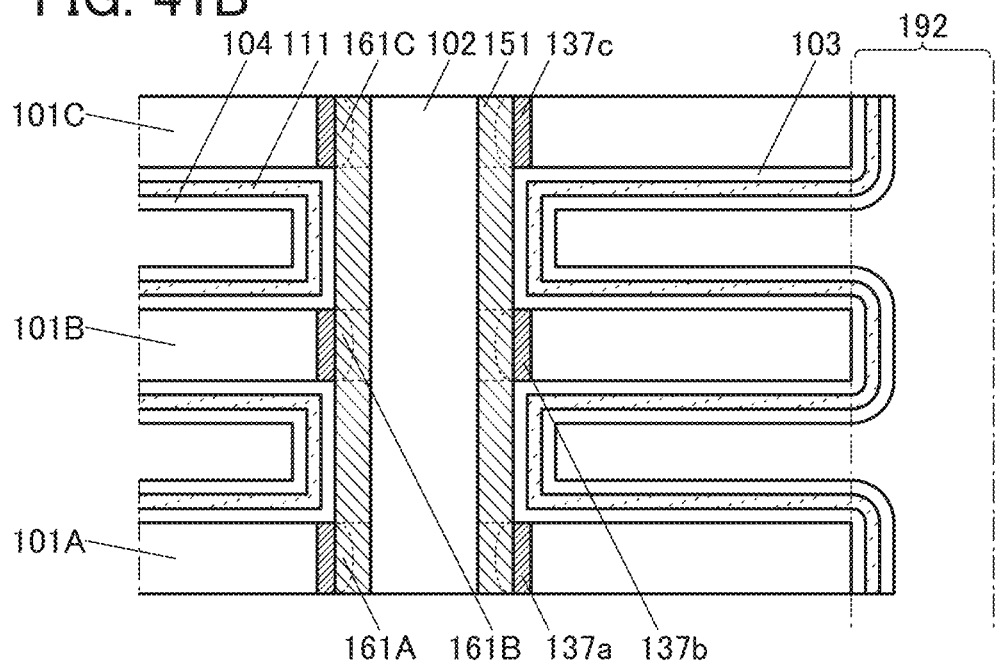

In the next step, as illustrated in FIG. 41(B), the insulator 104 is deposited on the side surface of the slit 192 and in the formed recess portions illustrated in FIG. 41(A). That is, the insulator 104 is formed on the formation surface of the insulator 111.

The description of the insulator 104 made in Manufacturing method example 1 is referred to for a material usable for the insulator 104.

Figure 42A:
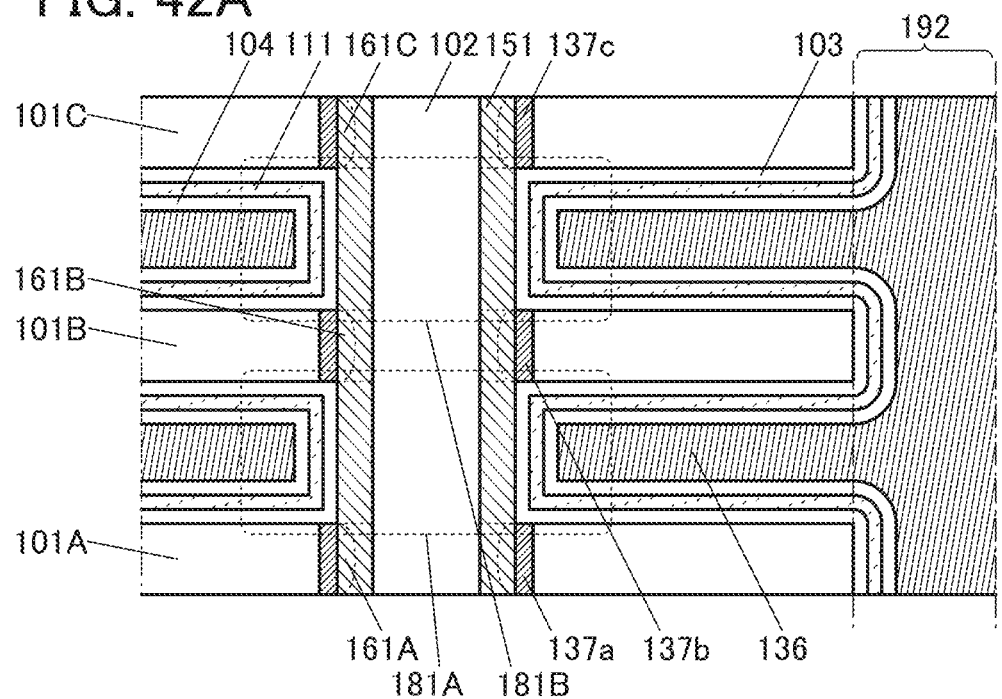
FIG. 42 Cross-sectional views for illustrating a manufacturing example of a semiconductor device.

In the next step, as illustrated in FIG. 42(A), the conductor 136 is deposited on the side surface of the slit 192 and in the formed recess portions illustrated in FIG. 41(B). That is, the conductor 136 is formed on the formation surface of the insulator 104.

The description of the conductor 136 made in Manufacturing method example 1 is referred to for a material usable for the conductor 136.

Figure 42B:
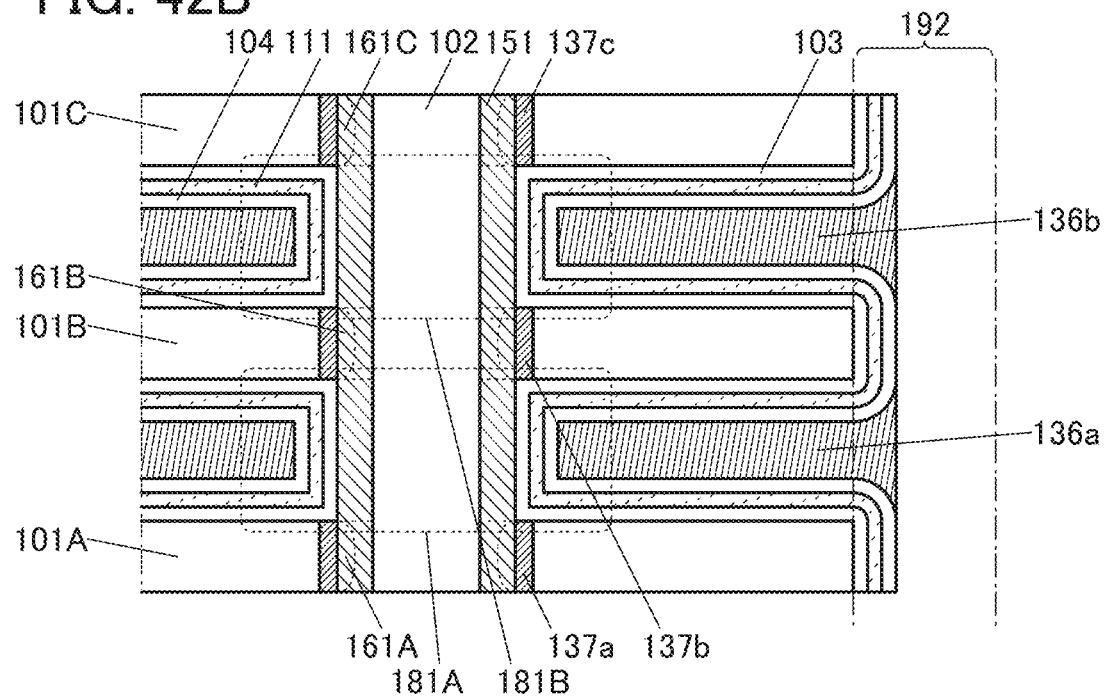

In the next step, as illustrated in FIG. 42(B), the conductor 136 included in the slit 192 is removed by resist mask formation and etching treatment, or the like so that the conductor 136 remains only in the aforementioned recess portions. Thus, the conductor 136a and the conductor 136b are formed. Note that at this time, part of the insulator 104 may be removed as long as the insulator 111 is not exposed at the slit 192.

Note that the description of FIG. 8(B) is referred to for the resist mask formation and the etching treatment, or the like.

The conductor 136a (the conductor 136b) functions as the gate electrode of the cell transistor CTr and the wiring WL illustrated in FIGS. 1(A) and 1(B). That is, the cell transistor CTr is formed in the region 181A (the region 181B) illustrated in FIG. 42(B).

Figure 43:
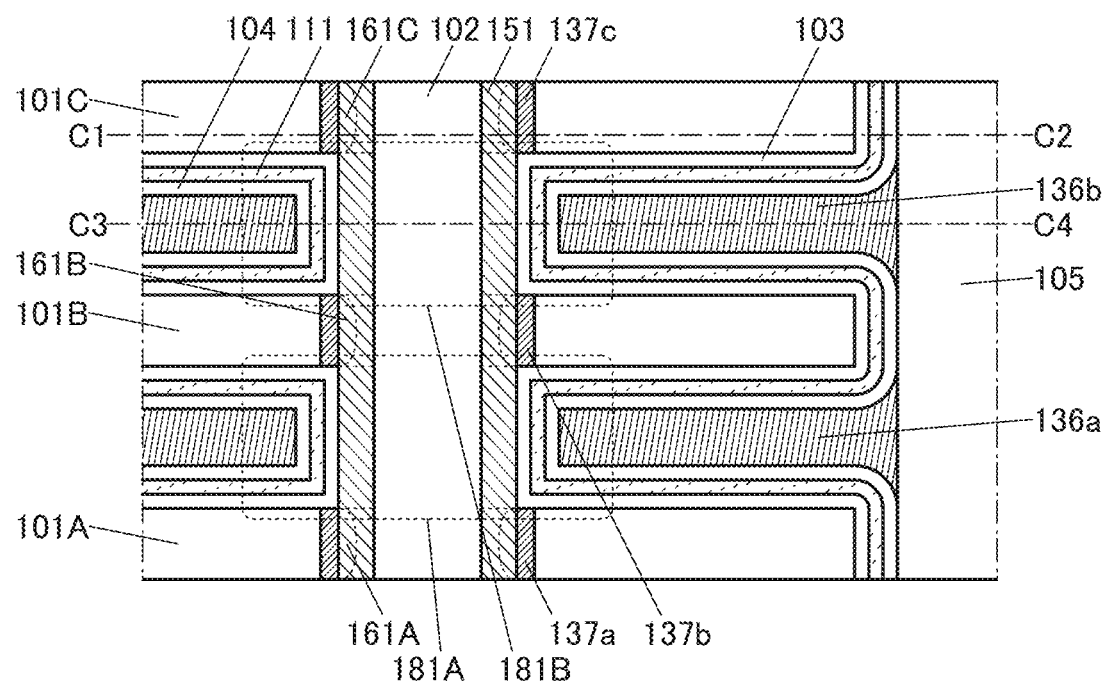
FIG. 43 A cross-sectional view for illustrating a manufacturing example of a semiconductor device.

In the next step, as illustrated in FIG. 43, the insulator 105 is deposited to fill the slit 192.

Any of the above materials usable for the insulator 102 can be used for the insulator 105.

As described above, the semiconductor device illustrated in FIG. 1(A) can be manufactured through the steps of FIGS. 8(A) and 8(B) and the steps from FIG. 35(A) to FIG. 43.

Figure 44A:
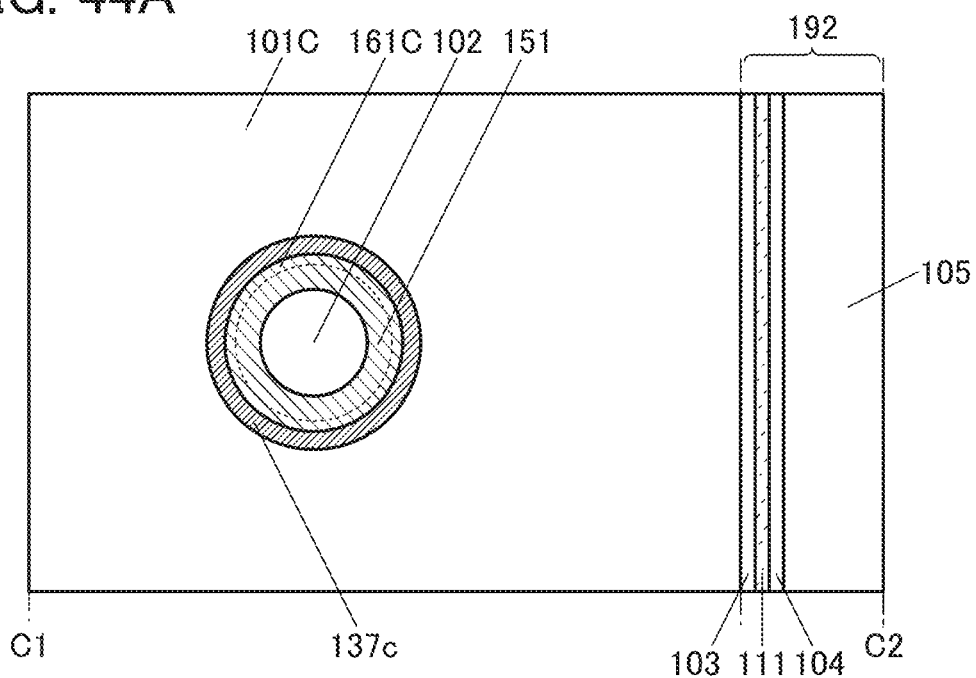
FIG. 44 Top views for illustrating a manufacturing example of a semiconductor device.
Figure 44B:
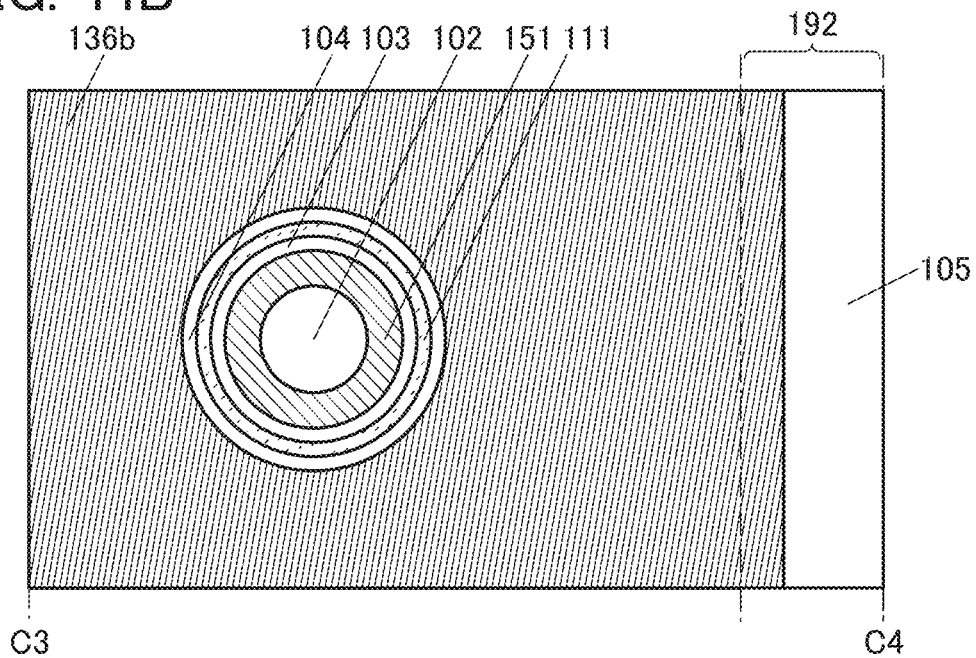
Figure 45A:
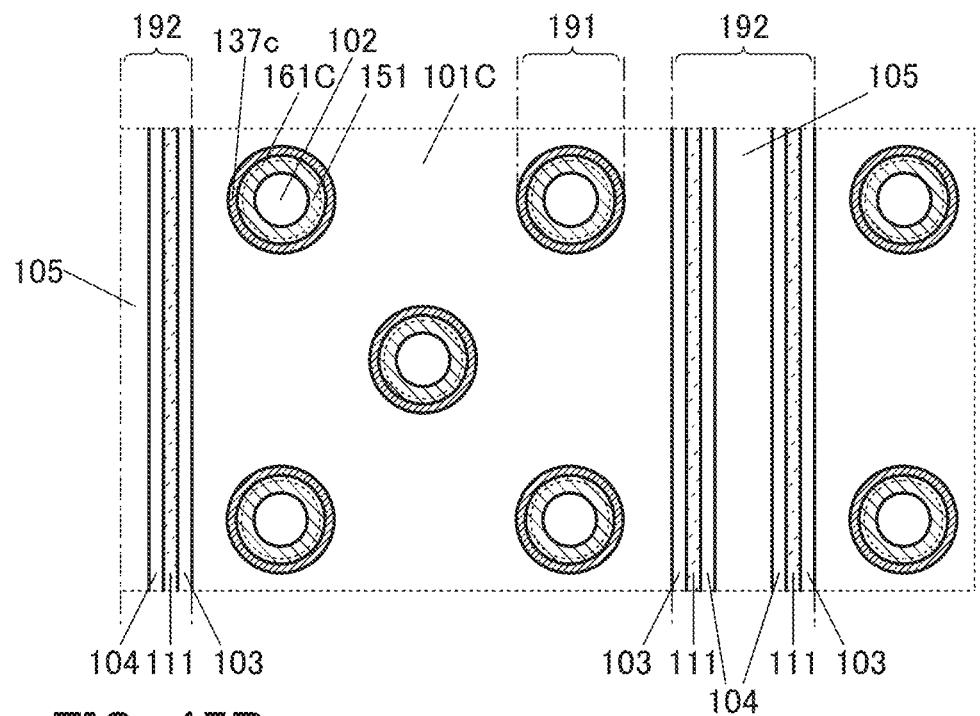
FIG. 45 Top views for illustrating a manufacturing example of a semiconductor device.
Figure 45B:
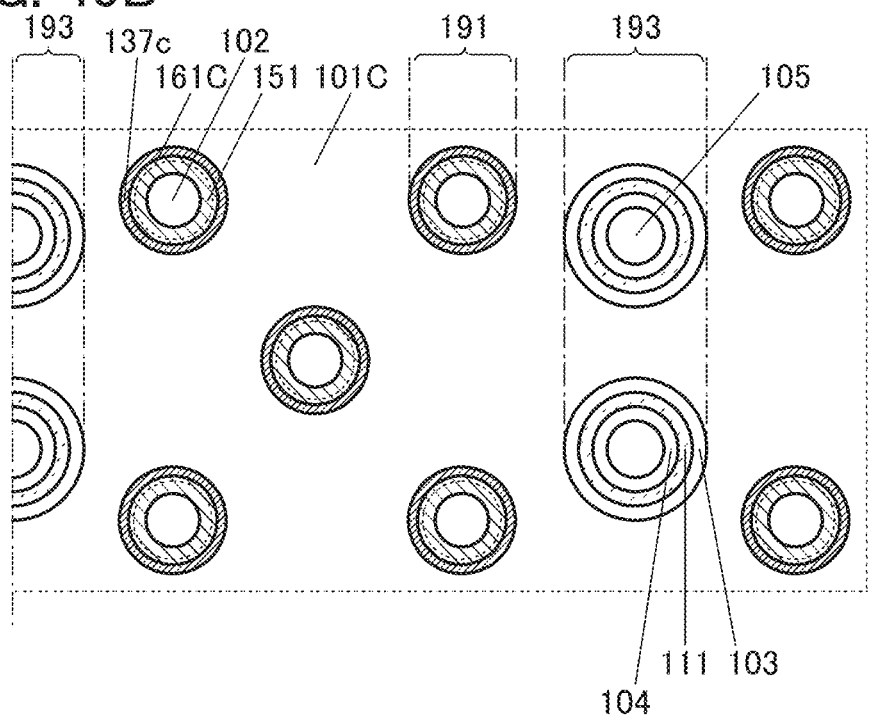

FIGS. 44(A) and 44(B) are top views of the semiconductor device illustrated in FIG. 43 along the dashed-dotted line C1-C2 and the dashed-dotted line C3-C4, respectively. FIG. 45(A) is a top view of the semiconductor device in the case of providing a plurality of openings 191 as in the structure example illustrated in FIG. 6. Note that this is a top view of the semiconductor device illustrated in FIG. 43 along the dashed-dotted line C1-C2, which is in the case of providing the plurality of openings 191. In the semiconductor device illustrated in FIG. 45(A), a plurality of slits 192 are included and the opening 191 is provided between adjacent slits 192. Note that an opening may be formed instead of the slit 192 as described in FIG. 38. In FIG. 45(B), the opening 193 is provided instead of the slit 192, and the insulator 103 to the insulator 105 and the insulator 111 are formed in the opening 193. Note that the openings 193 may be provided along columns in two or more different directions instead of being provided along columns in one direction as in the slit 192 in FIG. 45(A). Alternatively, the openings 193 may be formed without the regularity as describe above.

One embodiment of the present invention is not limited to the structure example of the semiconductor device illustrated in FIG. 43. One embodiment of the present invention can have a structure which is changed as appropriate from that of the semiconductor device illustrated in FIG. 43 depending on the case, according to circumstances, or as needed.

For example, as described above, one embodiment of the present invention can also be a semiconductor device in which the cell transistor CTr is provided with a back gate as illustrated in FIG. 1(B). In the case of manufacturing the semiconductor device illustrated in FIG. 1(B), the step illustrated in FIG. 37 is performed instead of the step illustrated in FIG. 36(A) in the process of manufacturing the semiconductor device in FIG. 1(A). The semiconductor device illustrated in FIG. 46 can be constituted by performing the step illustrated in FIG. 37 instead of the step illustrated in FIG. 36(A).

Figure 46:
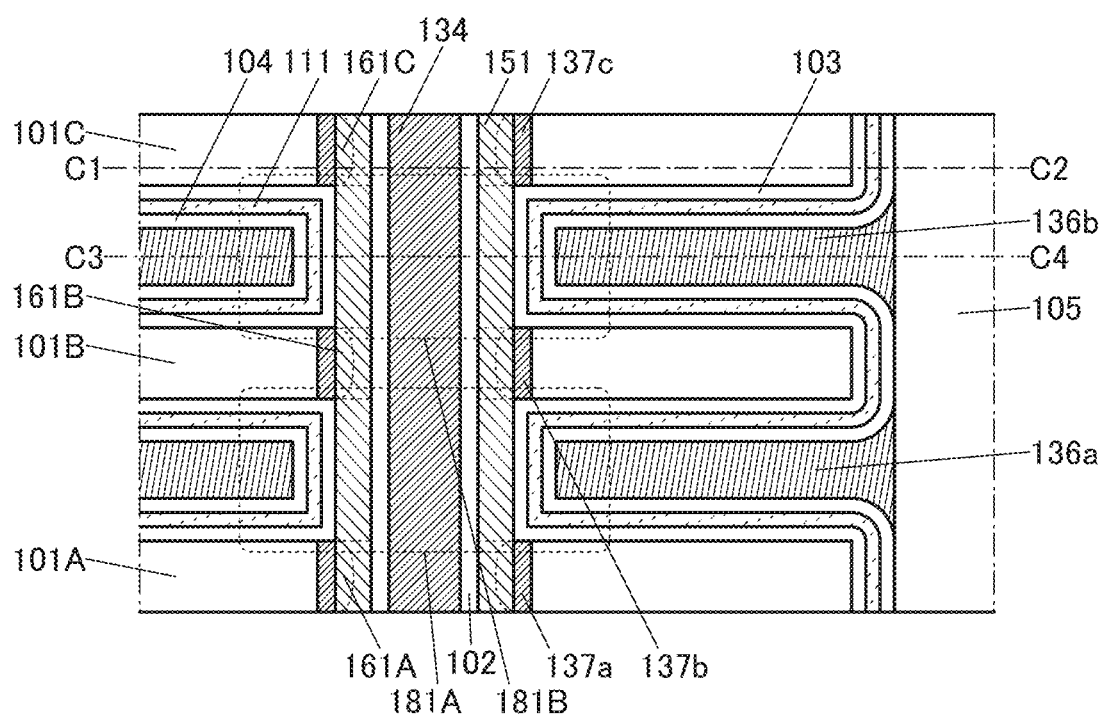
FIG. 46 A cross-sectional view for illustrating a manufacturing example of a semiconductor device.
Figure 47A:
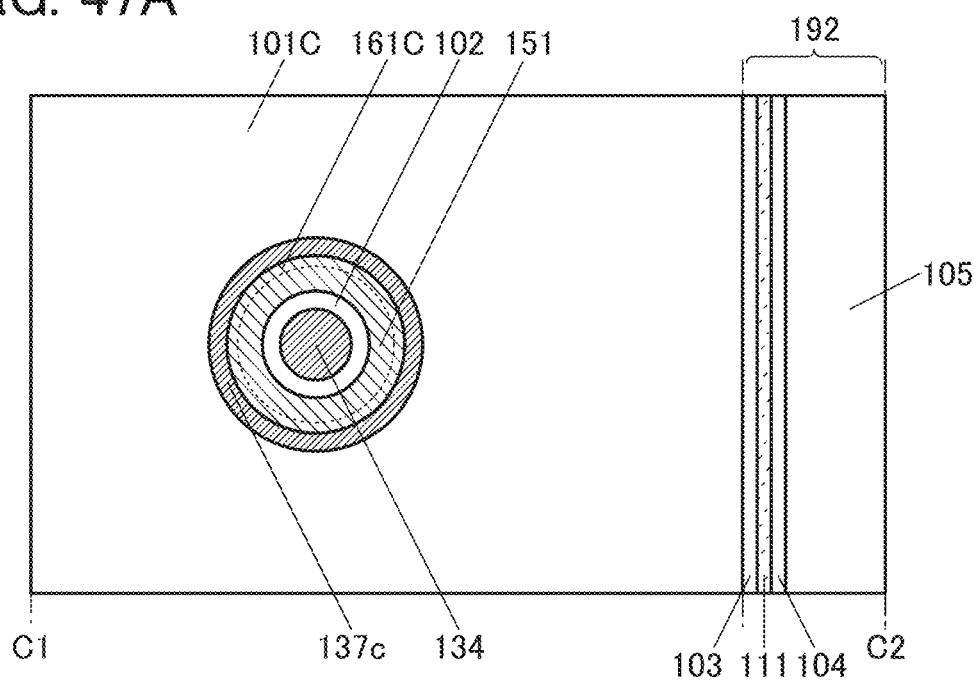
FIG. 47 Top views for illustrating a manufacturing example of a semiconductor device.
Figure 47B:
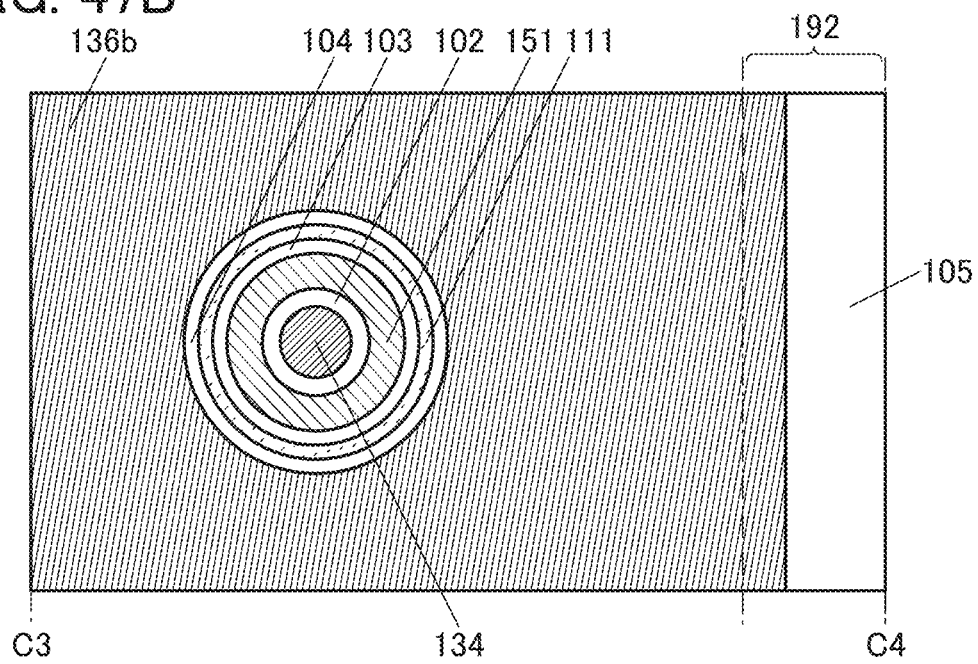

Note that FIGS. 47(A) and 47(B) are top views of the semiconductor device illustrated in FIG. 46 along the dashed-dotted line C1-C2 and the dashed-dotted line C3-C4, respectively. Since the semiconductor device illustrated in FIG. 46 is a structure example in which the conductor 134 is formed, the top views in FIGS. 47(A) and 47(B) have structures in which the conductor 134 is formed inside the insulator 102 illustrated in FIGS. 44(A) and 44(B), respectively.

Figure 48:
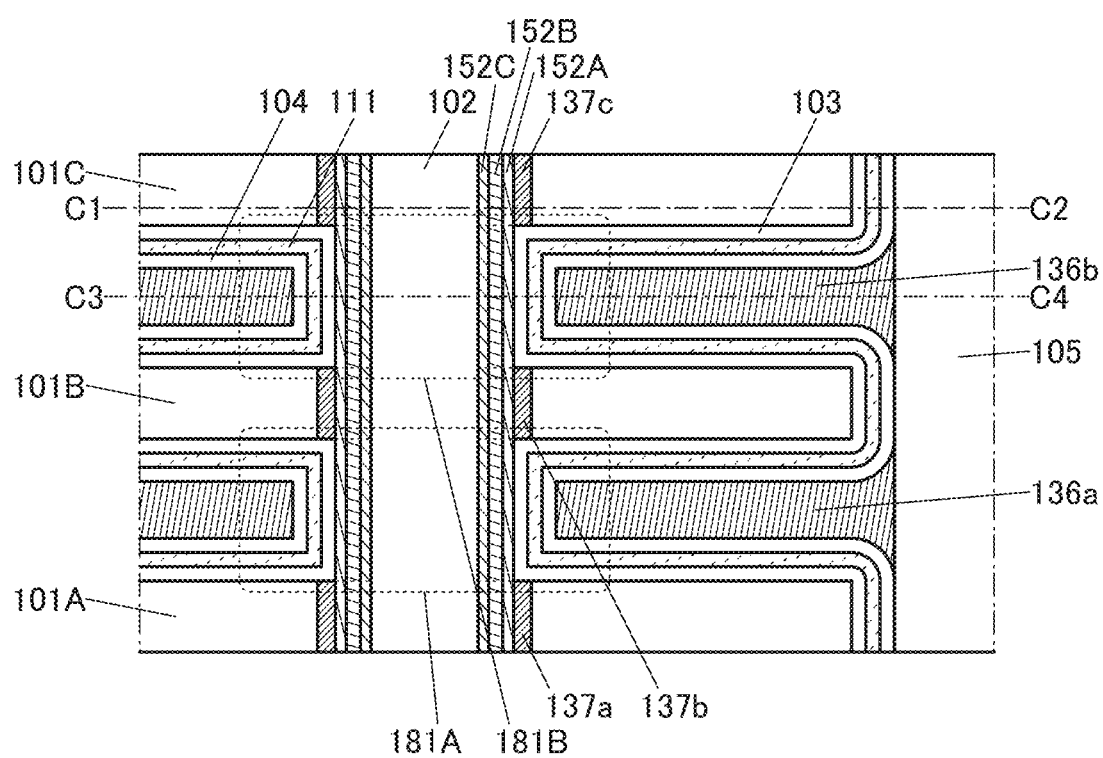
FIG. 48 A cross-sectional view for illustrating a manufacturing example of a semiconductor device.

In addition, for example, in the case where a material containing a metal oxide is used for the semiconductor 151, the semiconductor 151 can have a three-layer structure as in the semiconductor device illustrated in FIG. 48. In the semiconductor device illustrated in FIG. 48, the semiconductor 151 has a three-layer structure, and the semiconductor 152A, the semiconductor 152B, and the semiconductor 152C are sequentially formed as the semiconductor 151 by the step illustrated in FIG. 35(B) in the process of manufacturing the semiconductor device in FIG. 1(A).

Figure 49A:
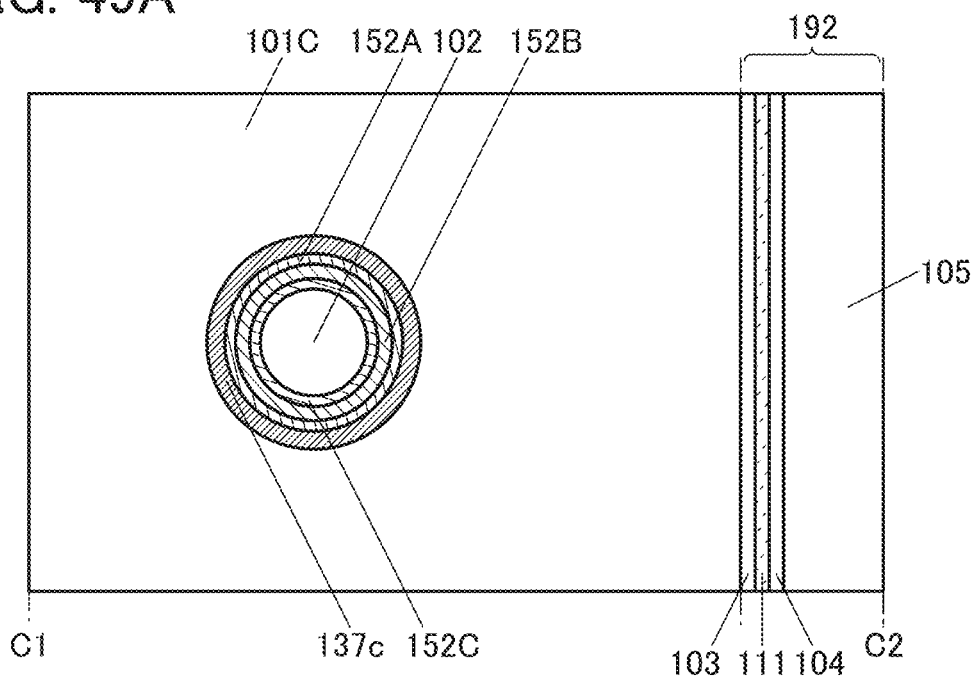
FIG. 49 Top views for illustrating a manufacturing example of a semiconductor device.
Figure 49B:
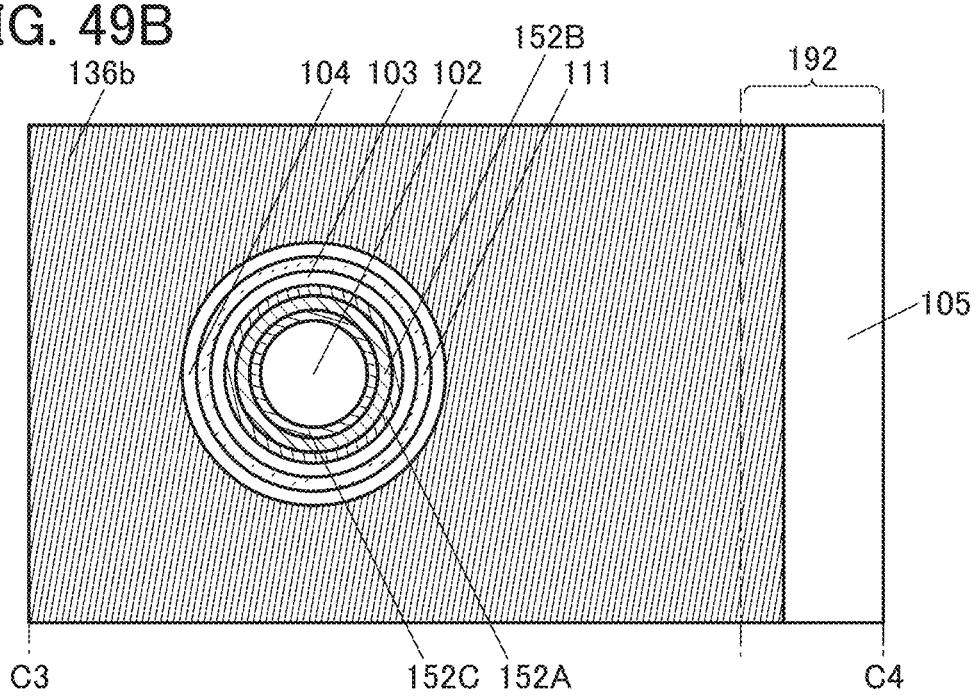

Note that FIGS. 49(A) and 49(B) are top views of the semiconductor device illustrated in FIG. 48 along the dashed-dotted line C1-C2 and the dashed-dotted line C3-C4, respectively. The semiconductor device illustrated in FIG. 48 is a structure example of the semiconductor layer having a three-layer structure obtained by sequential deposition of the semiconductor 152A, the semiconductor 152B, and the semiconductor 152C from the outer side; therefore, the top views in FIGS. 49(A) and 49(B) have structures in which the semiconductor 151 illustrated in FIGS. 44(A) and 44(B) has three-layer structures, respectively.

Note that the description of the semiconductor 152A, the semiconductor 152B, and the semiconductor 152C made in Manufacturing method example 1 is referred to for the semiconductor 152A, the semiconductor 152B, and the semiconductor 152C. Moreover, the description of FIG. 22 made in Manufacturing method example 1 is referred to for the effects of constituting the semiconductor device illustrated in FIG. 48.

Figure 50A:
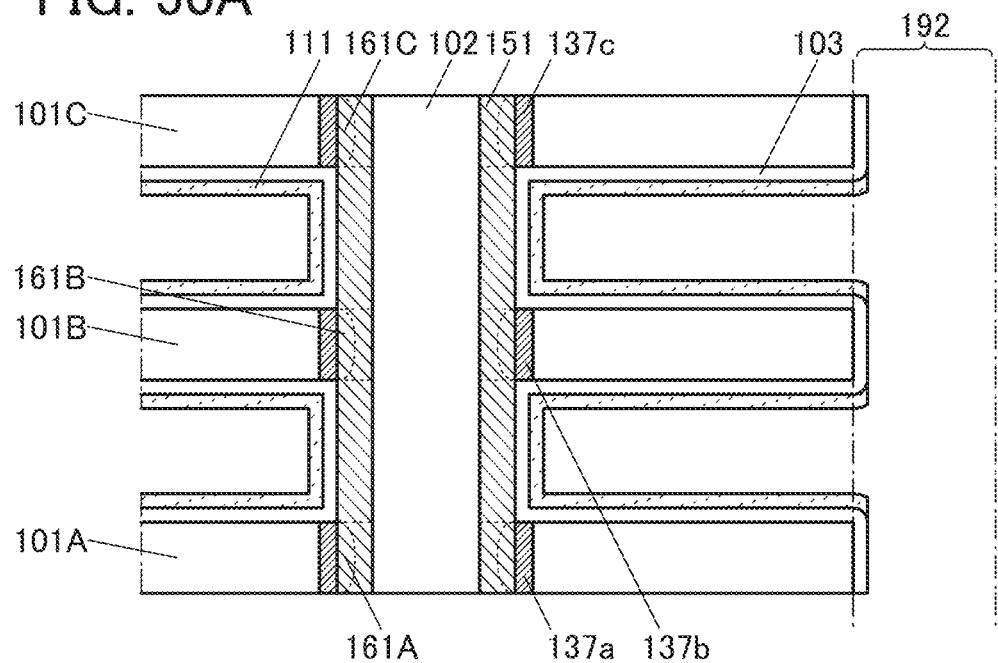
FIG. 50 Cross-sectional views for illustrating a manufacturing example of a semiconductor device.
Figure 50B:
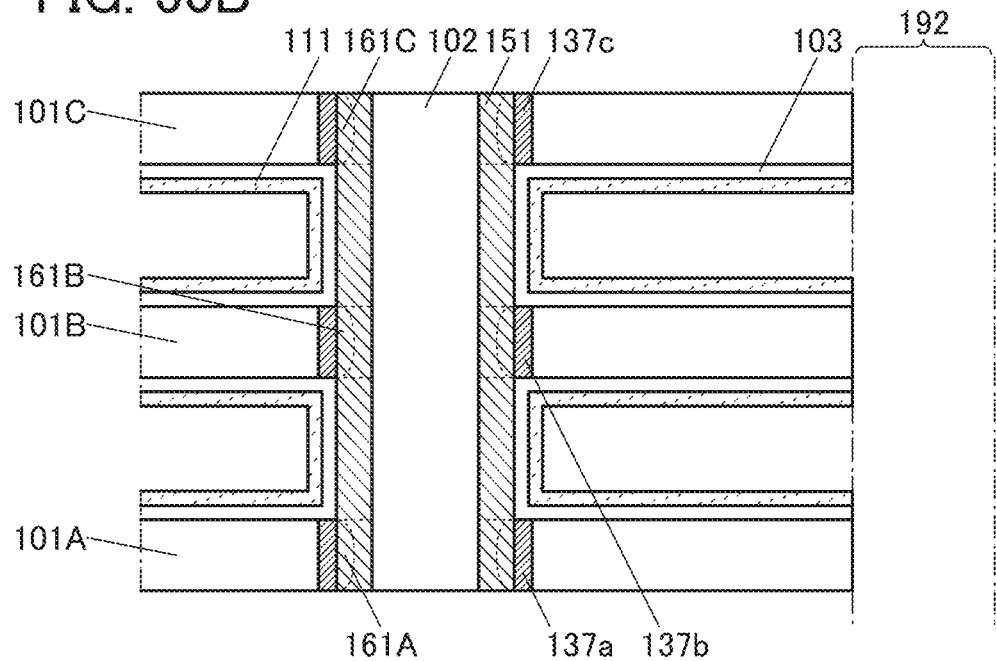

In the semiconductor device illustrated in FIG. 43, the structure in which the insulator 111 is deposited on the entire formation surface of the insulator 103 is used, for example; alternatively, in one embodiment of the present invention, the insulator 111 can be divided into the charge accumulation layers included in each of the cell transistors CTr. FIG. 50(A) illustrates a step of removing the insulator 111 included in the slit 192 by resist mask formation and etching treatment, or the like after the step illustrated in FIG. 41(A) so that the insulator 111 remains only on the formation surface of the insulator 103 in the aforementioned recess portion 196A and recess portion 196B. Alternatively, in the step of removing the insulator 111, regions of the insulator 103 which are exposed at the slit 192 may also be removed as illustrated in FIG. 50(B) depending on the case or according to circumstances. Subsequently, steps similar to those in from FIG. 41(B) to FIG. 43 are performed, whereby a semiconductor device illustrated in FIG. 51(A) can be constituted.

Figure 51A:
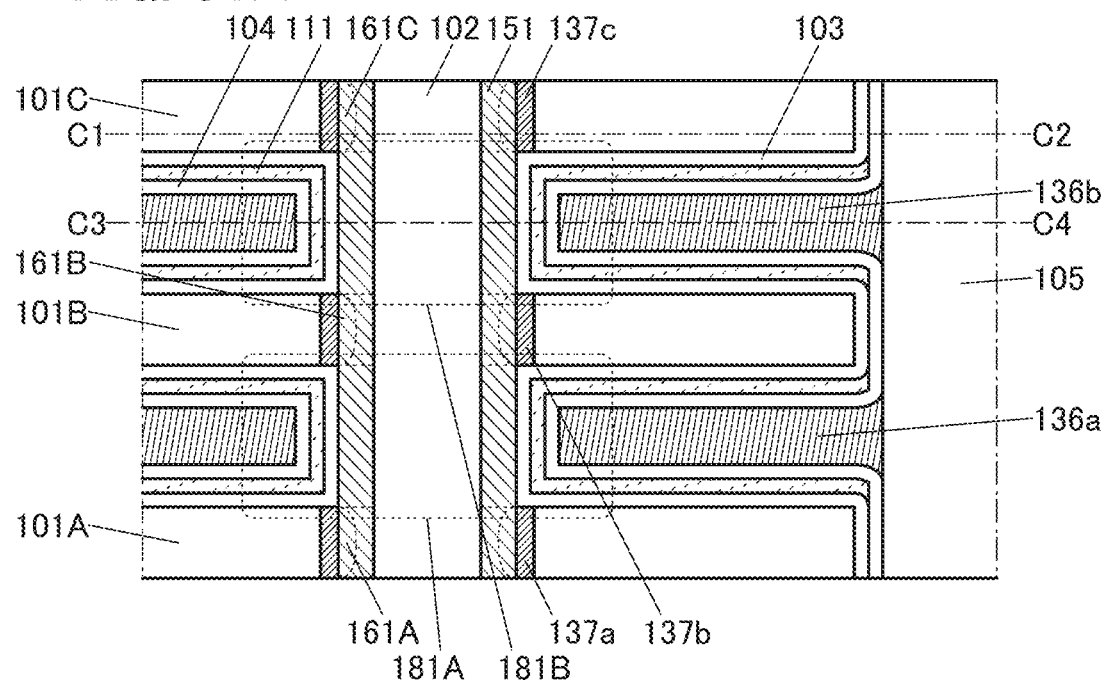
FIG. 51 A cross-sectional view and a top view for illustrating a manufacturing example of a semiconductor device.
Figure 51B:
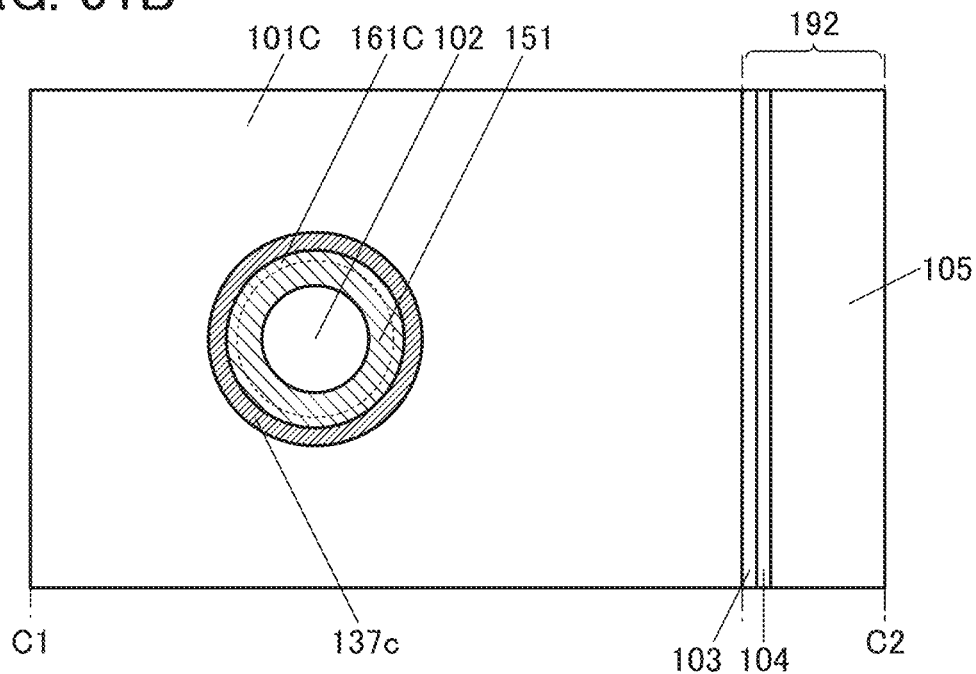

Note that FIG. 51(B) is a top view of the semiconductor device illustrated in FIG. 51(A) along the dashed-dotted line C1-C2. In the semiconductor device illustrated in FIG. 51(A), the insulator 111 in a region that overlaps the region 151a of the semiconductor 151 with the conductor 137a (the conductor 137b, the conductor 137c) therebetween has been removed; hence, the top view of FIG. 51(B) illustrates a structure without the insulator 111 between the insulator 103 and the insulator 104. The top view in FIG. 51(A) along the dashed-dotted line B3-B4 is in some cases approximately the same as that in FIG. 44(B).

Figure 52A:
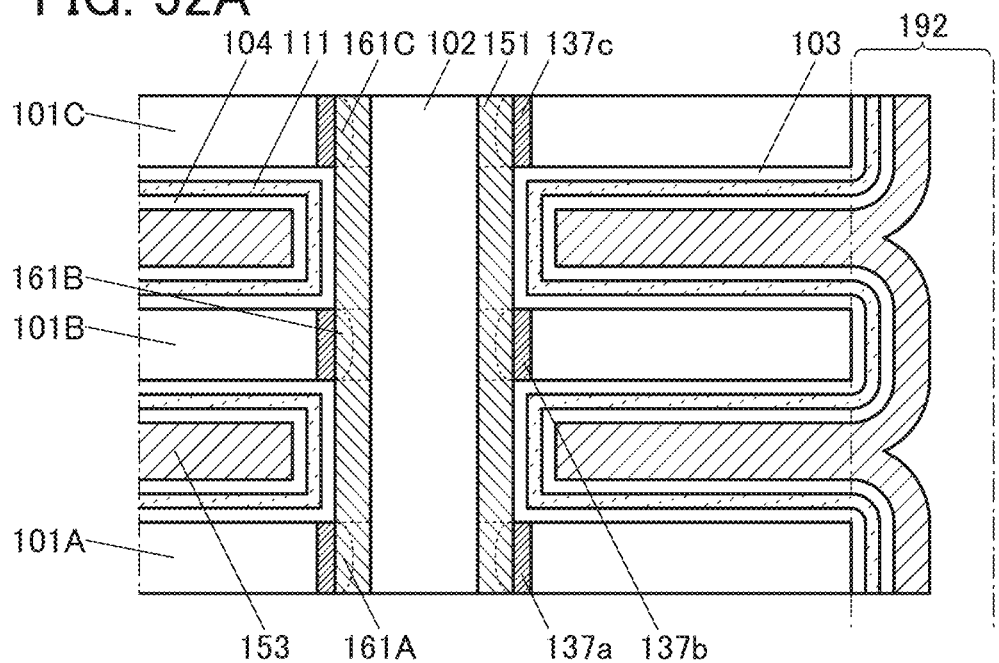
FIG. 52 Cross-sectional views for illustrating a manufacturing example of a semiconductor device.
Figure 52B:
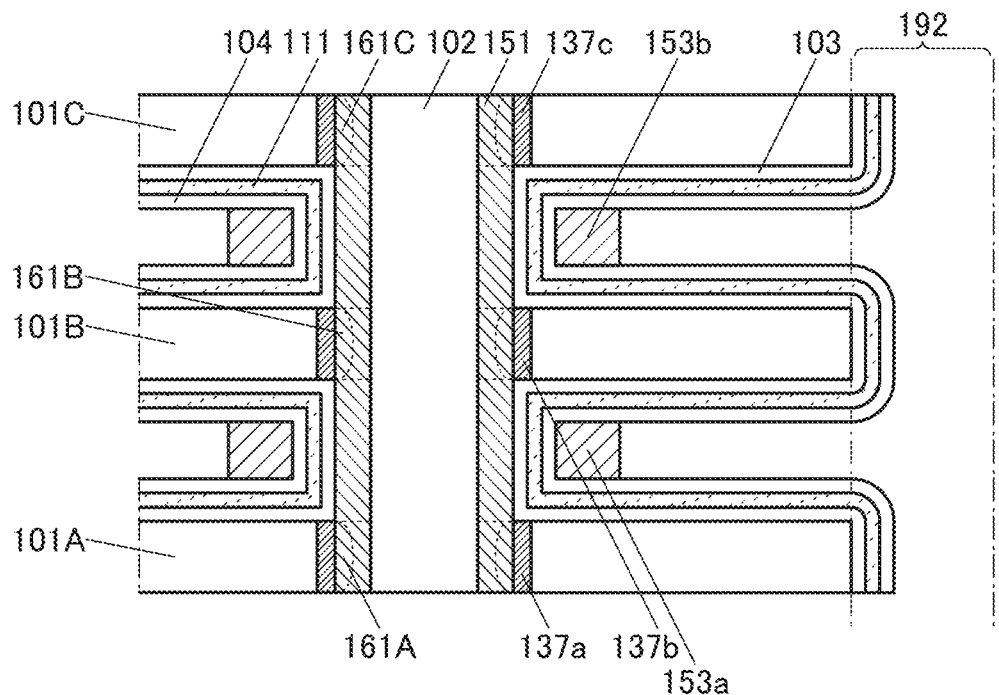
Figure 53A:
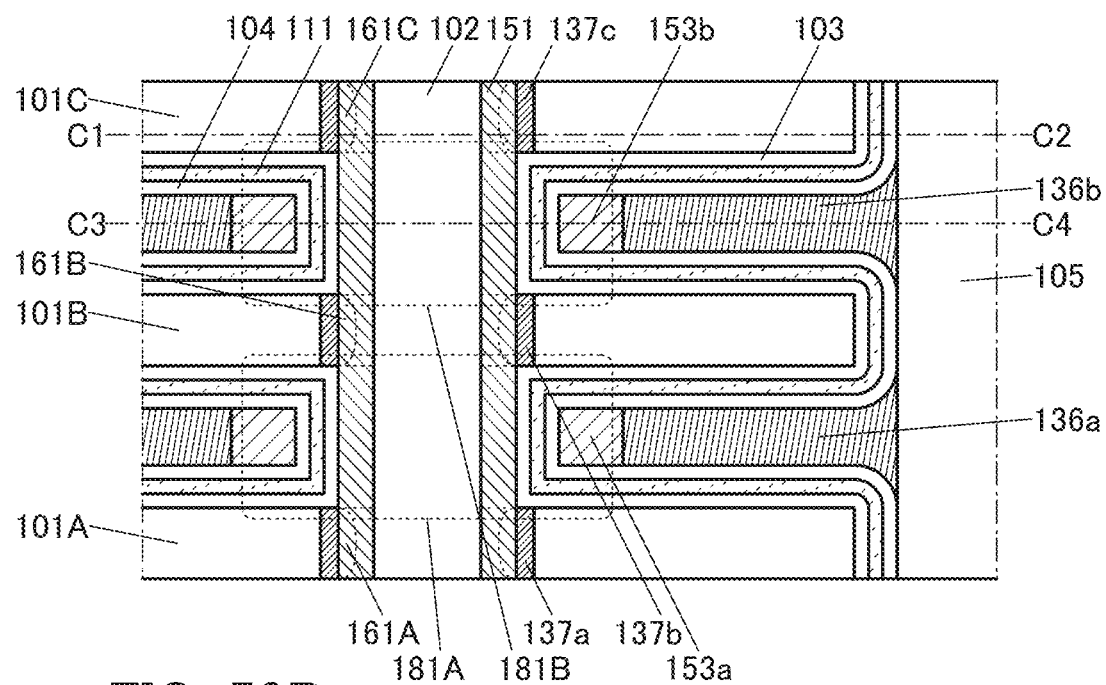
FIG. 53 A cross-sectional view and a top view for illustrating a manufacturing example of a semiconductor device.

For example, in one embodiment of the present invention, the structure of the gate electrode of the cell transistor CTr may be changed from the structure illustrated in FIG. 43 in order to improve the reliability of the cell transistor CTr. FIGS. 52(A) and 52(B) and FIG. 53(A) show an example of a method for manufacturing such a semiconductor device. In FIG. 52(A), the semiconductor 153 is deposited on the formation surface of the insulator 104 which is deposited on the side surface of the slit 192 and in the recess portion 196A and the recess portion 196B in FIG. 41(B).

For the semiconductor 153, a material containing a metal oxide which will be described in Embodiment 3 is used, for example. Note that a material usable for the semiconductor 153 is not limited thereto. For example, a material other than a metal oxide can be used for the semiconductor 153 in some cases. Alternatively, for example, a conductor or an insulator can be used as an alternative to the semiconductor 153 in some cases.

In the next step, as illustrated in FIG. 52(B), part of the remaining semiconductor 153 in the aforementioned recess portion 196A and recess portion 196B and the semiconductor 153 included in the slit 192 are removed by resist mask formation and etching treatment, or the like so that the semiconductor 153 remains in part of the recess portion 196A and the recess portion 196B. Thus, the semiconductor 153a and the semiconductor 153b are formed.

Subsequently, steps similar to those in from FIG. 42(A) to FIG. 43 are performed, whereby a semiconductor device illustrated in FIG. 53(A) can be constituted.

Figure 53B:
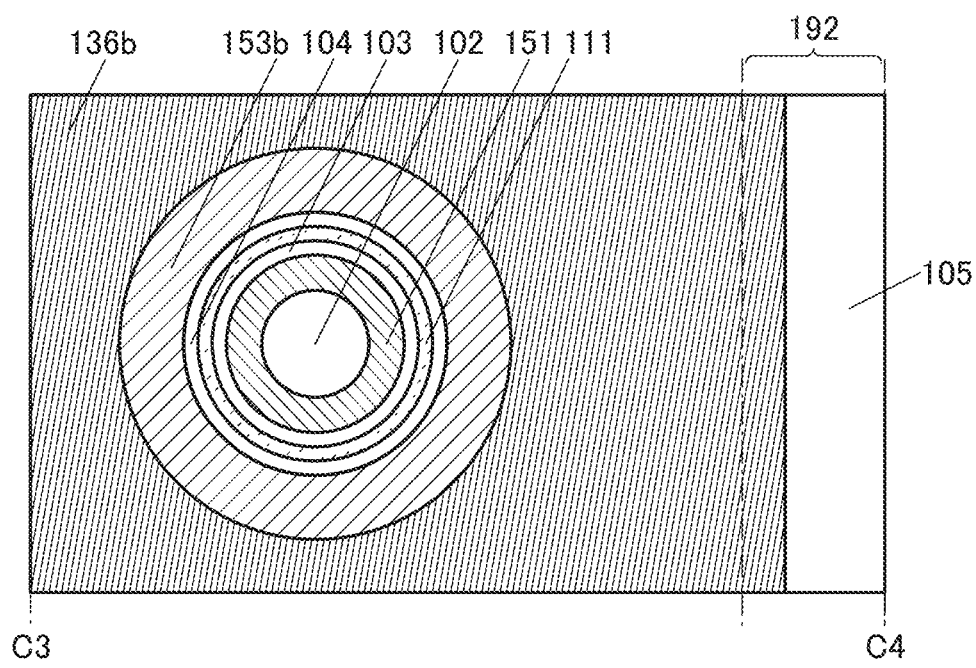

Note that FIG. 53(B) is a top view of the semiconductor device illustrated in FIG. 53(A) along the dashed-dotted line C3-C4. In the semiconductor device illustrated in FIG. 53(A), the semiconductor 153a (the semiconductor 153b) is included between the conductor 136a (the conductor 136b) and the insulator 104 in the region 151a of the semiconductor 151; hence, the top view in FIG. 53(B) illustrates a structure in which the semiconductor 153b is included between the conductor 136b and the insulator 104. The top view in FIG. 53(A) along the dashed-dotted line C1-C2 is in some cases approximately the same as that in FIG. 44(A).

Note that the description of FIGS. 26(A) and 26(B) and FIG. 27 made in Manufacturing method example 1 is referred to for the effects of constituting the semiconductor device illustrated in FIG. 53(A).

Figure 54A:
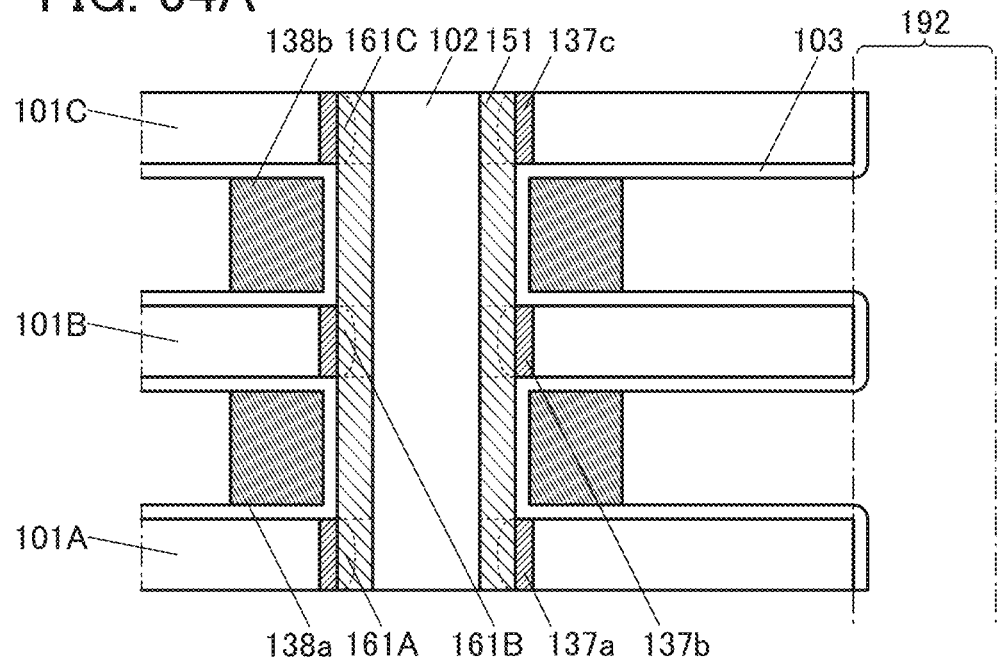
FIG. 54 Cross-sectional views for illustrating a manufacturing example of a semiconductor device.
Figure 54B:
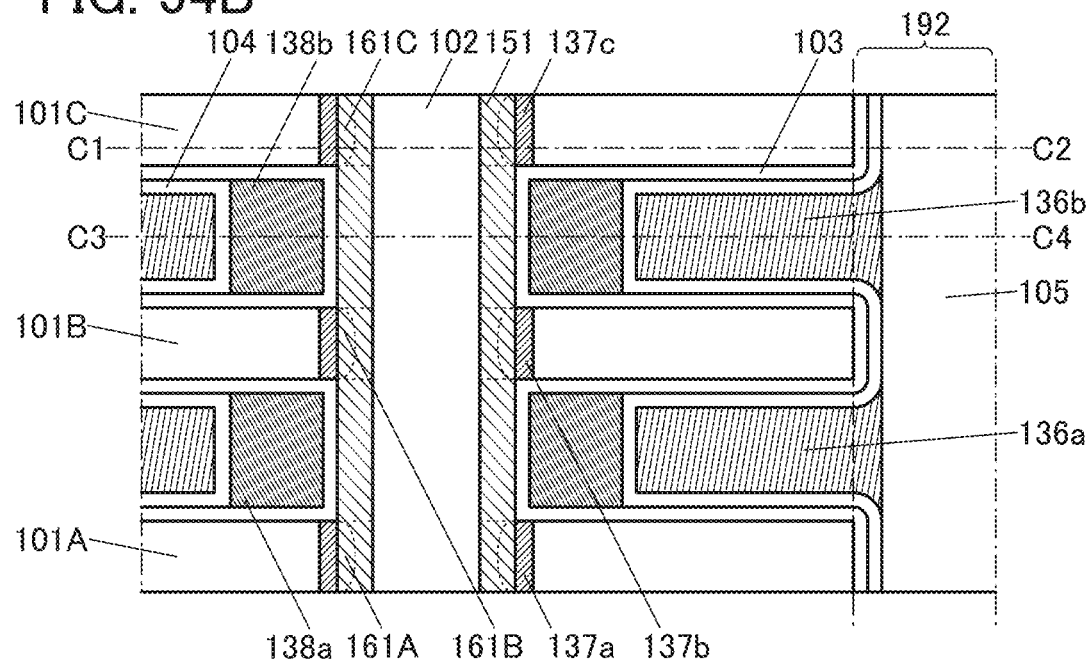

For example, in one embodiment of the present invention, a floating gate may be used instead of the insulator 111 usable for the charge accumulation layer. FIGS. 54(A) and 54(B) show an example of a manufacturing method thereof. In FIG. 54(A), the conductor 138a and the conductor 138b are formed in part of the recess portion 197A and part of the recess portion 197B, respectively, in FIG. 40. As a method for forming the conductor 138a and the conductor 138b, a conductive material to be the conductor 138a and the conductor 138b is deposited in the slit 192, the recess portion 197A, and the recess portion 197B and is then removed by resist mask formation and etching treatment, or the like so that the conductor 138a and the conductor 138b remain in part of the recess portion 197A and part of the recess portion 197B, respectively. Subsequently, the steps similar to those in from FIG. 41(B) to FIG. 43 are performed, whereby a semiconductor device illustrated in FIG. 54(B) can be constituted.

Figure 55:
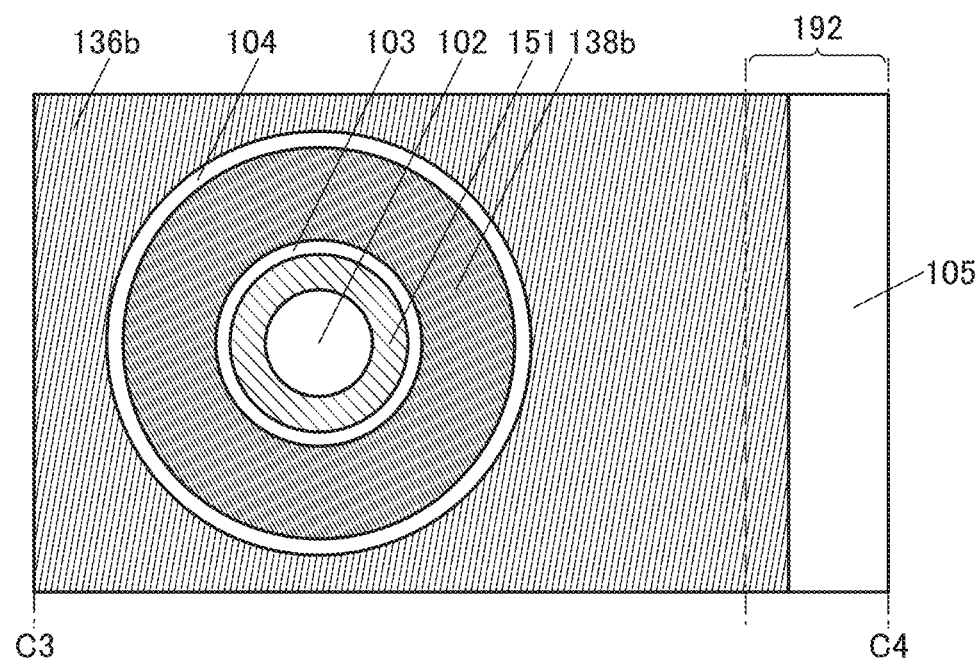
FIG. 55 A top view for illustrating a manufacturing example of a semiconductor device.

Note that FIG. 55 is a top view of the semiconductor device illustrated in FIG. 54(B) along the dashed-dotted line C3-C4. In the semiconductor device illustrated in FIG. 54(B), the conductor 138a (the conductor 138b) is included between the insulator 103 and the insulator 104 in a region that overlaps the region 151a of the semiconductor 151; hence, the top view in FIG. 55 illustrates a structure in which the conductor 138b is included between the insulator 103 and the insulator 104. The top view in FIG. 54(B) along the dashed-dotted line C1-C2 is in some cases approximately the same as that in FIG. 51(B).

For the conductor 138a and/or the conductor 138b, any of the materials usable for the aforementioned conductor 136 can be used, for example. Note that a material usable for the conductor 138a and/or the conductor 138b is not limited thereto. An insulator, a semiconductor, or the like can be used as an alternative to the conductor 138a and/or the conductor 138b in some cases.

Figure 56A:
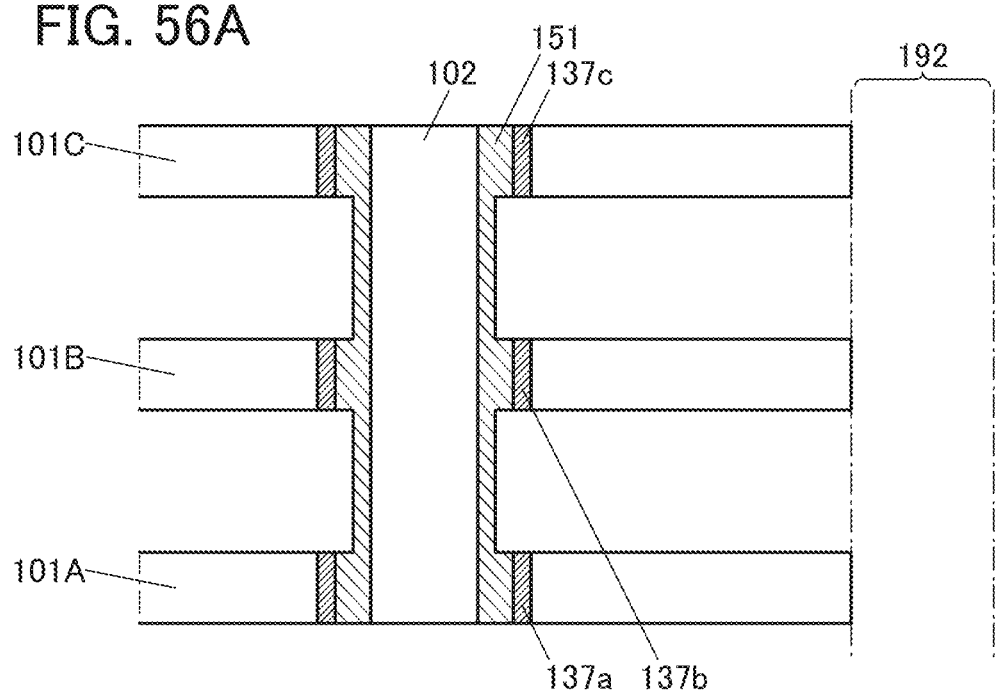
FIG. 56 Cross-sectional views for illustrating a manufacturing example of a semiconductor device.
Figure 56B:
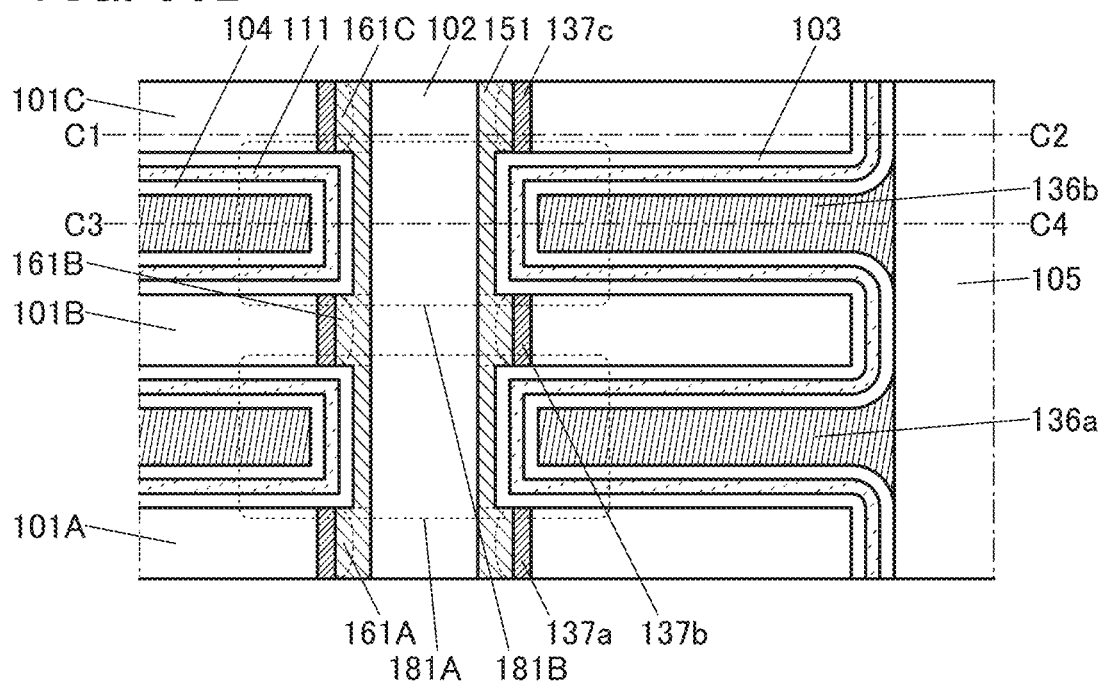

In addition, in one embodiment of the present invention, a structure in which the thickness of the channel formation region of the cell transistor CTr is reduced can be employed, for example. FIGS. 56(A) and 56(B) show an example of a method for manufacturing such a semiconductor device. In FIG. 56(A), after the sacrificial layer 141A and the sacrificial layer 141B are removed in FIG. 39(A), the surface of the semiconductor 151 is removed by etching treatment or the like. Accordingly, the thickness of the semiconductor 151 included in the region 151a gets smaller than the thickness of the semiconductor 151 included in the region 151b. This step is effective in the case where an impurity region is formed on the surface of the semiconductor 151, and the above step enables the impurity region to be removed; accordingly, the region 151a of the semiconductor 151 can have higher resistance.

The thickness of the semiconductor 151 which is removed in the region 151a may also be, for example, 30 nm or more and 60 nm or less of the deposited semiconductor 151, ⅕ or more and ½ or less the thickness of the deposited semiconductor 151, ⅕ or more and ½ or less the thickness of the insulator 103 which is deposited later, or ⅕ or more and ½ or less the thickness of the conductor 137a (the conductor 137b, the conductor 137c). Note that the thickness of the deposited semiconductor 151 is at least larger than the thickness of the semiconductor 151 which is removed in the region 151a. Subsequently, steps similar to those in from FIG. 39(B) to FIG. 43 are performed, whereby a semiconductor device illustrated in FIG. 56(B) can be constituted.

Figure 57A:
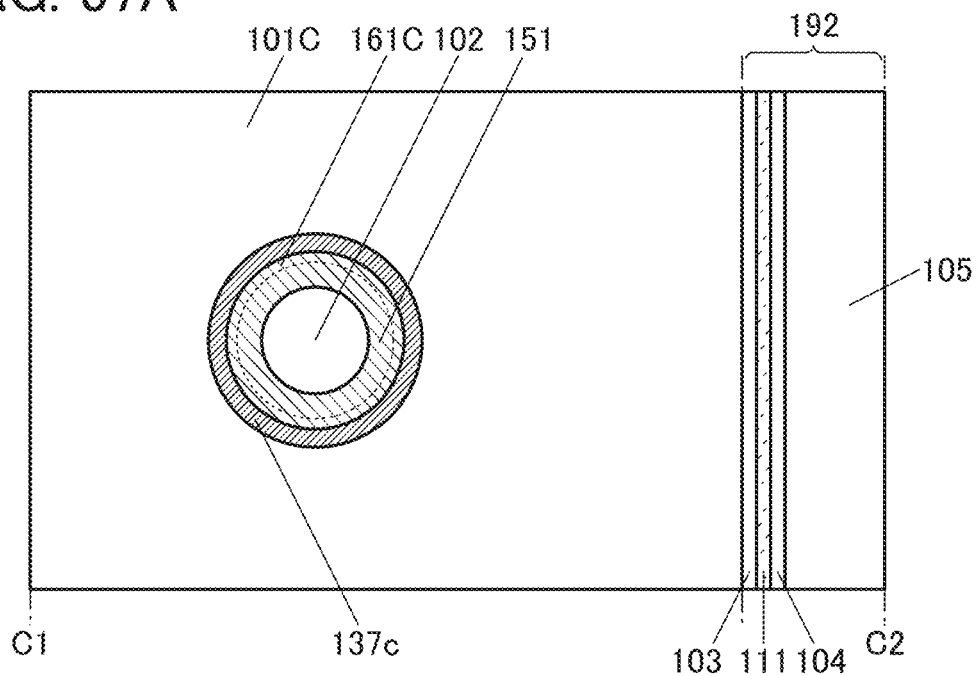
FIG. 57 Top views for illustrating a manufacturing example of a semiconductor device.
Figure 57B:
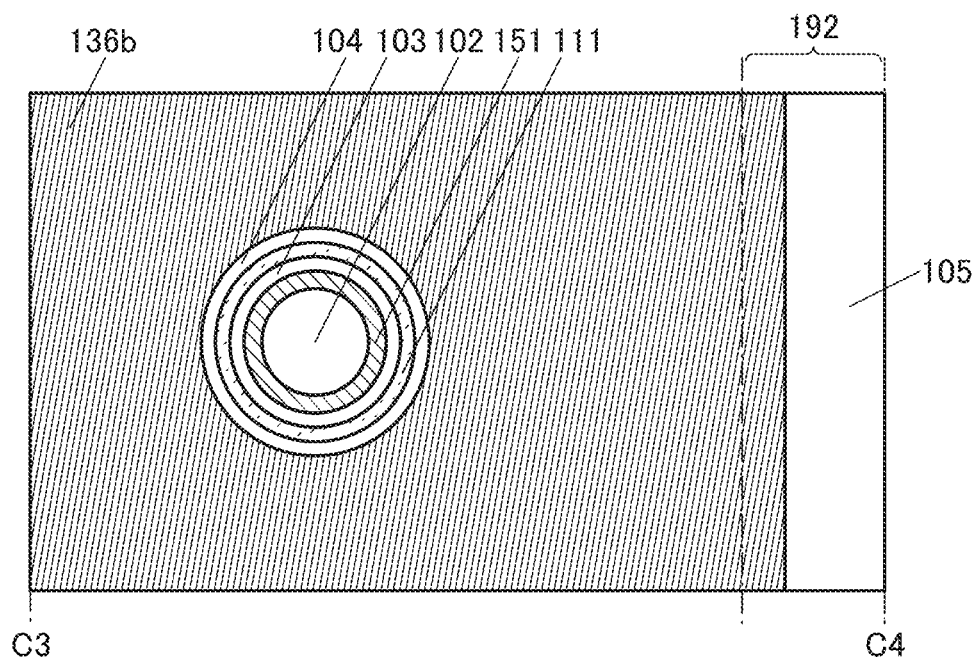

Note that FIGS. 57(A) and 57(B) are top views of the semiconductor device illustrated in FIG. 56(B) along the dashed-dotted line C1-C2 and the dashed-dotted line C3-C4, respectively. In the semiconductor device illustrated in FIG. 56(B), the thickness of the semiconductor 151 in the region 151a is smaller than the thickness of the semiconductor 151 in the region 151b; therefore, the semiconductor 151 in the top view in FIG. 57(B) is thinner than the semiconductor 151 in the top view in FIG. 57(A).

Figure 58A:
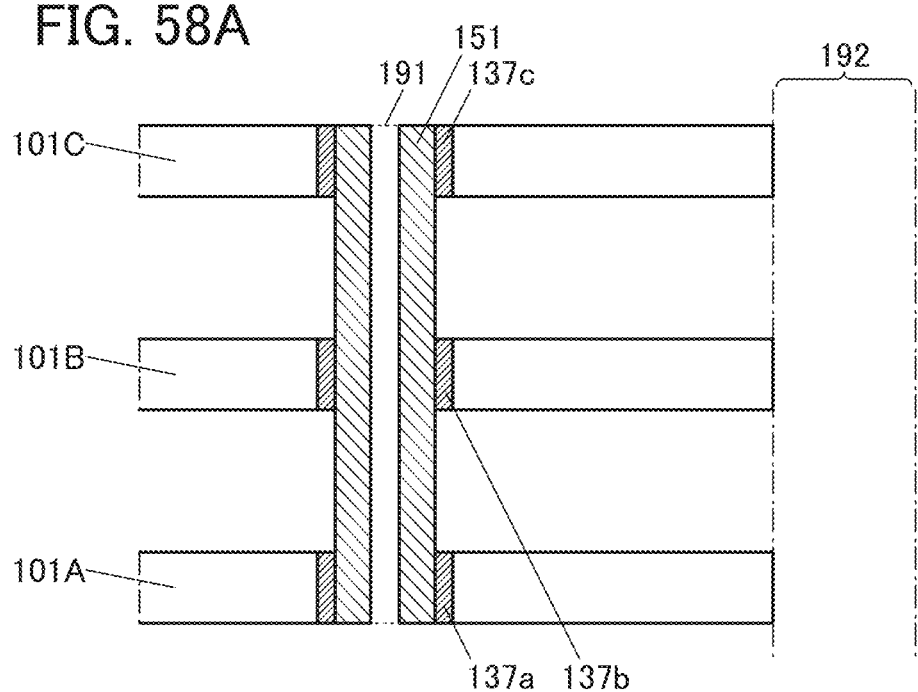
FIG. 58 Cross-sectional views for illustrating a manufacturing example of a semiconductor device.

For example, the manufacturing order of the semiconductor device of one embodiment of the present invention is not limited to the order of the above steps illustrated in FIGS. 8(A) and 8(B), from FIG. 35(A) to FIG. 36(A), and from FIG. 38(A) to FIG. 43, and the steps may be interchanged to manufacture a semiconductor device. A step illustrated in FIG. 58(A) is a step in which the step of forming the insulator 102 is not performed in FIG. 36(A) but the sacrificial layer 141A and the sacrificial layer 141B are removed first. Note that in the case of manufacturing a semiconductor device in this manufacturing order, the size of the opening 191 formed is preferably smaller than that of the opening 191 formed in other manufacturing steps.

Figure 58B:
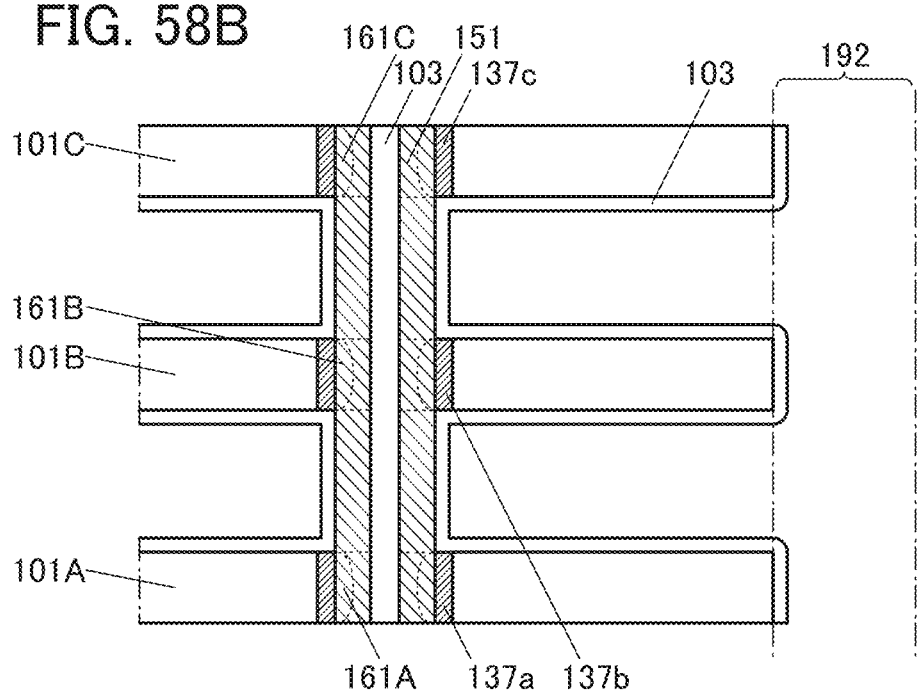

In the next step, as in the step illustrated in FIG. 39(B), treatment for supplying an impurity, oxygen, or the like from the opening 191 and the slit 192 is performed in the step illustrated in FIG. 58(A). Accordingly, a high-resistance region can be formed on the surface or around the surface of the exposed semiconductor 151. Then, the insulator 103 is deposited on the side surface of the slit 192 and in the recess portions and the opening 191, so that a structure illustrated in FIG. 58(B) is obtained. Subsequently, steps similar to those in from FIG. 41(A) to FIG. 43 are performed, whereby the semiconductor device illustrated in FIG. 1(A) can be constituted.

According to Manufacturing method example 1 or Manufacturing method example 2 described above, a semiconductor device capable of retaining a large amount of data can be manufactured.

Figure 59:
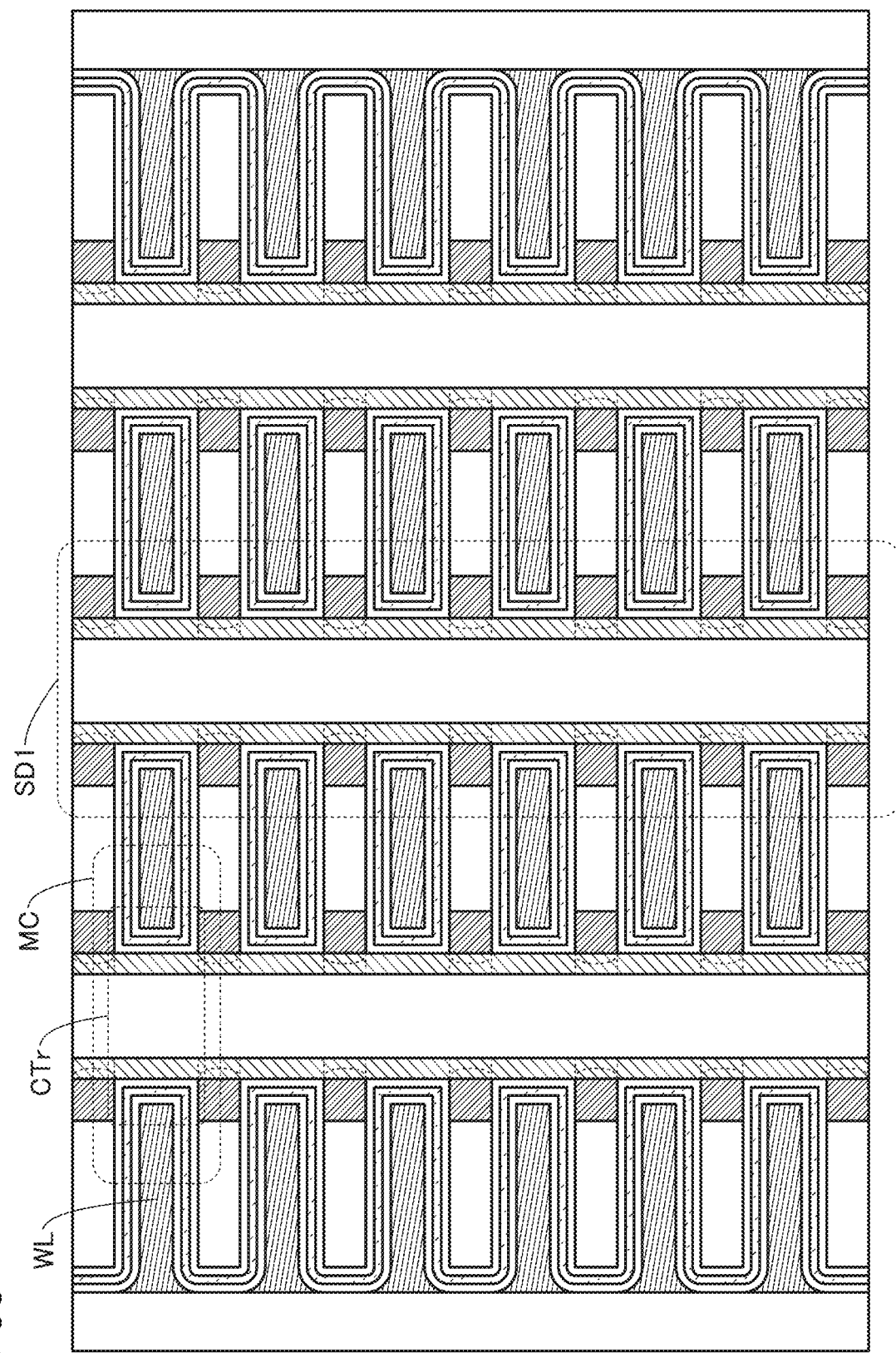
FIG. 59 A cross-sectional view for illustrating a semiconductor device.
Figure 60:
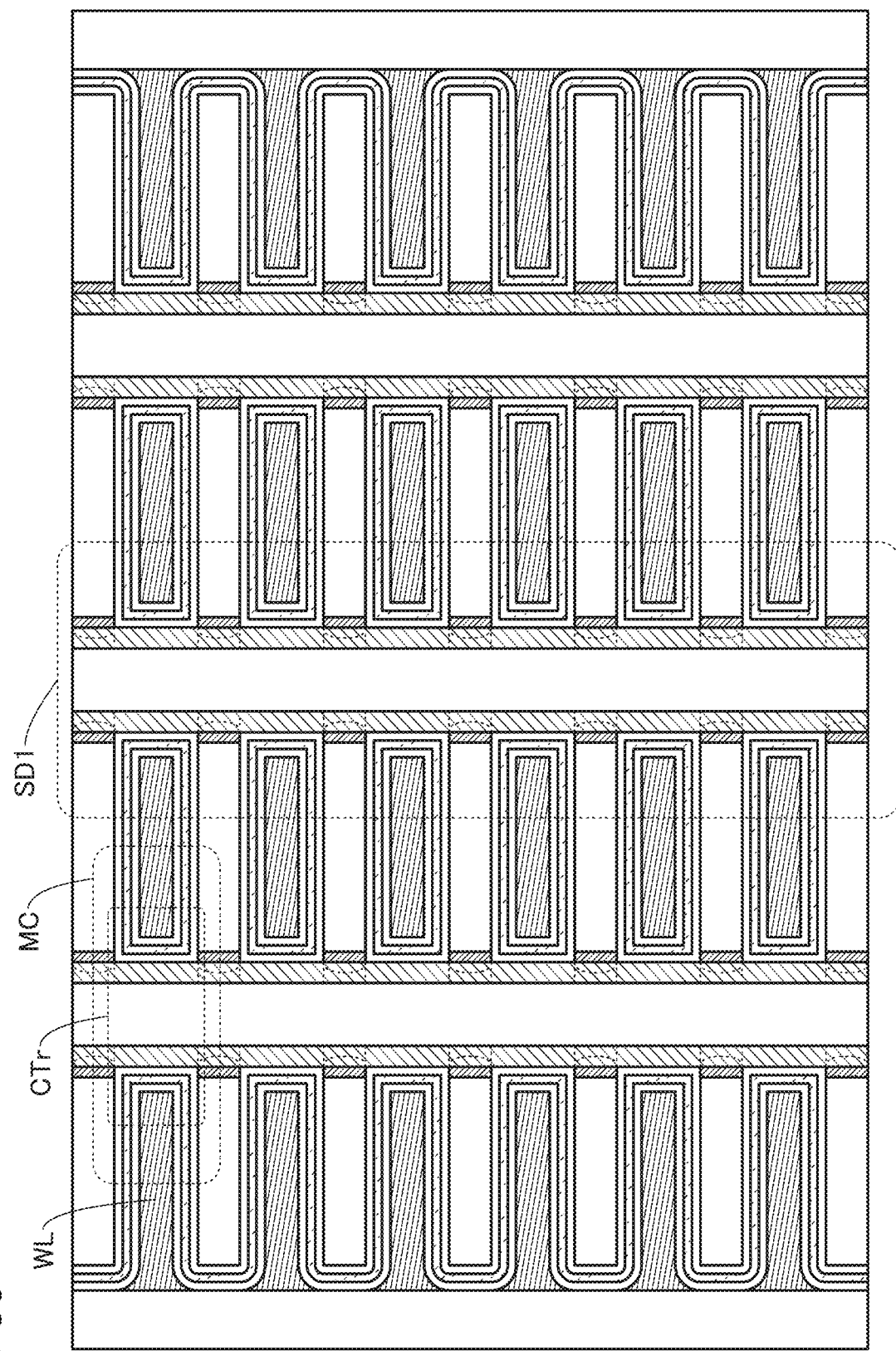
FIG. 60 A cross-sectional view for illustrating a semiconductor device.

Here, FIG. 59 illustrates a structure example in the case where the cross-sectional view of the semiconductor device illustrated in FIG. 17(B) (with the circuit configuration in FIG. 1(A)) has the cell array structure illustrated in FIG. 2. Similarly, FIG. 60 illustrates a structure example in the case where the cross-sectional view of the semiconductor device illustrated in FIG. 43 (with the circuit configuration in FIG. 1(A)) has the cell array structure. Note that the region SD1 corresponds to the region SD1 illustrated in FIG. 6(A). As illustrated in FIG. 59 and FIG. 60, an opening is provided at a time to penetrate a structure body in which the conductors serving as the wirings WL and the insulators are stacked, and the manufacturing process is performed according to the description in Manufacturing method example 1 and Manufacturing method example 2 described above, whereby the circuit configuration in FIG. 1(A) can be achieved.

<Connection Examples with Peripheral Circuit>

Figure 61A:
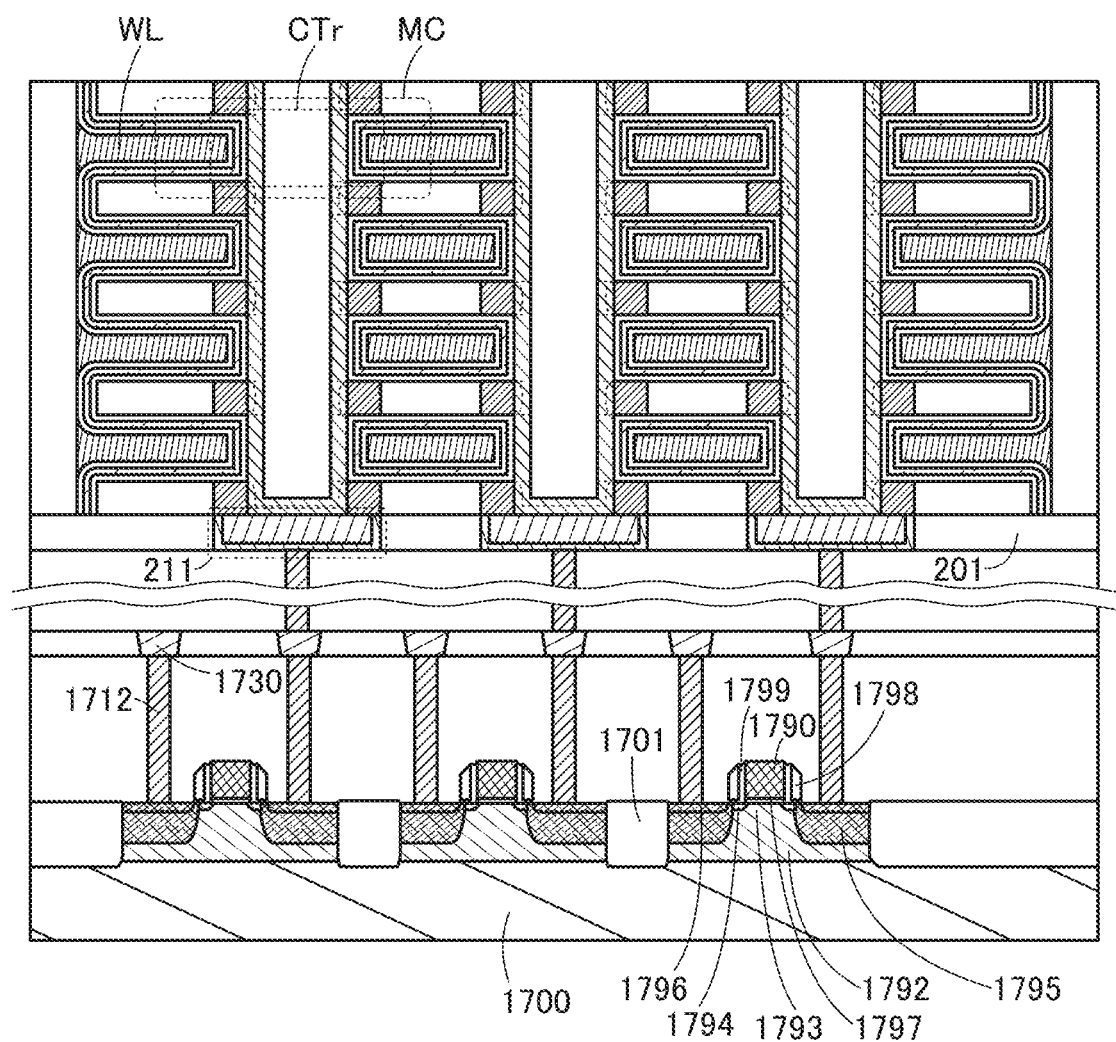
FIG. 61 Cross-sectional views for illustrating a semiconductor device.
Figure 62A:
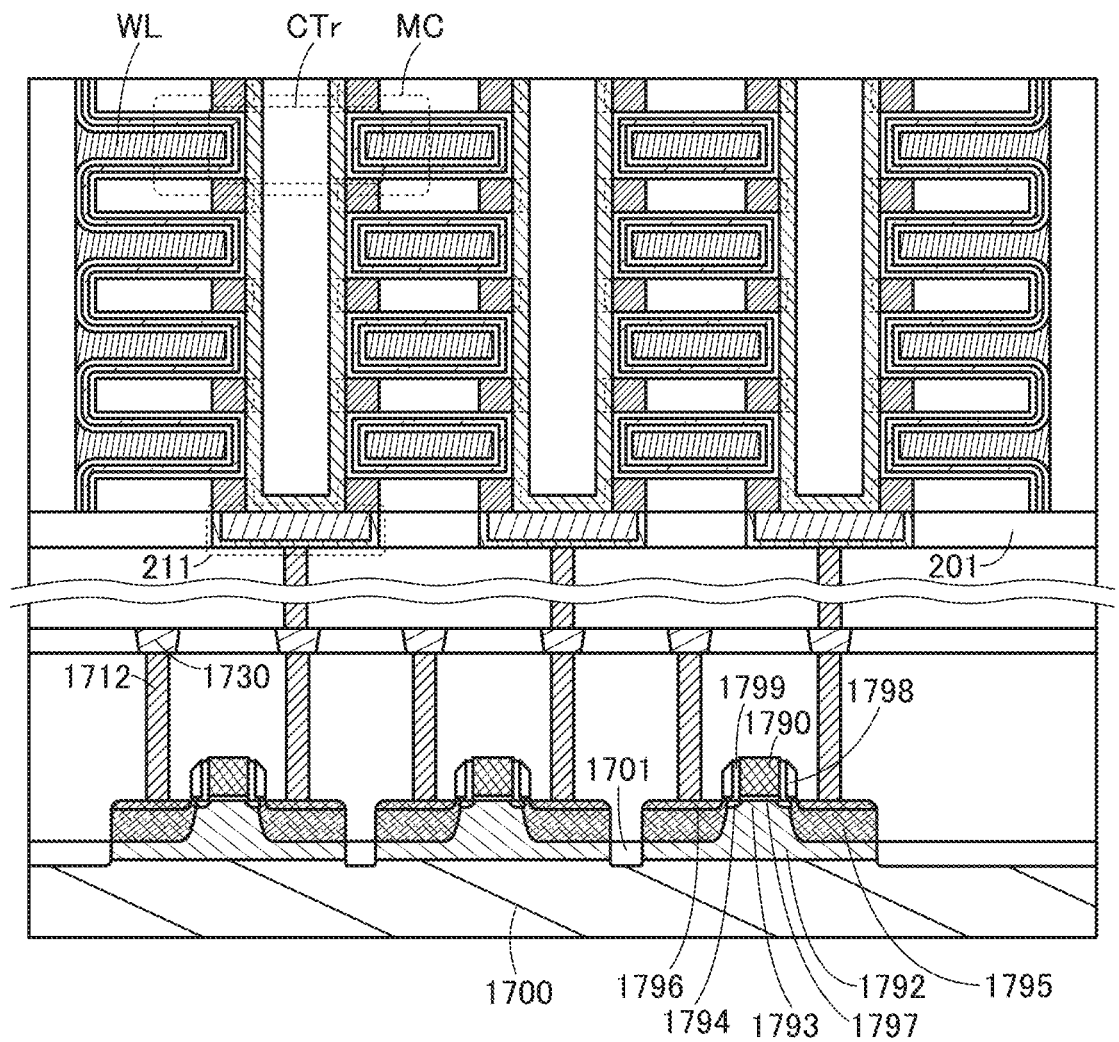
FIG. 62 Cross-sectional views for illustrating a semiconductor device.

A peripheral circuit for the memory cell array, such as a read out circuit or a precharge circuit, may be provided below the semiconductor device shown in Manufacturing method example 1 or Manufacturing method example 2. In this case, Si transistors are formed on a silicon substrate or the like to configure the peripheral circuit, and then the semiconductor device of one embodiment of the present invention is formed over the peripheral circuit according to Manufacturing method example 1 or Manufacturing method example 2. FIG. 61(A) is a cross-sectional view in which the peripheral circuit is configured with planar Si transistors and the semiconductor device of one embodiment of the present invention is formed thereover. FIG. 62(A) is a cross-sectional view in which the peripheral circuit is configured with FIN Si transistors and the semiconductor device of one embodiment of the present invention is formed thereover. Note that, as an example, the semiconductor device illustrated in each of FIG. 61(A) and FIG. 62(A) has the structure of FIG. 17(B).

In FIG. 61(A) and FIG. 62(A), the Si transistors configuring the peripheral circuit are formed on a substrate 1700. An element separation layer 1701 is formed between a plurality of Si transistors. Conductors 1712 are formed as a source and a drain of the Si transistor. A conductor 1730 is formed with extension in the channel width direction and connected to another Si transistor or the conductor 1712 (not illustrated).

As the substrate 1700, a single crystal semiconductor substrate or a polycrystalline semiconductor substrate of silicon or silicon carbide, a compound semiconductor substrate of silicon germanium, an SOI substrate, or the like can be used.

Moreover, a glass substrate, a quartz substrate, a plastic substrate, a metal substrate, a flexible substrate, an attachment film, paper containing a fibrous material, or a base film, for example, may be used as the substrate 1700. Alternatively, after a semiconductor element is formed using one substrate, the semiconductor element may be transferred to another substrate. As an example, FIG. 61(A) and FIG. 62(A) show examples in which a single crystal silicon wafer is used as the substrate 1700.

Figure 61B:
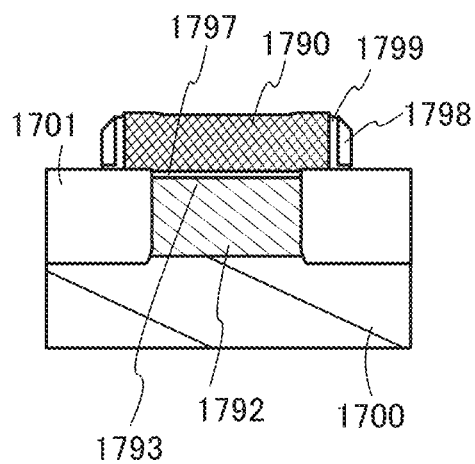

Here, the details of the Si transistors are described. FIG. 61(A) is a cross-sectional view of the planar Si transistor in the channel length direction, and FIG. 61(B) is a cross-sectional view of the planar Si transistor in the channel width direction. The Si transistor includes a channel formation region 1793 provided in a well 1792, low-concentration impurity regions 1794 and high-concentration impurity regions 1795 (also collectively referred to simply as impurity regions), conductive regions 1796 provided in contact with the impurity regions, a gate insulating film 1797 provided over the channel formation region 1793, a gate electrode 1790 provided over the gate insulating film 1797, and sidewall insulating layers 1798 and sidewall insulating layers 1799 provided on side surfaces of the gate electrode 1790. Note that for the conductive regions 1796, a metal silicide or the like may be used.

Figure 62B:
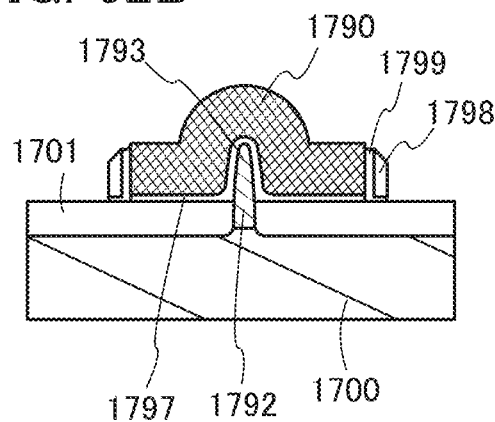

FIG. 62(A) is a cross-sectional view of the FIN Si transistor in the channel length direction, and FIG. 62(B) is a cross-sectional view of the FIN Si transistor in the channel width direction. In the Si transistor illustrated in FIGS. 62(A) and 62(B), the channel formation region 1793 has a projecting portion, and the gate insulating film 1797 and the gate electrode 1790 are provided along its side and top surfaces. Although the case where the projecting portion is formed by processing part of the semiconductor substrate is described in this embodiment, a semiconductor layer with a projecting shape may be formed by processing an SOI substrate.

An insulator 201 is formed above the circuit formed by the Si transistors, the conductor 1712, the conductor 1730, and the like over the substrate 1700. A conductor 211 for electrically connecting to the circuit is formed so as to be embedded in the insulator 201. In the case where a metal oxide is contained in the channel formation region of the cell transistor CTr, an insulator with barrier properties against hydrogen and the like is preferably used for the insulator 201 and the conductor 211. This is to inhibit diffusion of hydrogen from the Si transistor into the cell transistor CTr through the insulator 201 and/or the conductor 211.

Any of the above materials usable for the insulator 101A to the insulator 101C can be used for the insulator 201.

For example, tantalum nitride, which has barrier properties against hydrogen, is preferably used for the conductor 211. In addition, by stacking tantalum nitride and tungsten, which has high conductivity, the diffusion of hydrogen from the Si transistor can be inhibited while the conductivity as a wiring is kept.

Note that the reference numerals in FIGS. 62(A) and 62(B) are the same as the reference numerals in FIGS. 61(A) and 61(B).

Note that the insulators, the conductors, the semiconductors, and the like disclosed in this specification and the like can be formed by a PVD (Phisical Vapor Deposition) method or a CVD (Chemical Vapor Deposition) method. Examples of a PVD method include a sputtering method, a resistance heating evaporation method, an electron beam evaporation method, and a PLD (Pulsed Laser Deposition) method. The formation by a plasma CVD method or a thermal CVD method can be given as a CVD method. In particular, examples of a thermal CVD method include a MOCVD (Metal Organic Chemical Vapor Deposition) method and an ALD (Atomic Layer Deposition) method.

A thermal CVD method, which is a deposition method not using plasma, has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and they are made to react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after the introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and is thus suitable for manufacturing a minute FET.

A variety of films such as the metal film, the semiconductor film, and the inorganic insulating film disclosed in the above-described embodiment can be formed by a thermal CVD method such as a MOCVD method or an ALD method; for example, in the case of forming an In—Ga—Zn—O film, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can also be used instead of trimethylgallium and diethylzinc (Zn(C$_2$H$_5$)$_2$) can also be used instead of dimethylzinc.

For example, in the case where a hafnium oxide film is formed by a deposition apparatus using ALD, two kinds of gases, ozone (O$_3$) as an oxidizer and a source gas which is obtained by vaporizing liquid containing a solvent and a hafnium precursor compound (hafnium alkoxide or hafnium amide such as tetrakis(dimethylamide)hafnium (TDMAH, Hf[N(CH$_3$)$_2$]$_4$)), are used. Furthermore, examples of another material include tetrakis(ethylmethylamide)hafnium.

For example, in the case where an aluminum oxide film is formed by a deposition apparatus using ALD, two kinds of gases, H$_2$O as an oxidizer and a source gas which is obtained by vaporizing liquid containing a solvent and an aluminum precursor compound (trimethylaluminum (TMA, Al(CH$_3$)$_3$) or the like) are used. Furthermore, examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface on which a film is to be formed, and radicals of an oxidizing gas (O$_2$ or dinitrogen monoxide) are supplied to react with the adsorbate.

For example, in the case where a tungsten film is formed by a deposition apparatus using ALD, a WF$_6$ gas and a B$_2$H$_6$ gas are sequentially and repeatedly introduced to form an initial tungsten film, and then a WF$_6$ gas and an H$_2$ gas are sequentially and repeatedly introduced to form a tungsten film. Note that an SiH$_4$ gas may be used instead of a B$_2$H$_6$ gas.

For example, in the case where an oxide semiconductor film, for example, an In—Ga—Zn—O film, is formed by a deposition apparatus using ALD, an In(CH$_3$)$_3$ gas and an O$_3$ gas) are sequentially and repeatedly introduced to form an In—O layer, a Ga(CH$_3$)$_3$ gas and an O$_3$ gas) are sequentially and repeatedly introduced to form a GaO layer, and then a Zn(CH$_3$)$_2$ gas and an O$_3$ gas) are sequentially and repeatedly introduced to form a ZnO layer. Note that the order of these layers is not limited to this example. A mixed oxide layer such as an In—Ga—O layer, an In—Zn—O layer, or a Ga—Zn—O layer may be formed by using these gases. Note that although an H$_2$O gas which is obtained by bubbling water with an inert gas such as Ar may be used instead of an O$_3$ gas), it is preferable to use an O$_3$ gas), which does not contain H. Furthermore, instead of an In(CH$_3$)$_3$ gas, an In(C$_2$H$_5$)$_3$ gas may be used. Furthermore, instead of a Ga(CH$_3$)$_3$ gas, a Ga(C$_2$H$_5$)$_3$ gas may be used. Furthermore, a Zn(CH$_3$)$_2$ gas may be used.

Note that the structure examples of the semiconductor devices described in this embodiment can be combined with each other as appropriate.

Note that this embodiment can be combined as appropriate with the other embodiments shown in this specification.

Embodiment 2

In this embodiment, a memory device including the semiconductor device described in the foregoing embodiment will be described.

Figure 63:
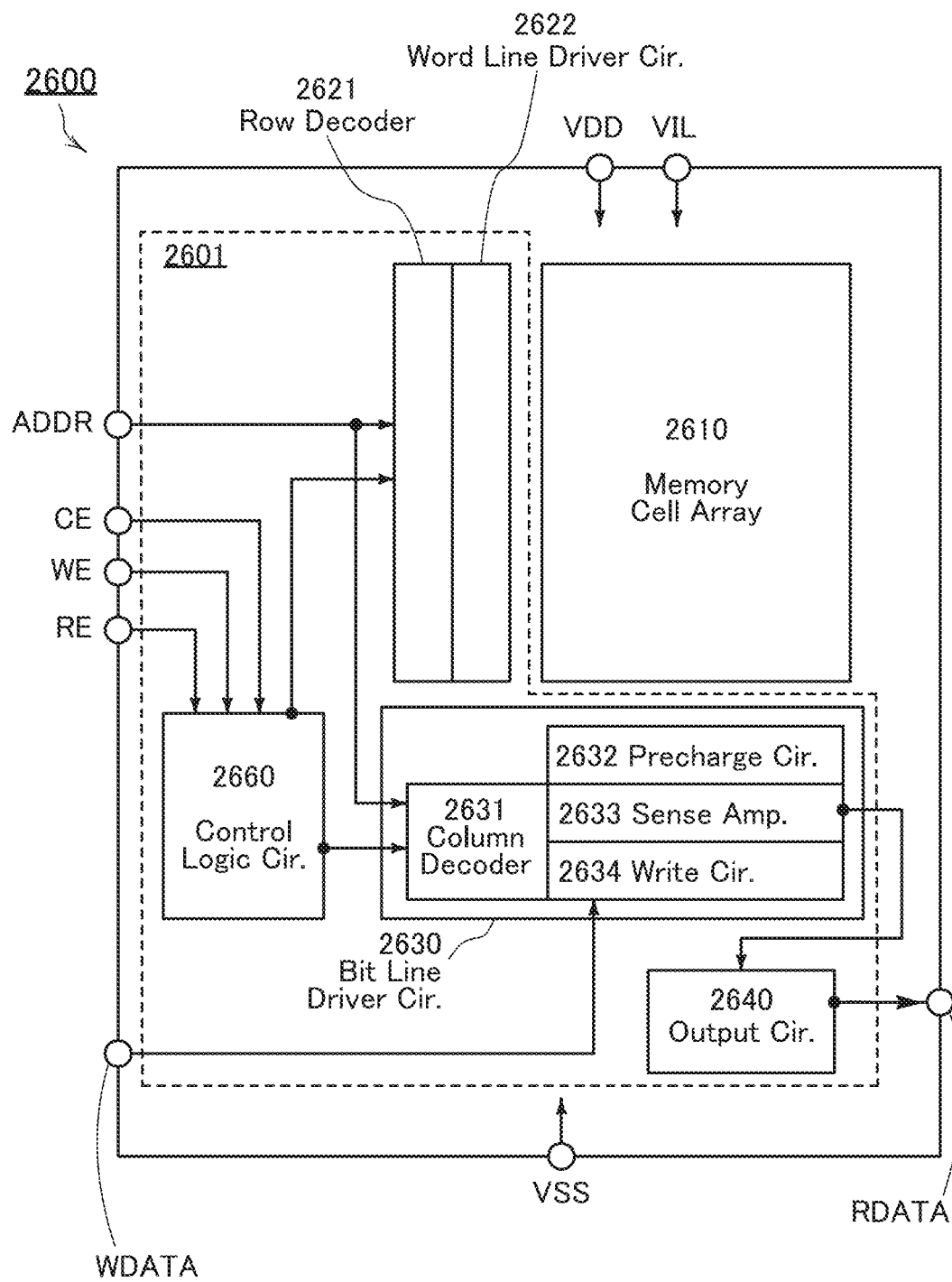
FIG. 63 A block diagram illustrating an example of a memory device.

FIG. 63 illustrates a configuration example of a memory device. A memory device 2600 includes a peripheral circuit 2601 and a memory cell array 2610. The peripheral circuit 2601 includes a row decoder 2621 (Row Decoder), a word line driver circuit 2622 (Word Line Driver Cir.), a bit line driver circuit 2630 (Bit Line Driver Cir.), an output circuit 2640 (Output Cir.), and a control logic circuit 2660 (Control Logic Cir.).

The semiconductor device illustrated in FIGS. 1(A) and 1(B) described in Embodiment 1 can be used for the memory cell array 2610.

The bit line driver circuit 2630 includes a column decoder 2631 (Column Decoder), a precharge circuit 2632 (Precharge Cir.), a sense amplifier 2633 (Sense Amp.), and a write circuit 2634 (Write Cir.). The precharge circuit 2632 has a function of precharging the wirings SL or the wirings BL (not illustrated in FIG. 63), which are described in Embodiment 1, to a predetermined potential. The sense amplifier 2633 has a function of obtaining a potential (or current) read out from the memory cell MC as a data signal and amplifying the data signal. The amplified data signal is output to the outside of the memory device 2600 as a digital data signal RDATA through the output circuit 2640.

As power supply voltages, a low power supply voltage (VSS), a high power supply voltage (VDD) for the peripheral circuit 2601, and a high power supply voltage (VIL) for the memory cell array 2610 are supplied to the memory device 2600 from the outside.

Control signals (CE, WE, RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. CE denotes a chip enable signal, WE denotes a write enable signal, and RE denotes a read-out enable signal. Signals processed by the control logic circuit 2660 are not limited to those listed above, and other control signals may be input as necessary.

Note that whether each circuit or each signal described above is provided or not can be determined as appropriate as needed.

When a p-channel Si transistor and a transistor whose channel formation region contains an oxide semiconductor described in the following embodiment (preferably an oxide containing In, Ga, and Zn) are used in the memory device 2600, the memory device 2600 having a small size can be provided. In addition, the memory device 2600 that can be reduced in power consumption can be provided. Furthermore, the memory device 2600 that can be increased in operating speed can be provided. Particularly when the Si transistors are only p-channel ones, the manufacturing cost can be reduced.

Note that the configuration example of this embodiment is not limited to the configuration illustrated in FIG. 63. The configuration may be changed as appropriate in such a manner that part of the peripheral circuit 2601, for instance, the precharge circuit 2632 and/or the sense amplifier 2633 is provided below the memory cell array 2610, for example.

Note that this embodiment can be combined as appropriate with the other embodiments shown in this specification.

Embodiment 3

In this embodiment, a metal oxide contained in a channel formation region of the OS transistor used in the foregoing embodiment will be described.

A metal oxide preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide is an In-M-Zn oxide containing indium, an element M, and zinc is considered. Note that the element M is aluminum, gallium, yttrium, tin, or the like. Other elements that is usable for the element M include boron, silicon, titanium, iron, nickel, germanium, zirconium, molybdenum, lanthanum, cerium, neodymium, hafnium, tantalum, tungsten, and magnesium. Note that a plurality of the above elements may be used in combination as the element M in some cases.

Preferred ranges of the atomic ratio of indium, the element M, and zinc contained in the metal oxide according to the present invention will be described with reference to FIGS. 64(A), 64(B), and 64(C). Note that the atomic ratio of oxygen is not shown in FIGS. 64(A), 64(B), and 64(C). In addition, the terms of the atomic ratio of indium, the element M, and zinc contained in the metal oxide are denoted by [In], [M], and [Zn], respectively.

Figure 64A:
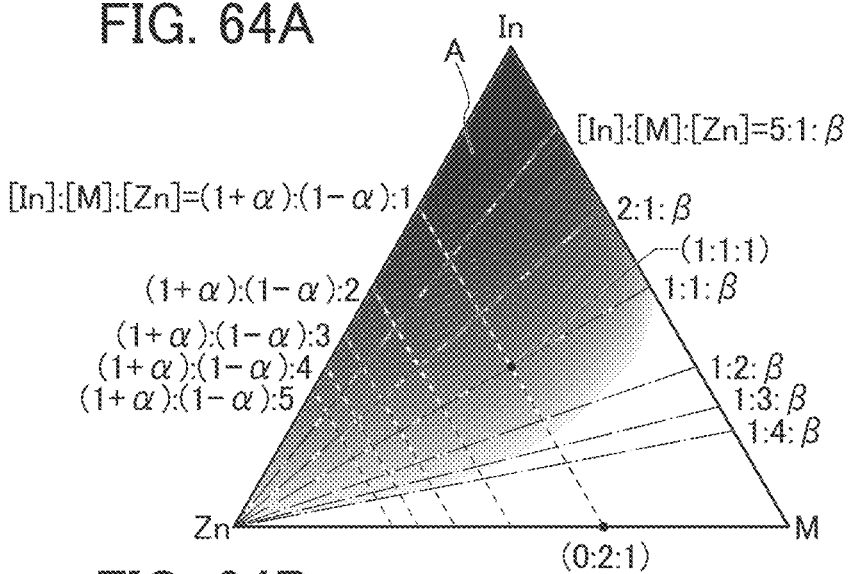
FIG. 64 Diagrams illustrating atomic ratio ranges of a metal oxide.
Figure 64B:
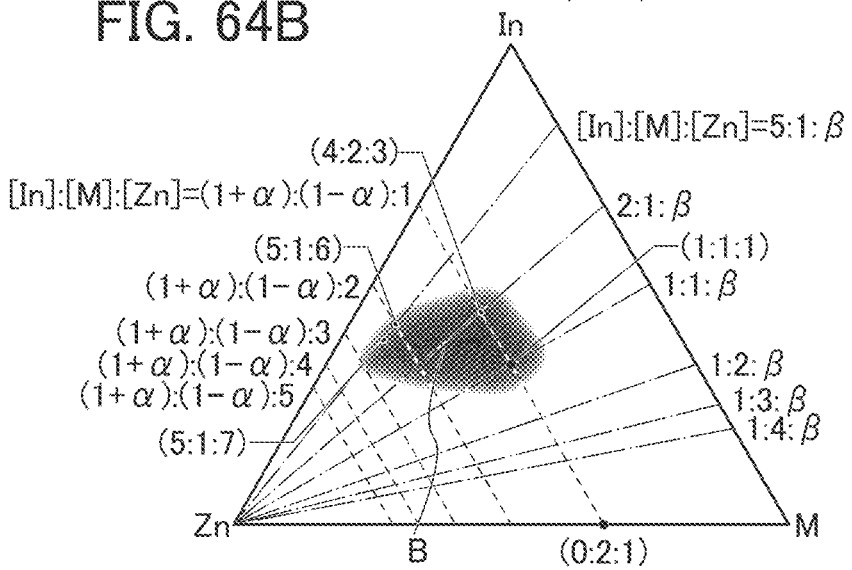
Figure 64C:
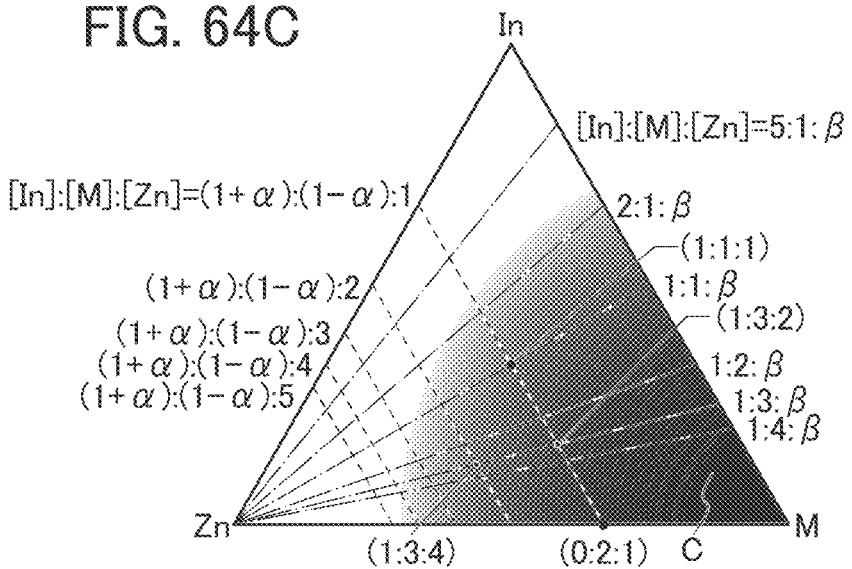

In FIGS. 64(A), 64(B), and 64(C), broken lines indicate a line representing the atomic ratio of $[In]:[M]:[Zn]=(1+\alpha):(1-\alpha):1$ $(-1\leq\alpha\leq1)$, a line representing the atomic ratio of $[In]:M:[Zn]=(1+\alpha):(1-\alpha):2$, a line representing the atomic ratio of $[In]:[M]:[Zn]=(1+\alpha):(1-\alpha):3$, a line representing the atomic ratio of $[In]:M:[Zn]=(1+\alpha):(1-\alpha):4$, and a line representing the atomic ratio of $[In]:[Zn]=(1+\alpha):(1-\alpha):5$.

Furthermore, dashed-dotted lines indicate a line representing the atomic ratio of $[In]:M:[Zn]=5:1:\beta(\beta\geq0)$, a line representing the atomic ratio of $[In]:M:[Zn]=2:1:\beta$, a line representing the atomic ratio of $[In]:M:[Zn]=1:1:\beta$, a line representing the atomic ratio of $[In]:[M]:[Zn]=1:2:\beta$, a line representing the atomic ratio of $[In]:[M]:[Zn]=1:3:\beta$, and a line representing the atomic ratio of $[In]:[M]:[Zn]=1:4:\beta$.

Furthermore, a metal oxide with an atomic ratio of $[In]:[M]:[Zn]=0:2:1$ and a value in the vicinity thereof illustrated in FIGS. 64(A), 64(B), and 64(C) tends to have a spinel crystal structure.

In addition, a plurality of phases coexist in the metal oxide in some cases (two-phase coexistence, three-phase coexistence, or the like). For example, with an atomic ratio having a value in the vicinity of $[In]:[M]:[Zn]=0:2:1$, two phases of a spinel crystal structure and a layered crystal structure are likely to coexist. In addition, with an atomic ratio having a value in the vicinity of $[In]:[M]:[Zn]=1:0:0$, two phases of a bixbyite crystal structure and a layered crystal structure are likely to coexist. In the case where a plurality of phases coexist in the metal oxide, a crystal grain boundary is formed between different crystal structures in some cases.

A region A illustrated in FIG. 64(A) represents an example of the preferred range of the atomic ratio of indium, the element M, and zinc contained in the metal oxide.

When the metal oxide has a higher content of indium, the carrier mobility (electron mobility) of the metal oxide can be increased. Thus, a metal oxide having a high content of indium has higher carrier mobility than a metal oxide having a low content of indium.

By contrast, when the content of indium and zinc in a metal oxide becomes lower, carrier mobility becomes lower. Thus, with an atomic ratio of $[In]:[M]:[Zn]=0:1:0$ and a value in the vicinity thereof (for example, a region C illustrated in FIG. 64(C)), high insulating properties are obtained.

Accordingly, a metal oxide of one embodiment of the present invention preferably has an atomic ratio represented by the region A in FIG. 64(A), with which a layered structure with high carrier mobility and a few crystal grain boundaries is easily obtained.

In the region A, particularly in a region B illustrated in FIG. 64(B), an excellent metal oxide having high carrier mobility can be obtained because of easiness of becoming a CAAC (c-axis-aligned crystalline)-OS.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

The CAAC-OS is a metal oxide with high crystallinity. By contrast, in the CAAC-OS, it can be said that a reduction in electron mobility due to the crystal grain boundary is less likely to occur because a clear crystal grain boundary cannot be observed. Moreover, since the crystallinity of a metal oxide is decreased by entry of impurities, formation of defects, or the like in some cases, the CAAC-OS can be regarded as a metal oxide that has small amounts of impurities and defects (oxygen vacancies or the like). Thus, a metal oxide including a CAAC-OS is physically stable. Therefore, the metal oxide including a CAAC-OS is resistant to heat and has high reliability.

Note that the region B includes [In]:[M]:[Zn]=4:2:3 to 4.1 and a value in the vicinity thereof. The value in the vicinity includes [In]:[M]:[Zn]=5:3:4. In addition, the region B includes [In]:[M]:[Zn]=5:1:6 and a value in the vicinity thereof and [In]:[M]:[Zn]=5:1:7 and a value in the vicinity thereof.

Note that the property of a metal oxide is not uniquely determined by an atomic ratio. Even with the same atomic ratio, the property of a metal oxide is different depending on a formation condition in some cases. For example, in the case where the metal oxide is deposited with a sputtering apparatus, a film having an atomic ratio deviated from the atomic ratio of the target is formed. In addition, [Zn] in the film is smaller than [Zn] in the target in some cases depending on the substrate temperature in deposition. Thus, the illustrated regions are each a region representing an atomic ratio with which a metal oxide tends to have specific characteristics, and boundaries of the region A to the region C are not clear.

Next, the composition of a CAC (Cloud-Aligned Composite)-OS will be described below.

Note that in this specification and the like, CAC refers to an example of a function or a material composition and the aforementioned CAAC (c-axis aligned crystal) refers to an example of a crystal structure.

A CAC-OS or a CAC-metal oxide has a conducting function in part of the material and has an insulating function in part of the material, and has a function of a semiconductor as the whole material. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC-metal oxide is formed of components having different bandgaps. For example, the CAC-OS or the CAC-metal oxide is formed of a component having a wide gap due to the insulating region and a component having a narrow gap due to the conductive region. When carriers flow in such a structure, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, high on-state current and high field-effect mobility can be obtained.

In other words, the CAC-OS or the CAC-metal oxide can also be called a matrix composite or a metal matrix composite.

Note that this embodiment can be combined as appropriate with the other embodiments shown in this specification.

Embodiment 4

In this embodiment, examples in which the semiconductor device described in the foregoing embodiment is used as a memory device in an electronic component will be described with reference to FIG. 65.

Figure 65C:
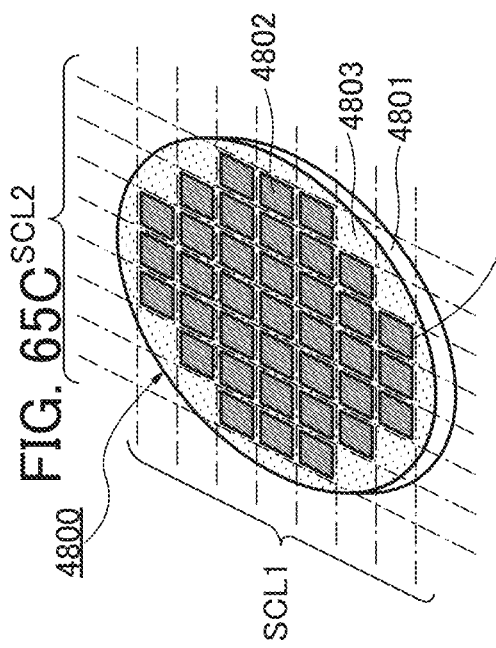
FIG. 65 A flow chart showing a manufacturing example of an electronic component, a perspective view of the electronic component, and perspective views of semiconductor wafers.
Figure 65D:
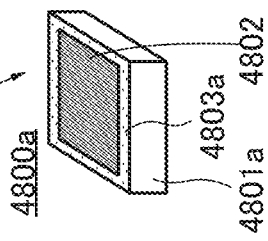
Figure 65B:
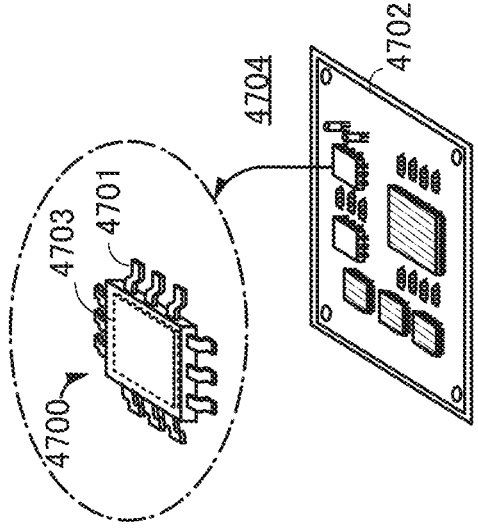
Figure 65E:
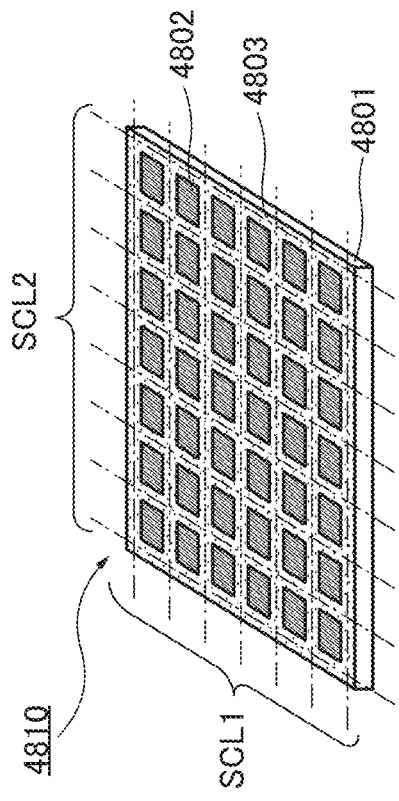
Figure 65A:
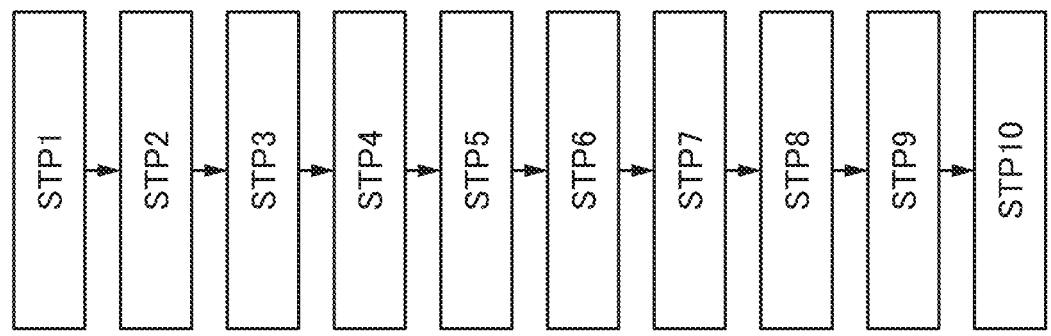

FIG. 65(A) shows an example in which the semiconductor device described in any of the foregoing embodiments is used as a memory device in an electronic component. Note that the electronic component is also referred to as a semiconductor package or an IC package. For the electronic component, there are a plurality of standards and names corresponding to a terminal extraction direction and a terminal shape. Thus, examples thereof are described in this embodiment.

A semiconductor device composed of the transistor described in Embodiment 1 described above is completed by integrating a plurality of detachable components on a printed circuit board through an assembly process (post-process).

The post-process can be completed through steps shown in FIG. 65(A). Specifically, after an element substrate obtained in a pre-process is completed (Step STP1), a rear surface of the substrate is ground (Step STP2). The substrate is thinned at this stage, whereby the warpage or the like of the substrate in the pre-process is reduced and the size of the component is reduced.

The rear surface of the substrate is ground, and a dicing step is performed to divide the substrate into a plurality of chips (Step STP3). Then, the divided chips are separately picked up, and a die bonding step is performed to mount and bond them to a lead frame (Step STP4). To bond the chip and the lead frame in this die bonding step, an appropriate method, such as the bonding with a resin or the bonding with a tape, is selected in accordance with products, as appropriate. Note that the die bonding step may be performed in such a manner that mounting and bonding are conducted on an interposer.

Note that in this embodiment, when an element is formed on one of surfaces of a substrate, the one surface is referred to as a surface, and the other surface (a surface on which the element is not formed) is referred to as a rear surface.

Next, wire bonding in which a lead of the lead frame and an electrode on the chip are electrically connected with a metal fine line (wire) is performed (Step STP5). A silver line or a gold line can be used as the metal fine line. Furthermore, ball bonding or wedge bonding can be used as the wire bonding.

A wire-bonded chip is subjected to a molding step of sealing with an epoxy resin or the like (Step STP6). The molding step is performed, whereby the inside of the electronic component is filled with a resin, so that damage to the circuit portion and the wire embedded by external mechanical force can be reduced, and in addition, deterioration of characteristics due to moisture or dust can be reduced.

Next, the lead of the lead frame is subjected to plating treatment. Then, the lead is cut and processed (Step STP7). This plate processing prevents corrosion of the lead and enables more reliable soldering at the time of mounting the electronic component on a printed circuit board in a later step.

Next, printing (marking) is performed on a surface of the package (Step STP8). Then, through a final inspection step (Step STP9), the electronic component is completed (Step STP10).

The above-described electronic component can include the semiconductor device described in the foregoing embodiment. Thus, a highly reliable electronic component can be obtained.

Furthermore, FIG. 65(B) is a perspective schematic view of the completed electronic component. FIG. 65(B) is a perspective schematic view of a QFP (Quad Flat Package) as an example of the electronic component. An electronic component 4700 illustrated in FIG. 65(B) includes a lead 4701 and a circuit portion 4703. The electronic component 4700 illustrated in FIG. 65(B) is mounted on a printed circuit board 4702, for example. A plurality of electronic components 4700 described above which are combined and electrically connected to each other on the printed circuit board 4702 can be mounted inside an electronic device. A completed circuit board 4704 is provided in an electronic device or the like.

Note that one embodiment of the present invention is not limited to the shape of the electronic component 4700, and the element substrate fabricated in Step STP1 can be included. Further, the element substrate of one embodiment of the present invention includes an element substrate that has been subjected up to the grinding of the rear surface of the substrate of Step STP2. In addition, the element substrate of one embodiment of the present invention includes an element substrate that has been subjected up to the dicing step of Step STP3. For example, a semiconductor wafer 4800 or the like illustrated in FIG. 65(C) corresponds to the element substrate. In the semiconductor wafer 4800, a plurality of circuit portions 4802 are formed on a top surface of a wafer 4801. A portion without the circuit portion 4802 on the top surface of the wafer 4801 is a spacing 4803, and part of the spacing 4803 serves as a region for dicing.

The dicing is performed along scribe lines SCL1 and scribe lines SCL2 (referred to as a dicing line or cutting lines in some cases) shown in dashed-dotted lines. Note that to perform the dicing step easily, it is preferable that the spacing 4803 be provided so that a plurality of the scribe lines SCL1 are parallel to each other, the plurality of scribe lines SCL2 are parallel to each other, and the scribe lines SCL1 and the scribe line SCL2 are perpendicular to each other.

With the dicing step, a chip 4800a as illustrated in FIG. 65(D) can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 may be substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 65(C). For example, a rectangular semiconductor wafer 4810 illustrated in FIG. 65(E) may be used. The shape of the element substrate can be changed as appropriate, depending on a manufacturing process of an element and an apparatus for manufacturing an element.

Note that this embodiment can be combined as appropriate with the other embodiments shown in this specification.

Embodiment 5

In this embodiment, a CPU that can include the semiconductor device of the foregoing embodiment will be described.

Figure 66:
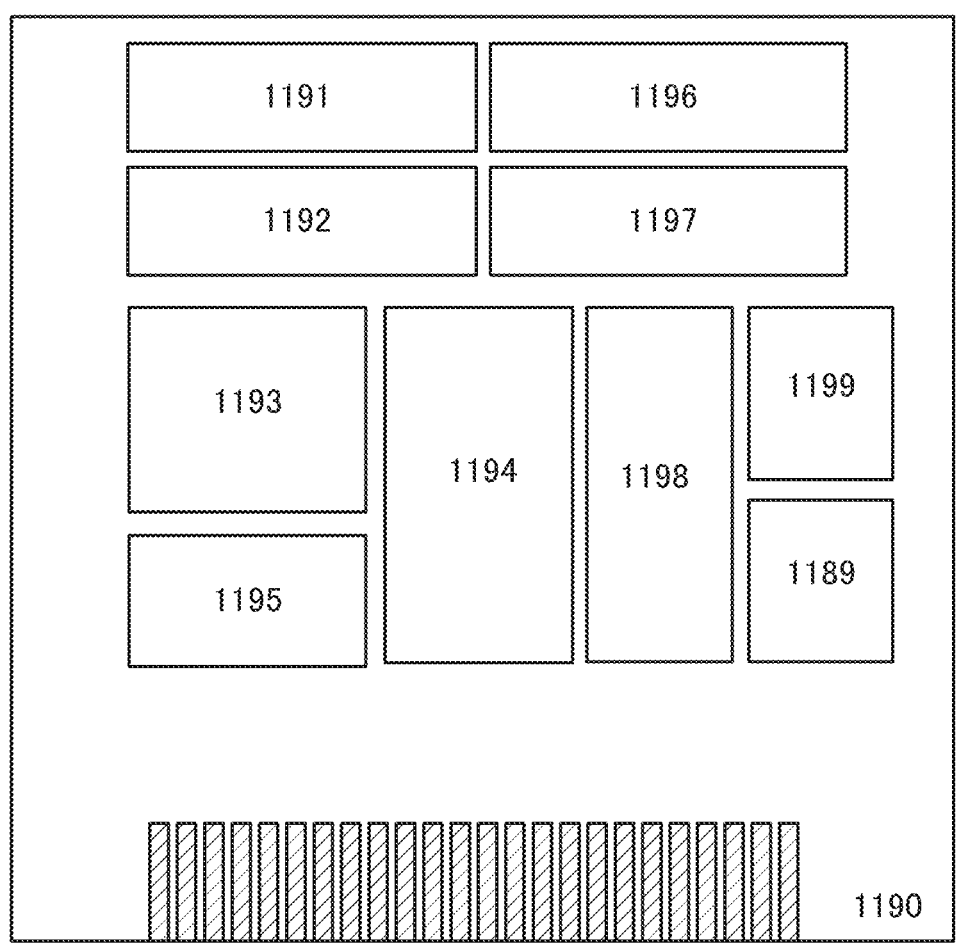
FIG. 66 A block diagram illustrating a CPU.

FIG. 66 is a block diagram illustrating a configuration example of a CPU in part of which the semiconductor device described in Embodiment 1 is used.

The CPU illustrated in FIG. 66 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, a glass substrate, or the like is used as the substrate 1190. The ROM 1199 and the ROM interface 1189 may be provided over separate chips. Needless to say, the CPU illustrated in FIG. 66 is just an example of a simplified structure, and an actual CPU may have a variety of configurations depending on the usage. For example, the CPU may have a configuration in which a structure including the CPU illustrated in FIG. 66 or an arithmetic circuit is considered as one core, a plurality of the cores are included, and the cores operate in parallel, namely a configuration like that of a GPU. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 66, a memory cell is provided in the register 1196. As the memory cell of the register 1196, the transistors described in the foregoing embodiments can be used.

In the CPU illustrated in FIG. 66, the register controller 1197 selects a retaining operation in the register 1196 in accordance with an instruction from the ALU 1191. That is, the register controller 1197 selects whether data retaining by a flip-flop is performed or data retaining by a capacitor is performed in the memory cell included in the register 1196. In the case where data retaining by the flip-flop is selected, a power supply voltage is supplied to the memory cell in the register 1196. In the case where data retaining by the capacitor is selected, the data is rewritten into the capacitor, and supply of power supply voltage to the memory cell in the register 1196 can be stopped.

Note that this embodiment can be combined as appropriate with the other embodiments shown in this specification.

Embodiment 6

The memory device of the foregoing embodiment can be applied to a variety of removable memory device such as a memory card (for example, an SD card), a USB (Universal Serial Bus) memory, and an SSD (Solid State Drive), which can be provided with the memory device. In this embodiment, some structure examples of the removable memory devices will be described with reference to FIG. 67.

Figure 67A:
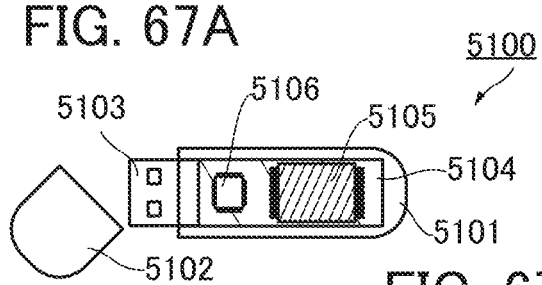
FIG. 67 Perspective diagrams illustrating examples of an electronic device.

FIG. 67(A) is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, a memory chip 5105 and a controller chip 5106 are attached to the substrate 5104. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5105. Specifically, a processor, a work memory, an ECC circuit, and the like are incorporated in the controller chip 5106. Note that the circuit configurations of the memory chip 5105 and the controller chip 5106 are not limited to those described above, and can be changed as appropriate according to circumstances or depending on the case. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

Figure 67B:
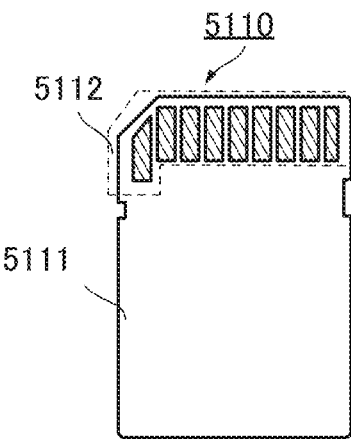
Figure 67C:
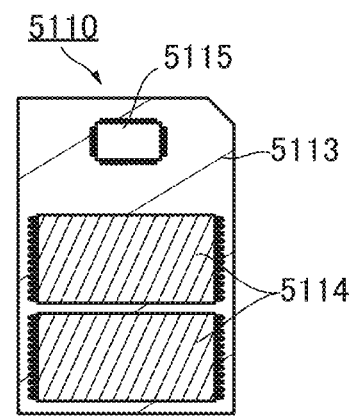

FIG. 67(B) is a schematic external diagram of an SD card, and FIG. 67(C) is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, a memory chip 5114 and a controller chip 5115 are attached to the substrate 5113. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5114. A processor, a work memory, an ECC circuit, and the like are incorporated in the controller chip 5115. Note that the circuit configurations of the memory chip 5114 and the controller chip 5115 are not limited to those described above, and can be changed as appropriate according to circumstances or depending on the case. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is provided also on a rear surface side of the substrate 5113, the capacitance of the SD card 5110 can be increased. In addition, a wireless chip with a wireless communication function may be provided on the substrate 5113. By this, wireless communication between an external device and the SD card 5110 can be conducted, which enables data reading out and writing from/to the memory chip 5114.

Figure 67D:
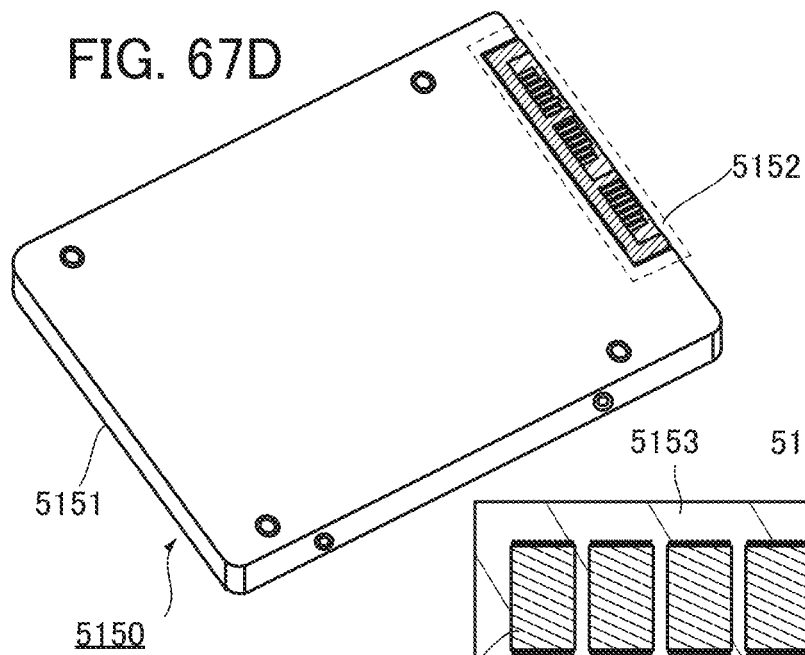
Figure 67E:
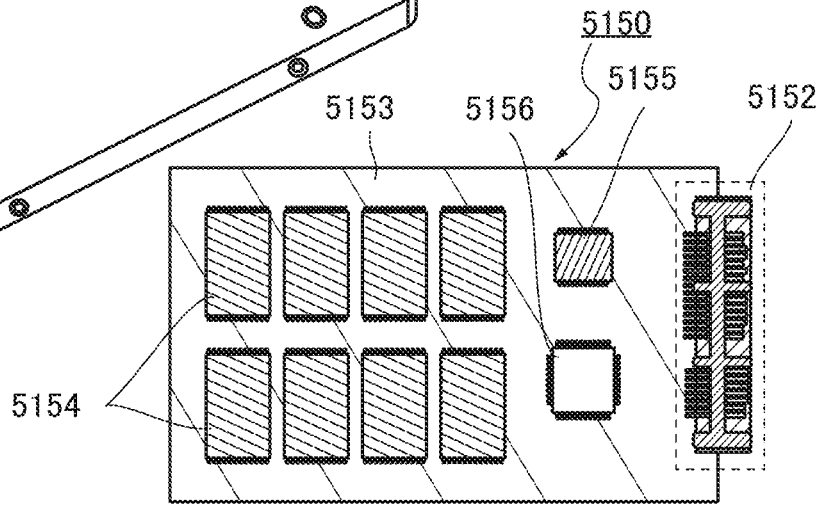

FIG. 67(D) is a schematic external view of an SSD, and FIG. 67(E) is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, a memory chip 5154, a memory chip 5155, and a controller chip 5156 are attached to the substrate 5153. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5154. When the memory chip 5154 is also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed as appropriate according to circumstances or depending on the case. For example, a memory functioning as a work memory may also be provided in the controller chip 5156.

Note that this embodiment can be combined as appropriate with the other embodiments shown in this specification.

Embodiment 7

In this embodiment, examples of electronic devices in which the semiconductor device or the memory device of the foregoing embodiment can be used will be described.
<Laptop Personal Computer>

Figure 68A:
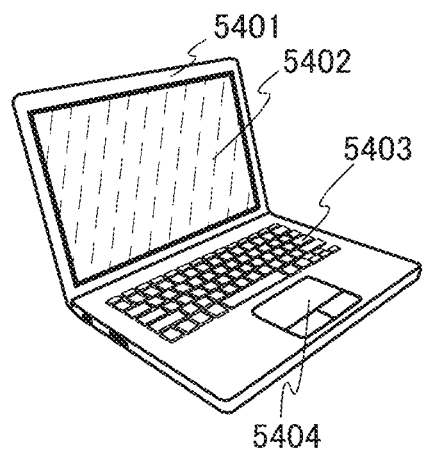
FIG. 68 Perspective views illustrating examples of an electronic device.

The semiconductor device or the memory device of one embodiment of the present invention can be provided in a laptop personal computer. FIG. 68(A) illustrates a laptop personal computer including a housing 5401, a display portion 5402, a keyboard 5403, a pointing device 5404, and the like.

<Smartwatch>

Figure 68B:
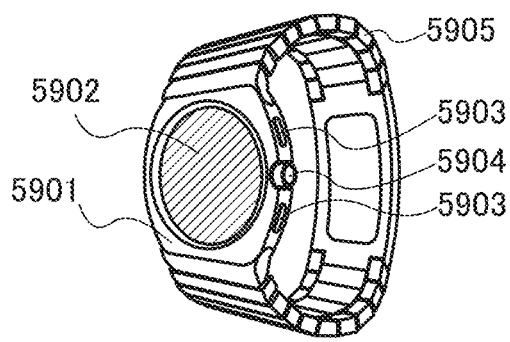

The semiconductor device or the memory device of one embodiment of the present invention can be provided in a wearable terminal. FIG. 68(B) illustrates a smartwatch that is one of wearable terminals, including a housing 5901, a display portion 5902, operation buttons 5903, an operator 5904, a band 5905, and the like. A display device with a function of a position input device may be used for the display portion 5902. The function of the position input device can be added by provision of a touch panel in a display device. Alternatively, the function of the position input device can be added by provision of a photoelectric conversion element called a photosensor in a pixel portion of a display device. As the operation buttons 5903, any of a power switch for activating the smartwatch, a button for operating an application of the smartwatch, a volume control button, a switch for turning on or off the display portion 5902, and the like can be provided. Although the number of the operation buttons 5903 is two in the smartwatch illustrated in FIG. 68(B), the number of the operation buttons included in the smartwatch is not limited thereto. The operator 5904 functions as a crown used for setting the time on the smartwatch. The operator 5904 may be used as an input interface for operating an application of the smartwatch as well as the crown for time adjustment. Although the smartwatch illustrated in FIG. 68(B) includes the operator 5904, without being limited thereto, the smartwatch does not necessarily include the operator 5904.

<Video Camera>

Figure 68C:
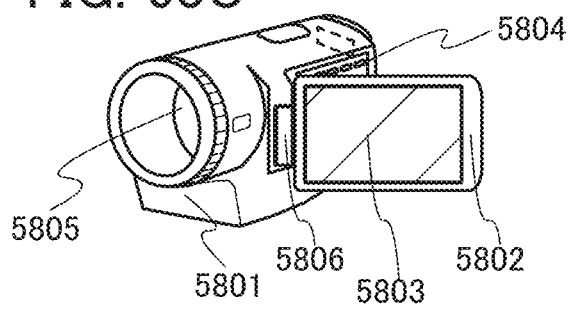

The semiconductor device or the memory device of one embodiment of the present invention can be provided in a video camera. FIG. 68(C) illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. Furthermore, the first housing 5801 and the second housing 5802 are connected to each other with the joint 5806, and the angle between the first housing 5801 and the second housing 5802 can be changed with the joint 5806. Images on the display portion 5803 may be changed in accordance with the angle at the joint 5806 between the first housing 5801 and the second housing 5802.

<Mobile Phone>

Figure 68D:
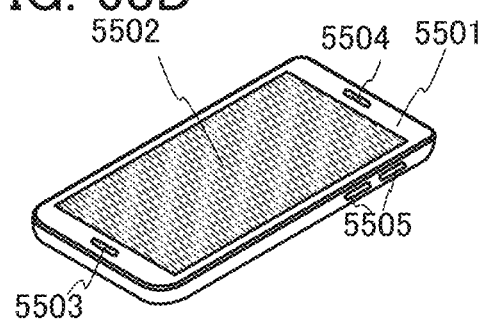

The semiconductor device or the memory device of one embodiment of the present invention can be provided in a mobile phone. FIG. 68(D) illustrates a mobile phone having a function of an information terminal, including a housing 5501, a display portion 5502, a microphone 5503, a speaker 5504, and operation buttons 5505. A display device with a function of a position input device may be used for the display portion 5502. The function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the number of the operation buttons 5505 is two in the mobile phone illustrated in FIG. 68(D), the number of the operation buttons included in the mobile phone is not limited thereto. Although not illustrated, the mobile phone illustrated in FIG. 68(D) may include a light-emitting device used for a flashlight or a lighting purpose.

<Television Device>

Figure 68E:
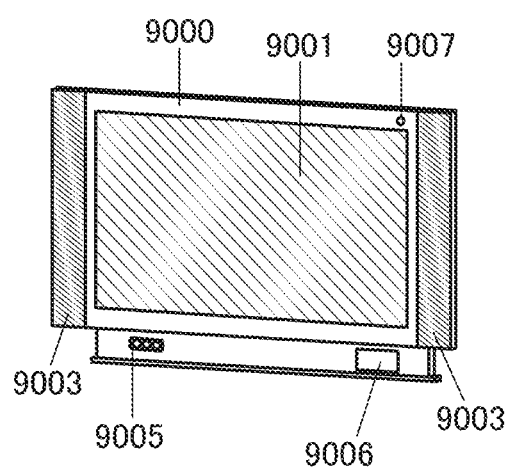

The semiconductor device or the memory device of one embodiment of the present invention can be provided in a television device. FIG. 68(E) is a perspective view illustrating a television device. The television device includes a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), and the like. The memory device of one embodiment of the present invention can be provided in the television device. The television device can include the display portion 9001 of, for example, 50 inches or more or 100 inches or more.

<Vehicle>

The semiconductor device or the memory device of one embodiment of the present invention can also be used around a driver's seat in a car, which is a vehicle.

Figure 68F:
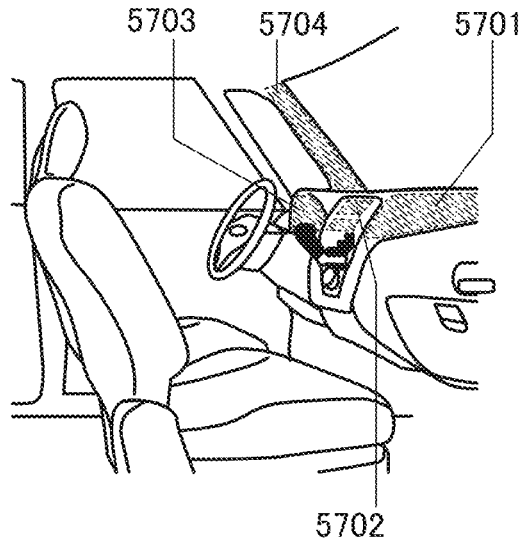

For example, FIG. 68(F) illustrates a windshield and its vicinity inside a car. FIG. 68(F) illustrates a display panel 5701, a display panel 5702, and a display panel 5703 that are attached to a dashboard and a display panel 5704 that is attached to a pillar.

The display panel 5701 to the display panel 5703 can display a variety of kinds of information such as navigation information, a speedometer, a tachometer, a mileage, an oil supply amount, a gearshift indicator, and air-condition setting. The content, layout, or the like of the display on the display panels can be changed freely to suit the user's preferences, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably. The display panel 5704 can also be used as a lighting device.

The semiconductor device or the memory device of one embodiment of the present invention can be used, for example, for a frame memory that temporarily stores image data used to display images on the display panel 5701 to the display panel 5704, or for a memory device that stores a program for driving a system included in the vehicle.

Although not illustrated, each of the electronic devices illustrated in FIGS. 68(A), 68(B), 68(E), and 68(F) may include a microphone and a speaker. With this structure, the above electronic devices can have an audio input function, for example.

Although not illustrated, each of the electronic devices illustrated in FIGS. 68(A), 68(B), and 68(D) to 68(F) may include a camera.

Although not illustrated, each of the electronic devices illustrated in FIGS. 68(A) to 68(F) may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, infrared rays, or the like) in the housing. In particular, when the mobile phone illustrated in FIG. 68(D) is provided with a sensing device which includes a sensor for sensing inclinations, such as a gyroscope sensor or an acceleration sensor, the orientation of the mobile phone (the orientation of the mobile phone with respect to the vertical direction) is determined and display on the screen of the display portion 5502 can be automatically changed in accordance with the orientation of the mobile phone.

Although not illustrated, each of the electronic devices illustrated in FIGS. 68(A) to 68(F) may include a device for obtaining biological information such as fingerprints, veins, iris, or voice prints. Employing this structure can achieve an electronic device having a biometric identification function.

A flexible base may be used for the display portion of each of the electronic devices illustrated in FIGS. 68(A) to 68(F). Specifically, the display portion may have a structure in which a transistor, a capacitor, a display element, and the like are provided over a flexible base. Employing this structure can achieve not only an electronic device having a housing with a flat surface as in the electronic devices illustrated in FIGS. 68(A) to 68(F) but also an electronic device having a housing with a curved surface.

Note that this embodiment can be combined as appropriate with the other embodiments shown in this specification.
(Notes on the Description in this Specification and the Like)

The following are notes on the description of the structures in the foregoing embodiments.
<Notes on One Embodiment of the Present Invention Described in Embodiments>

One embodiment of the present invention can be constituted by combining, as appropriate, the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of drawings or a content described with text disclosed in the specification.

Note that by combining a drawing (or part thereof) described in one embodiment with at least one of another part of the drawing, a different drawing (or part thereof) described in the embodiment, and a drawing (or part thereof) described in one or a plurality of different embodiments, much more drawings can be constituted.
<Notes on Ordinal Numbers>

Ordinal numbers such as "first", "second", and "third" in this specification and the like are used in order to avoid confusion among components. Thus, the ordinal numbers do not limit the number of components. Furthermore, the ordinal numbers do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.
<Notes on Description for Drawings>

Embodiments are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under", are used for convenience for describing the positional relation between components with reference to drawings. The positional relation between components is changed as appropriate in accordance with a direction in which the components are illustrated. Thus, terms for describing arrangement are not limited to those described in this specification and the like and can be rephrased as appropriate according to circumstances. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly above or directly below and in direct contact with another component. For example, the expression "an electrode B over an insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

In drawings such as a perspective view, illustration of some components is in some cases omitted for clarity of the drawings.

Moreover, the same components or components having similar functions, components formed using the same material, components formed at the same time, or the like in the drawings are denoted by the same reference numerals in some cases, and the repeated description thereof is omitted in some cases.
<Notes on Expressions that can be Rephrased>

In this specification and the like, one of a source and a drain is denoted by "one of a source and a drain" (or a first electrode or a first terminal) and the other of the source and the drain is denoted by "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate is referred to as a first terminal and a second terminal or as a third terminal and a fourth terminal in some cases. Note that in this specification and the like, a channel formation region refers to a region where a channel is formed; this region is formed by application of a potential to the gate, so that current can flow between the source and the drain.

Furthermore, functions of a source and a drain are sometimes interchanged with each other when transistors having different polarities are used or when the direction of current is changed in circuit operation, for example. Therefore, the terms of source and drain can be interchanged in this specification and the like.

Furthermore, in the case where a transistor described in this specification and the like has two or more gates (such a structure is referred to as a dual-gate structure in some cases), these gates are referred to as a first gate and a second gate or as a front gate and a back gate in some cases. In particular, the term "front gate" can be replaced with a simple term "gate". In addition, the term "back gate" can be replaced with a simple term "gate". Note that a bottom gate is a terminal that is formed before a channel formation region in manufacture of a transistor, and a "top gate" is a terminal that is formed after a channel formation region in manufacture of a transistor.

In addition, in this specification and the like, the term "electrode" or "wiring" does not functionally limit a component. For example, an "electrode" is sometimes used as part of a "wiring", and vice versa. Furthermore, the term "electrode" or "wiring" can also mean the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film", "layer", and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring", "signal line", "power source line", and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

<Notes on Definitions of Terms>

Definitions of the terms mentioned in the foregoing embodiments will be described below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity occurs in some cases, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies is formed in some cases by entry of impurities such as hydrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

<<Switch>>

In this specification and the like, a switch is in a conduction state (on state) or in a non-conduction state (off state) to determine whether current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch include a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here are each an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y is functionally connected if a signal output from X is transmitted to Y.

Note that an explicit description that X and Y are electrically connected includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression that X and Y are electrically connected is the same as the explicit simple expression that X and Y are connected.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and expressions are not limited to these expressions. Here, each of X, Y, Z1, and Z2 is an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification also includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, "substantially parallel" indicates a state where the angle formed between two straight lines is greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. In addition, "substantially perpendicular" indicates a state where the angle formed between two straight lines is greater than or equal to 60° and less than or equal to 120°.

REFERENCE NUMERALS

MC[1]: memory cell, MC[2]: memory cell, MC[n]: memory cell, MC[1,1]: memory cell, MCU[j,1]: memory cell, MC[n,1]: memory cell, MC[1,i]: memory cell, MC[0]: memory cell, MC[n,i]: memory cell, MC[1,m]: memory cell, MC[j,m]: memory cell, MC[n,m]: memory cell, WL: wiring, WL[1]: wiring, WL[i]: wiring, WL[n]: wiring, BL: wiring, SL: wiring, BSL: wiring, BSL[1]: wiring, BSL[i]: wiring, BSL[m]: wiring, SSL: wiring, SSL[1]: wiring, SSL[i]: wiring, SSL[m]: wiring, BGL: wiring, BGL[1]: wiring, BGL[i]: wiring, BGL[m]: wiring, CTr: cell transistor, BTr: transistor, STr: transistor, PG: conductor, ER: wiring, HL: region, AR: region, TM: region, SCL1: scribe line, SCL2: scribe line, SD1: region, SD2: region, T10: time, T11: time, T12: time, T13: time, T20: time, T21: time, T22: time, T23: time, T24:

time, T25: time, T30: time, T31: time, T32: time, T33: time, T40: time, T41: time, T42: time, T43: time, T44: time, T45: time, 10: supply treatment, 100: stack, 100A: stack, 101A: insulator, 101B: insulator, 101C: insulator, 102: insulator, 102A: insulator, 102B: insulator, 103: insulator, 104: insulator, 105: insulator, 107A: insulator, 107B: insulator, 107C: insulator, 111: insulator, 134: conductor, 135: conductor, 135*a*: conductor, 135*b*: conductor, 135*c*: conductor, 136: conductor, 136*a*: conductor, 136*b*: conductor, 137: conductor, 137*a*: conductor, 137*b*: conductor, 137*c*: conductor, 138*a*: conductor, 138*b*: conductor, 141A: sacrificial layer, 141B: sacrificial layer, 151: semiconductor, 151*a*: region, 151*b*: region, 151*c*: region, 151*d*: region, 152A: semiconductor, 152B: semiconductor, 152C: semiconductor, 153: semiconductor, 153*a*: semiconductor, 153*b*: semiconductor, 161A: compound, 161B: compound, 161C: compound, 181A: region, 181B: region, 191: opening, 192: slit, 193: opening, 195A: recess portion, 195B: recess portion, 195C: recess portion, 196A: recess portion, 196B: recess portion, 197A: recess portion, 197B: recess portion, 201: insulator, 211: conductor, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1700: substrate, 1701: element separation layer, 1712: conductor, 1730: conductor, 1790: gate electrode, 1792: well, 1793: channel formation region, 1794: low-concentration impurity region, 1795: high-concentration impurity region, 1796: conductive region, 1797: gate insulating film, 1798: sidewall insulating layer, 1799: sidewall insulating layer, 2600: memory device, 2601: peripheral circuit, 2610: memory cell array, 2621: row decoder, 2622: word line driver circuit, 2630: bit line driver circuit, 2631: column decoder, 2632: precharge circuit, 2633: sense amplifier, 2634: write circuit, 2640: output circuit, 2660: control logic circuit, 4700: electronic component, 4701: lead, 4702: printed circuit board, 4703: circuit portion, 4704: circuit board, 4800: semiconductor wafer, 4800*a*: chip, 4801: wafer, 4801*a*: wafer, 4802: circuit portion, 4803: spacing, 4803*a*: spacing, 4810: semiconductor wafer, 5100: USB memory, 5101: housing, 5102: cap, 5103: USB connector, 5104: substrate, 5105: memory chip, 5106: controller chip, 5110: SD card, 5111: housing, 5112: connector, 5113: substrate, 5114: memory chip, 5115, controller chip, 5150: SSD, 5151: housing, 5152: connector, 5153: substrate, 5154: memory chip, 5155: memory chip, 5156: controller chip, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint, 5901: housing, 5902: display portion, 5903: operation button, 5904: operator, 5905: band, 9000: housing, 9001: display portion, 9003: speaker, 9005: operation key, 9006: connection terminal, 9007: sensor

The invention claimed is:

1. A semiconductor device comprising:
a first insulator;
a second insulator;
a third insulator;
a fourth insulator;
a first conductor;
a second conductor; and
a first semiconductor,
wherein the first semiconductor comprises a first surface and a second surface,
wherein a first side surface and a second side surface of the first insulator are positioned in a region overlapping the first surface of the first semiconductor with the first conductor therebetween,
wherein a first side surface of the first conductor is in direct contact with the first surface of the first semiconductor,
wherein the first side surface of the first insulator is in contact with a second side surface of the first conductor,
wherein the second insulator is in contact with the second side surface of the first insulator, a top surface of the first insulator, a top surface of the first conductor, and the second surface of the first semiconductor,
wherein the third insulator is positioned in a region overlapping the second surface of the first semiconductor with the second insulator therebetween,
wherein the fourth insulator is in contact with the third insulator,
wherein the second conductor is positioned in a region overlapping the second surface of the first semiconductor with the second insulator, the third insulator, and the fourth insulator therebetween,
wherein the second conductor is in contact with the fourth insulator,
wherein the third insulator is configured to accumulate charge, and
wherein a tunnel current is induced between the second surface of the first semiconductor and the third insulator with the second insulator therebetween by supply of a potential to the second conductor.

2. The semiconductor device according to claim 1, wherein the third insulator is positioned also in a region overlapping the first surface of the first semiconductor.

3. The semiconductor device according to claim 1, wherein a film thickness of the first semiconductor at the second surface of the first semiconductor is smaller than a film thickness of the first semiconductor at the first surface of the first semiconductor.

4. The semiconductor device according to claim 1, wherein the first semiconductor comprises a metal oxide, and
wherein the second surface of the first semiconductor and a vicinity of the second surface have a higher concentration of oxygen than the first surface of the first semiconductor and a vicinity of the first surface.

5. The semiconductor device according to claim 4, wherein the first surface of the first semiconductor and a vicinity of the first surface each comprise a compound constituted of an element comprised in the first conductor and an element comprised in the first semiconductor.

6. The semiconductor device according to claim 1, wherein the first semiconductor comprises silicon, and
wherein, in the first surface of the first semiconductor and a vicinity of the first surface, a low-resistance region is formed of an element comprised in the first conductor and an element comprised in the first semiconductor.

7. A semiconductor wafer comprising:
a plurality of the semiconductor devices according to claim 1; and
a region for dicing.

8. A memory device comprising:
the semiconductor device according to claim 1; and
a peripheral circuit.

9. An electronic device comprising:
the memory device according to claim 8; and
a housing.

\* \* \* \* \*